US010296157B2

(12) United States Patent
Takahashi et al.

(10) Patent No.: US 10,296,157 B2
(45) Date of Patent: May 21, 2019

(54) DISPLAY DEVICE AND ELECTRONIC DEVICE

(71) Applicant: Semiconductor Energy Laboratory Co., Ltd., Atsugi-shi, Kanagawa-ken (JP)

(72) Inventors: Kei Takahashi, Isehara (JP); Wataru Uesugi, Atsugi (JP); Hiromichi Godo, Isehara (JP)

( * ) Notice: Subject to any disclaimer, the term of this patent is extended or adjusted under 35 U.S.C. 154(b) by 131 days.

(21) Appl. No.: 15/161,575

(22) Filed: May 23, 2016

(65) Prior Publication Data

US 2016/0351552 A1 Dec. 1, 2016

(30) Foreign Application Priority Data

May 29, 2015 (JP) ................................ 2015-109815
Jun. 25, 2015 (JP) ................................ 2015-127932
Jul. 6, 2015 (JP) ................................ 2015-135163

(51) Int. Cl.

| | |
|---|---|
| ***G02F 1/1333*** | (2006.01) |
| ***G06F 3/047*** | (2006.01) |
| ***G06F 3/041*** | (2006.01) |
| ***G06F 3/044*** | (2006.01) |
| *H01L 27/32* | (2006.01) |

(52) U.S. Cl.

CPC .............. *G06F 3/047* (2013.01); *G06F 3/044* (2013.01); *G06F 3/0412* (2013.01); *G06F 3/0416* (2013.01); *G06F 3/0418* (2013.01); *G02F 1/13338* (2013.01);

(Continued)

(58) Field of Classification Search

CPC . G02F 1/13338; G02F 1/13452; G02F 1/1345
See application file for complete search history.

(56) References Cited

U.S. PATENT DOCUMENTS

2008/0246752 A1* 10/2008 Lee .......................... G09G 3/20 345/213
2013/0328807 A1* 12/2013 Matsumoto ........... G06F 3/0416 345/173

(Continued)

FOREIGN PATENT DOCUMENTS

JP 2014-146235 A 8/2014

OTHER PUBLICATIONS

Kim.K et al., "A Capacitive Touch Controller Robust to Display Noise for Ultrathin Touch Screen Displays", ISSCC 2012 (Digest of Technical Papers. IEEE International Solid-State Circuits Conference), Feb. 20, 2012, pp. 116-117.

*Primary Examiner* — Kendrick Hsu
(74) *Attorney, Agent, or Firm* — Robinson Intellectual Property Law Office; Eric J. Robinson

(57) ABSTRACT

To provide a display device which includes a touch sensor and a large number of pixels and in which a driver circuit of a display portion and a driver circuit of a touch sensor are formed in one IC. The display device includes the display portion, the touch sensor, and a plurality of ICs. The plurality of ICs each include a first circuit. One of the plurality of ICs includes a second circuit and a third circuit. The first circuit has a function of outputting a video signal to the display portion. The second circuit has a function of outputting a signal for driving a sensor element included in the touch sensor. The third circuit has a function of converting an analog signal output from the sensor element into a digital signal.

9 Claims, 52 Drawing Sheets

(52) U.S. Cl.
CPC .............. *G06F 2203/04102* (2013.01); *G06F 2203/04103* (2013.01); *H01L 27/323* (2013.01)

(56) References Cited

U.S. PATENT DOCUMENTS

| | | | | |
|---|---|---|---|---|
| 2014/0111443 | A1* | 4/2014 | Guo | G06F 3/0416<br>345/173 |
| 2014/0210751 | A1 | 7/2014 | Okamura et al. | |
| 2014/0232952 | A1* | 8/2014 | Watanabe | G02F 1/13338<br>349/12 |
| 2015/0317028 | A1 | 11/2015 | Takahashi et al. | |
| 2016/0070314 | A1 | 3/2016 | Takahashi et al. | |

* cited by examiner

DISPLAY DEVICE AND ELECTRONIC DEVICE

BACKGROUND OF THE INVENTION

1. Field of the Invention

One embodiment of the present invention relates to a display device with a touch sensor. Another embodiment of the present invention relates to a display device. Another embodiment of the present invention relates to a touch sensor. Another embodiment of the present invention relates to a semiconductor device.

Note that one embodiment of the present invention is not limited to the above technical field. One embodiment of the invention disclosed in this specification and the like relates to an object, a method, or a manufacturing method. One embodiment of the present invention relates to a process, a machine, manufacture, or a composition of matter. Specifically, examples of the technical field of one embodiment of the present invention disclosed in this specification and the like include a semiconductor device, a display device, a light-emitting device, a power storage device, a memory device, an electronic device, a lighting device, an input device, an input/output device, a driving method thereof, and a manufacturing method thereof.

In this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an input device, an input/output device, an electro-optical device, a power generation device (including a thin film solar cell, an organic thin film solar cell, and the like), and an electronic device may each include a semiconductor device.

2. Description of the Related Art

In recent years, portable information terminals such as smartphones and tablet terminals have been widespread. For most of the portable information terminals, display devices provided with active matrix display portions, touch sensors, and the like are used.

In the above-described display devices, integrated circuits (ICs) mounted by a chip on glass (COG) method are used as their driver circuits in many cases. Patent Document 1 and Non-Patent Document 1 disclose a technique by which a driver circuit for a display portion and a driver circuit for a touch sensor are formed in one IC.

Increases in the resolution and the number of pixels of a display device have been demanded; for example, 4K ultra high definition television (UHDTV) (number of pixels: 3840×2160) and 8K UHDTV (number of pixels: 7680×4320) have been suggested as digital video standards. 4K UHDTV and 8K UHDTV are hereinafter referred to as 4K and 8K, respectively.

REFERENCE

Patent Document

[Patent Document 1] Japanese Published Patent Application No. 2014-146235

Non-Patent Document

Non-Patent Document 1

Ki-Duk Kim et al., "A Capacitive Touch Controller Robust to Display Noise for Ultrathin Touch Screen Displays", *IEEE ISSCC Dig. Tech. Papers*, pp. 115-116, 2012.

SUMMARY OF THE INVENTION

When an IC is crimped to a substrate by a COG method, the pressure for each terminal of the IC needs to be optimal. In the case where an IC is mounted on a display device having a large number of pixels like 4K or 8K, the number of terminals of the IC is increased and accordingly, a load for the entire IC in the crimp is also increased. As a result, a crack or the like occurs in the IC, and thus, the IC is difficult to mount.

In the case where a driver circuit for a display portion and a driver circuit for a touch sensor are formed in one IC, noise generated from the driver circuit for the display portion affects the driver circuit for the touch sensor and thus, malfunctions of the device might be caused.

An object of one embodiment of the present invention is to provide a display device with a touch sensor which has a large number of pixels and in which a driver circuit for a display portion and a driver circuit for a touch sensor are formed in one IC. Another object of one embodiment of the present invention is to provide a display device including a touch sensor with high accuracy. Another object of one embodiment of the present invention is to provide a novel semiconductor device or the like.

Note that the description of a plurality of objects does not preclude the existence of each object. One embodiment of the present invention does not necessarily achieve all the objects listed above. Objects other than those listed above are apparent from the description of the specification, drawings, claims, and the like, and such objects could be objects of one embodiment of the present invention.

One embodiment of the present invention is a display device including a display portion, a touch sensor, and first to m-th ICs (m is an integer of 2 or more). The display portion includes first to m-th signal lines. The first IC includes a first terminal, a first touch sensor terminal, and a second touch sensor terminal. The m-th IC includes an m-th terminal. The first IC inputs a first video signal to the display portion through the first terminal and the first signal line. The m-th IC inputs an m-th video signal to the display portion through the m-th terminal and the m-th signal line. The touch sensor includes a first wiring and a second wiring. The touch sensor senses an input owing to a change in capacitance between the first wiring and the second wiring. The first touch sensor terminal is electrically connected to the first wiring. The second touch sensor terminal is electrically connected to the second wiring.

In the above embodiment, the display device preferably includes a substrate and a liquid crystal. The first IC is positioned over the substrate. The m-th IC is positioned over the substrate. The first wiring includes a region overlapping with the second wiring with the liquid crystal positioned therebetween. The first IC includes a surface facing the substrate. The surface includes a first side and a second side opposite to the first side. The first terminal is positioned on the first side. The first touch sensor terminal is positioned on the first side. The second touch sensor terminal is positioned on the second side.

In the above embodiment, the display device preferably includes a substrate and a liquid crystal. The first IC is positioned over the substrate. The m-th IC is positioned over the substrate. The liquid crystal includes a region overlapping with the substrate with the first wiring positioned therebetween. The liquid crystal includes a region overlapping with the substrate with the second wiring positioned therebetween. The first IC includes a surface facing the substrate. The surface includes a side. The first terminal is positioned on the side. The first touch sensor terminal is positioned on the side. The second touch sensor terminal is positioned on the side.

In the above embodiment, the display device preferably includes a substrate and a liquid crystal. The first IC is positioned over the substrate. The m-th IC is positioned over the substrate. The first wiring includes a region overlapping with the substrate with the liquid crystal positioned therebetween. The second wiring includes a region overlapping with the substrate with the liquid crystal positioned therebetween. The first IC includes a surface facing the substrate. The surface includes a first side and a second side opposite to the first side. The first terminal is positioned on the first side. The first touch sensor terminal is positioned on the second side. The second touch sensor terminal is positioned on the second side.

In the above embodiment, the display device preferably includes a substrate and an EL layer. The first IC is positioned over the substrate. The m-th IC is positioned over the substrate. The first wiring includes a region overlapping with the substrate with the EL layer positioned therebetween. The second wiring includes a region overlapping with the substrate with the EL layer positioned therebetween. The first IC includes a surface facing the substrate. The surface includes a first side and a second side opposite to the first side. The first terminal is positioned on the first side. The first touch sensor terminal is positioned on the second side. The second touch sensor terminal is positioned on the second side.

In the above embodiment, the display device preferably includes a substrate and an EL layer. The first IC is positioned over the substrate. The m-th IC is positioned over the substrate. The first wiring includes a region overlapping with the EL layer with the substrate positioned therebetween. The substrate includes a region overlapping with the EL layer with the second wiring positioned therebetween. The first IC includes a surface facing the substrate. The surface includes a first side and a second side opposite to the first side. The first terminal is positioned on the first side. The first touch sensor terminal is positioned on the first side. The second touch sensor terminal is positioned on the second side.

In the above embodiment, the display device preferably includes a substrate and an EL layer. The first IC is positioned over the substrate. The m-th IC is positioned over the substrate. The substrate includes a region overlapping with the EL layer with the first wiring positioned therebetween. The substrate includes a region overlapping with the EL layer with the second wiring positioned therebetween. The first IC includes a surface facing the substrate. The surface includes a side. The first terminal is positioned on the side. The first touch sensor terminal is positioned on the side. The second touch sensor terminal is positioned on the side.

In the above embodiment, the display device preferably includes a substrate and an EL layer. The first IC is positioned over the substrate. The m-th IC is positioned over the substrate. The first wiring includes a region overlapping with the EL layer with the substrate positioned therebetween. The second wiring includes a region overlapping with the EL layer with the substrate positioned therebetween. The first IC includes a surface facing the substrate. The surface includes a first side and a second side opposite to the first side. The first terminal is positioned on the first side. The first touch sensor terminal is positioned on the second side. The second touch sensor terminal is positioned on the second side.

One embodiment of the present invention is a display device including a display portion, a touch sensor, a first IC, and a second IC. The display portion includes a first signal line and a second signal line. The first IC includes a first terminal and a first touch sensor terminal. The second IC includes a second terminal and a second touch sensor terminal. The first IC inputs a first video signal to the display portion through the first terminal and the first signal line. The second IC inputs a second video signal to the display portion through the second terminal and the second signal line. The touch sensor includes a first wiring and a second wiring. The touch sensor senses an input owing to a change in capacitance between the first wiring and the second wiring. The first touch sensor terminal is electrically connected to the first wiring. The second touch sensor terminal is electrically connected to the second wiring.

In the above embodiment, the display device preferably includes a substrate and a liquid crystal. The first IC is positioned over the substrate. The second IC is positioned over the substrate. The first wiring includes a region overlapping with the second wiring with the liquid crystal positioned therebetween. The first IC includes a first surface facing the substrate. The second IC includes a second surface facing the substrate. The first surface includes a first side and a second side opposite to the first side. The second surface includes a third side and a fourth side opposite to the third side. The first terminal is positioned on the first side. The first touch sensor terminal is positioned on the first side. The second terminal is positioned on the third side. The second touch sensor terminal is positioned on the fourth side.

In the above embodiment, the display device preferably includes a substrate and a liquid crystal. The first IC is positioned over the substrate. The second IC is positioned over the substrate. The liquid crystal includes a region overlapping with the substrate with the first wiring positioned therebetween. The liquid crystal includes a region overlapping with the substrate with the second wiring positioned therebetween. The first IC includes a first surface facing the substrate. The second IC includes a second surface facing the substrate. The first surface includes a first side. The second surface includes a second side. The first terminal is positioned on the first side. The first touch sensor terminal is positioned on the first side. The second terminal is positioned on the second side. The second touch sensor terminal is positioned on the second side.

In the above embodiment, the display device preferably includes a substrate and a liquid crystal. The first IC is positioned over the substrate. The second IC is positioned over the substrate. The first wiring includes a region overlapping with the substrate with the liquid crystal positioned therebetween. The second wiring includes a region overlapping with the substrate with the liquid crystal positioned therebetween. The first IC includes a first surface facing the substrate. The second IC includes a second surface facing the substrate. The first surface includes a first side and a second side opposite to the first side. The second surface includes a third side and a fourth side opposite to the third side. The first terminal is positioned on the first side. The first touch sensor terminal is positioned on the second side.

The second terminal is positioned on the third side. The second touch sensor terminal is positioned on the fourth side.

In the above embodiment, the display device preferably includes a substrate and an EL layer. The first IC is positioned over the substrate. The second IC is positioned over the substrate. The first wiring includes a region overlapping with the substrate with the EL layer positioned therebetween. The second wiring includes a region overlapping with the substrate with the EL layer positioned therebetween. The first IC includes a first surface facing the substrate. The second IC includes a second surface facing the substrate. The first surface includes a first side and a second side opposite to the first side. The second surface includes a third side and a fourth side opposite to the third side. The first terminal is positioned on the first side. The first touch sensor terminal is positioned on the second side. The second terminal is positioned on the third side. The second touch sensor terminal is positioned on the fourth side.

In the above embodiment, the display device preferably includes a substrate and an EL layer. The first IC is positioned over the substrate. The second IC is positioned over the substrate. The first wiring includes a region overlapping with the EL layer with the substrate positioned therebetween. The substrate includes a region overlapping with the EL layer with the second wiring positioned therebetween. The first IC includes a first surface facing the substrate. The second IC includes a second surface facing the substrate. The first surface includes a first side and a second side opposite to the first side. The second surface includes a third side and a fourth side opposite to the third side. The first terminal is positioned on the first side. The first touch sensor terminal is positioned on the first side. The second terminal is positioned on the third side. The second touch sensor terminal is positioned on the fourth side.

In the above embodiment, the display device preferably includes a substrate and an EL layer. The first IC is positioned over the substrate. The second IC is positioned over the substrate. The substrate includes a region overlapping with the EL layer with the first wiring positioned therebetween. The substrate includes a region overlapping with the EL layer with the second wiring positioned therebetween. The first IC includes a first surface facing the substrate. The second IC includes a second surface facing the substrate. The first surface includes a first side. The second surface includes a second side. The first terminal is positioned on the first side. The first touch sensor terminal is positioned on the first side. The second terminal is positioned on the second side. The second touch sensor terminal is positioned on the second side.

In the above embodiment, the display device preferably includes a substrate and an EL layer. The first IC is positioned over the substrate. The second IC is positioned over the substrate. The first wiring includes a region overlapping with the EL layer with the substrate positioned therebetween. The second wiring includes a region overlapping with the EL layer with the substrate positioned therebetween. The first IC includes a first surface facing the substrate. The second IC includes a second surface facing the substrate. The first surface includes a first side and a second side opposite to the first side. The second surface includes a third side and a fourth side opposite to the third side. The first terminal is positioned on the first side. The first touch sensor terminal is positioned on the second side.

The second terminal is positioned on the third side. The second touch sensor terminal is positioned on the fourth side.

One embodiment of the present invention is an electronic device that includes the display device according to any of the above embodiments and at least one of a microphone, a speaker, and an operation key.

According to one embodiment of the present invention, a display device with a touch sensor which has a large number of pixels and in which a driver circuit for a display portion and a driver circuit for a touch sensor are formed in one IC can be provided. According to one embodiment of the present invention, a display device including a touch sensor with high accuracy can be provided. According to one embodiment of the present invention, a novel semiconductor device can be provided.

Note that the description of these effects does not disturb the existence of other effects. One embodiment of the present invention does not necessarily achieve all the effects listed above. Other effects are apparent from and can be derived from the description of the specification, the drawings, the claims, and the like.

DETAILED DESCRIPTION OF THE INVENTION

Figure 1:
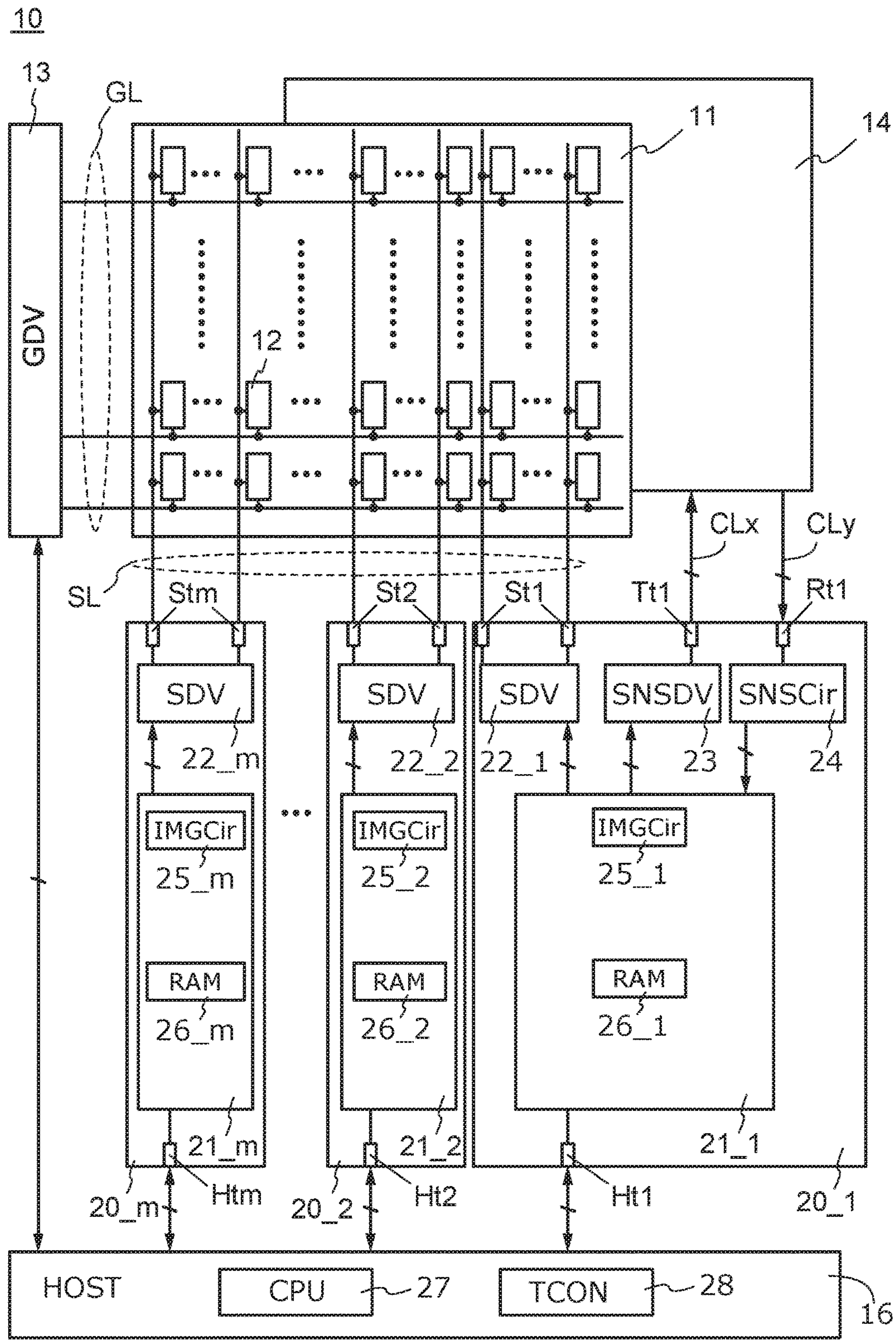
FIG. 1 is a circuit block diagram illustrating a configuration example of a display device.

Embodiments will be hereinafter described with reference to drawings. Note that the embodiments can be implemented with various modes. It will be readily appreciated by those skilled in the art that modes and details can be changed in various ways without departing from the spirit and scope of the present invention. Therefore, the present invention should not be interpreted as being limited to the description in the following embodiments.

Furthermore, in this specification, any of the embodiments below can be combined as appropriate. In the case where some structural examples are given in one embodiment, any of the structural examples can be combined as appropriate.

In the drawings, the size, the layer thickness, or the region is exaggerated for clarity in some cases. Therefore, embodiments of the present invention are not limited to such a scale. Note that the drawings are schematic views showing ideal examples, and embodiments of the present invention are not limited to shapes or values shown in the drawings.

In addition, in this specification and the like, the term such as an "electrode" or a "wiring" does not limit a function of a component. For example, an "electrode" is used as part of a "wiring" in some cases, and vice versa. Furthermore, the term "electrode" or "wiring" can also mean a combination of a plurality of "electrodes" and "wirings" formed in an integrated manner.

(Embodiment 1)

In this embodiment, a configuration example of a display device according to one embodiment of the present invention will be described.

FIG. 1 is a circuit block diagram illustrating a configuration example of a display device 10 according to one embodiment of the present invention. The display device 10 includes a display portion 11, a touch sensor 14, a scan line driver circuit 13, ICs 20_1 to 20_*m* (m is an integer of 2 or more), and a host 16.

«Display Portion»

The display portion 11 includes a plurality of pixels 12 arranged in a matrix, a plurality of scan lines GL, and a plurality of signal lines SL, and has a function of displaying an image.

The display portion 11 can display an image by control of emission/non-emission of the pixel 12. For the pixel 12, a liquid crystal element or an electroluminescence (EL) element (note that the EL element includes one or both of an organic compound and an inorganic compound) can be used, for example. The pixel 12 can include, in addition to them, at least one of an LED chip (e.g., a white LED chip, a red LED chip, a green LED chip, or a blue LED chip), a transistor (a transistor that emits light depending on current), an electron emitter, a display element including a carbon nanotube, electronic ink, an electrowetting element, an electrophoretic element, a display element using micro electro mechanical systems (MEMS) (such as a grating light valve (GLV), a digital micromirror device (DMD), a digital micro shutter (DMS), MIRASOL (registered trademark), an interferometric modulator display (IMOD) element, a MEMS shutter display element, an optical-interference-type MEMS display element, or a piezoelectric ceramic display portion), quantum dots, and the like.

The number of pixels in the display portion 11 is preferably as high as HD (number of pixels: 1280×720), FHD (number of pixels: 1920×1080), WQHD (number of pixels: 2560×1440), WQXGA (number of pixels: 2560×1600), 4K, or 8K. In particular, the number of pixels of 4K, 8K, or higher is preferable. The pixel density (definition) of the pixels in the display portion 11 is higher than or equal to 300 ppi, preferably higher than or equal to 500 ppi, more preferably higher than or equal to 800 ppi, more preferably higher than or equal to 1000 ppi, more preferably higher than or equal to 1200 ppi. The display portion 11 with such a large number of pixels and high definition enables an increase in a realistic sensation, sense of depth, and the like in personal use such as portable use and home use.

«Scan Line Driver Circuit»

The scan line driver circuit 13 is electrically connected to the pixels 12 through the scan lines GL. The scan line driver circuit 13 has a function of outputting scan signals to the scan lines GL. The scan line driver circuit 13 is referred to as a gate driver in some cases.

«IC»

The IC 20_1 includes a circuit 21_1, a signal line driver circuit 22_1, a touch sensor driver circuit 23, and a touch sensor detection circuit 24. The IC 20_2 includes a circuit 21_2 and a signal line driver circuit 22_2. Similarly, the IC 20_*m* includes a circuit 21_*m* and a signal line driver circuit 22_*m*. In the following description, the ICs 20_1 to 20_*m* are collectively referred to as an IC 20 and the signal line driver circuits 22_1 to 22_*m* are collectively referred to as a signal line driver circuit 22 in some cases.

The IC 20_1 is electrically connected to the signal line SL via a terminal St1, to a host 16 via a terminal Ht1, to a wiring CLx via a terminal Tt1, and to a wiring CLy via a terminal Rt1. The IC 20_2 is electrically connected to the signal line SL via a terminal St2 and to the host 16 via a terminal Ht2. Similarly, the IC 20_*m* is electrically connected to the signal line SL via a terminal Stm and to the host 16 via a terminal Htm.

The IC 20 is preferably formed using a plurality of IC chips (hereinafter referred to as an IC). The example where the IC 20 is one IC is described. As the resolution of the display portion 11 is increased like 4K or 8K, the number of signal lines SL is increased. Consequently, the area of the IC is increased. A large-area IC is difficult to manufacture and requires high price. Furthermore, when the IC is crimped to a substrate (or a film, for example), the pressure for each terminal of the IC needs to be optimal. In the case where the display portion 11 has a large number of pixels like 4K or 8K, the number of terminals of the IC is also increased significantly, and accordingly, a load for the entire IC in the crimp is also increased. As a result, a crack or the like occurs in the IC, and thus, the IC is difficult to mount. In the case where the IC 20 is formed using a plurality of ICs, a load for each IC is small, and thus, the IC is easily mounted.

<Signal Line Driver Circuit>

The signal line driver circuit 22 has a function of outputting a video signal to the display portion 11 and a function of supplying a video signal that is an analog signal to the pixel 12 included in the display portion 11 through the signal line SL. For example, the signal line driver circuit 22 can include a shift register circuit and a buffer circuit in combination. The display device 10 may include a demultiplexer circuit connected to the signal lines SL. The signal line driver circuit 22 is referred to as a source driver in some cases.

<Touch Sensor Driver Circuit>

The touch sensor driver circuit 23 is electrically connected to the touch sensor 14 through the wiring CLx. The touch sensor driver circuit 23 has a function of outputting a signal for driving a sensor element in the touch sensor 14. As the touch sensor driver circuit 23, a shift register circuit and a buffer circuit can be used in combination, for example.

<Touch Sensor Detection Circuit>

The touch sensor detection circuit 24 is electrically connected to the touch sensor 14 through the wiring CLy. The touch sensor detection circuit 24 has a function of outputting an output signal from a sensor element in the touch sensor 14 to the circuit 21_1. The touch sensor detection circuit 24 can include an amplifier circuit and an analog-digital converter (ADC), for example. The touch sensor detection circuit 24 converts an analog signal output from the touch sensor 14 into a digital signal and outputs the digital signal to the circuit 21_1.

In FIG. 1, the IC 20_1 is connected to the pixel 12 at an end of the display portion 11; however, one embodiment of the present invention is not limited thereto. The IC 20_1 may be connected to the pixel 12 in the center portion or another portion of the display portion 11.

<Image Processing Circuit, RAM>

The circuit 21_1 includes an image processing circuit 25_1 and a RAM 26_1. Similarly, the circuit 21_*m* includes an image processing circuit 25*m* and a RAM 26_*m*. In the following description, image processing circuits 25_1 to 25_*m* are collectively referred to as an image processing circuit 25 and RAMs 26_1 to 26_*m* are collectively referred to as a RAM 26 in some cases.

The image processing circuit 25 has a function of generating a video signal in response to an instruction from the host 16. Furthermore, the image processing circuit 25 has a function of performing signal processing on a video signal in accordance with the specifications of the display portion 11, converting the signal into an analog video signal, and supplying the analog video signal to the signal line driver circuit 22. The image processing circuit 25_1 has a function of generating a driving signal in accordance with an instruction from the host 16 and outputting the signal to the touch sensor driver circuit 23 and has a function of analyzing a signal input from the touch sensor detection circuit 24 and outputting the analyzed signal to the host 16 as positional data.

The RAM 26 has a function of retaining data needed for processing in the image processing circuit 25.

The image processing circuit 25 can include a processor, for example. A microprocessor such as a digital signal processor (DSP) or a graphics processing unit (GPU) can be used, for example. Furthermore, such a microprocessor may be obtained with a programmable logic device (PLD) such as a field programmable gate array (FPGA) or a field programmable analog array (FPAA). The image processing circuit 25 interprets and executes instructions from programs with the processor to process various kinds of data and control programs.

«Host»

The host 16 includes a CPU 27 and a timing controller 28.

<Timing Controller>

To the timing controller 28, a variety of synchronization signals which determine timing of updating the display portion 11 are input. Examples of the synchronization signals include a horizontal synchronization signal, a vertical synchronization signal, and a reference clock signal. The timing controller 28 generates control signals for the scan line driver circuit 13, the signal line driver circuit 22, and the touch sensor driver circuit 23 from these signals. Furthermore, the timing controller 28 may have a function of generating a signal for determining timing when the touch sensor detection circuit 24 outputs a signal. Here, the timing controller 28 preferably outputs a signal synchronized with the signal output to the scan line driver circuit 13 and a signal synchronized with the signal output to the touch sensor driver circuit 23. In particular, it is preferable that a period in which data in the display portion 11 is rewritten and a period in which sensing is performed with the touch sensor 14 be separately provided. For example, the display device 10 can be driven by dividing one frame period into a period in which data in the display portion 11 is rewritten and a period in which sensing is performed. Furthermore, detection sensitivity and detection accuracy can be increased, for example, by providing two or more sensing periods in one frame period.

<CPU>

The CPU 27 has a function of executing an instruction and controlling the display device 10 collectively. The CPU 27 executes an instruction input from the outside and an instruction stored in an internal memory. The CPU 27 generates signals for controlling the timing controller 28 and the image processing circuit 25.

When the timing controller 28 is included in the host 16, the IC 20 does not necessarily include a timing controller. Thus, the area of the IC can be reduced, the cost of the IC can be reduced, and the timing of the plurality of ICs can be controlled by one timing controller.

«Touch Sensor»

The touch sensor 14 includes a plurality of sensor elements which sense the contact or approach of an object to the display device 10. As the touch sensor 14, a capacitive touch sensor can be used, for example. Examples of the capacitive touch sensor are a surface capacitive touch sensor and a projected capacitive touch sensor. Examples of the projected capacitive touch sensor include a self-capacitive touch sensor and a mutual capacitive touch sensor. The use of a mutual capacitive touch sensor is preferable because multiple points can be sensed simultaneously.

Note that one embodiment of the present invention is not limited thereto, and any of various sensors that can sense the approach or contact of an object such as a finger or a stylus can be used as the touch sensor 14. For the touch sensor, in addition to a capacitive type, a variety of types such as, a resistive type, a surface acoustic wave type, an infrared type, and an optical type can be used, for example.

<Example of Touch Sensor>

Figure 2A:
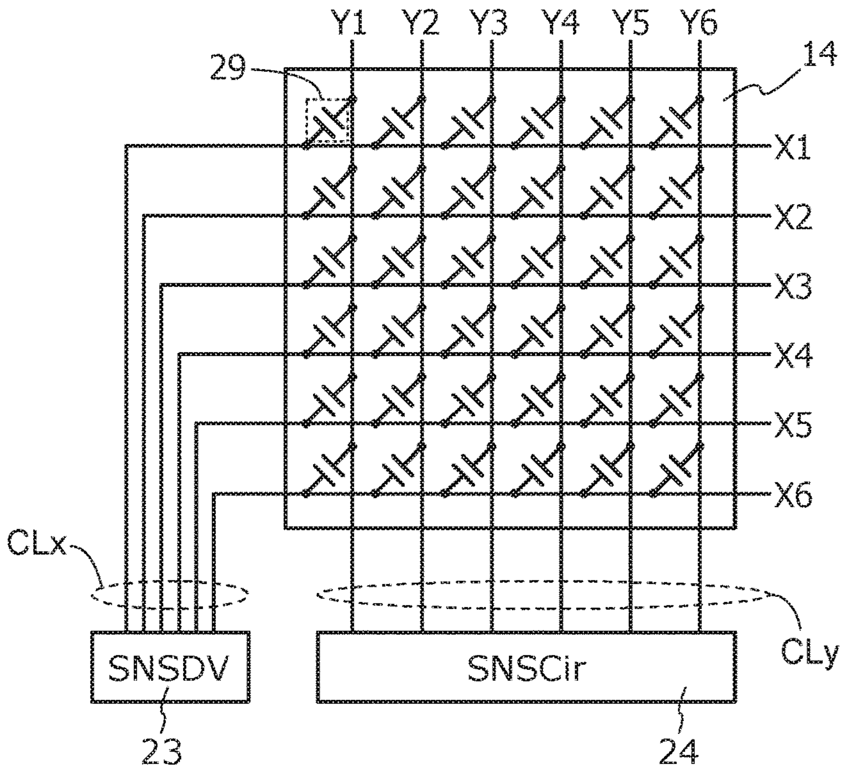
FIGS. 2A and 2B are a circuit diagram and a timing chart illustrating a configuration example of a touch sensor.

FIG. 2A is a block diagram illustrating a structure example where the touch sensor 14 is a mutual capacitive touch sensor. In FIG. 2A, as an example, six wirings X1 to X6 represent the wiring CLx to which a pulse voltage is applied, and six wirings Y1 to Y6 represent the wiring CLy which senses changes in current. The number of wirings is not limited to those illustrated in this example. FIG. 2A also illustrates a capacitor 29 that is formed with the wiring CLx and the wiring CLy overlapping with each other or being provided close to each other.

The touch sensor driver circuit 23 is, for example, a circuit for sequentially applying a pulse voltage to the wirings X1 to X6. By applying a pulse voltage to the wirings X1 to X6, an electric field is generated between the wiring CLx and the wiring CLy of the capacitors 29. With a pulse voltage, current flows through the capacitor 29. An electric field generated between the wirings is changed by being blocked, for example, when a finger or a stylus touches the touch sensor. That is, for example, by touch with a finger or a stylus, the capacitance of the capacitor 29 is changed. By utilizing the change in capacitance caused by touch with a finger or a stylus as described above, the approach or contact of an object can be detected.

The touch sensor detection circuit 24 is a circuit for sensing changes in current flowing through the wirings Y1 to Y6 that are caused by the changes in capacitance of the capacitors 29. No change in the current values of the wirings Y1 to Y6 is sensed when there is no approach or contact of an object, whereas a decrease in the current value is sensed when capacitance is decreased owing to the approach or contact of an object. In order to sense a change in current, the total amount of current may be sensed. In that case, an integrator circuit or the like may be used to sense the total amount of current. Alternatively, the peak value of current may be sensed. In that case, current may be converted into voltage, and the peak value of voltage may be sensed.

Figure 2B:
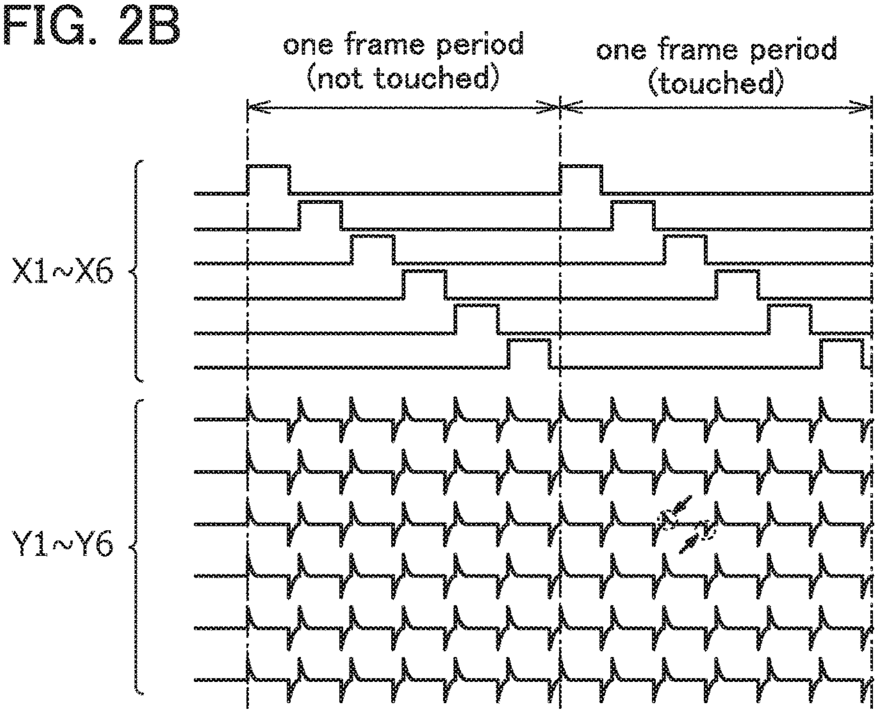

FIG. 2B is a timing chart showing input and output waveforms of the touch sensor 14. In FIG. 2B, detection of an object is performed in all the rows and columns in one frame period. FIG. 2B shows a period during which an object is not detected (when the display device is not touched) and a period during which an object is detected (when the display device is touched). Sensed current values of the wirings Y1 to Y6 are shown as waveforms of voltage values. The timing of the display operation in the display portion 11 is preferably in synchronization with the timing of the input and output waveforms of the touch sensor 14. FIG. 2B shows an example in which these timings are not in synchronization to simplify the description.

A pulse voltage is sequentially applied to the wirings X1 to X6, and the waveforms of the wirings Y1 to Y6 change in accordance with the pulse voltage. When there is no approach or contact of an object, the waveforms of the wirings Y1 to Y6 change uniformly in accordance with changes in the voltages of the wirings X1 to X6. In contrast, the current value is decreased at the point of approach or contact of an object; accordingly, the waveform of the voltage value also changes.

By sensing a change in capacitance in this manner, the approach or contact of an object can be detected. Even when an object such as a finger or a stylus does not touch but only approaches a touch sensor or a display device, a signal may be sensed in some cases.

Although FIG. 2A illustrates, as a touch sensor, the structure of a passive matrix touch sensor in which only the capacitor 29 is provided at the intersection of wirings, an active matrix touch sensor including a transistor and a capacitor may also be used.

«Another Structure Example of Display Device»

Figure 3:
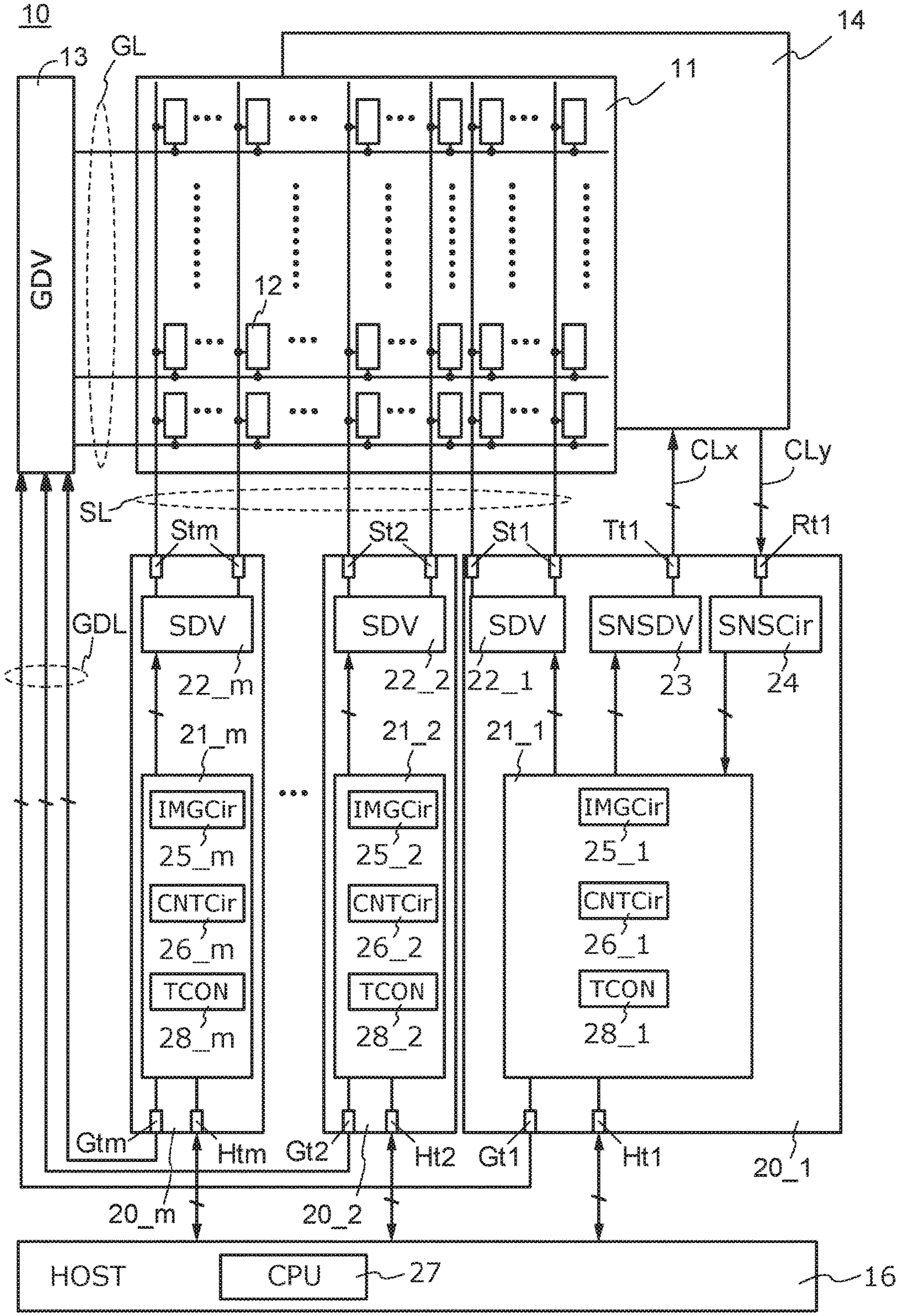
FIG. 3 is a circuit block diagram illustrating a configuration example of a display device.

The timing controller 28 in FIG. 1 may be included in the IC 20. FIG. 3 shows a circuit diagram of this case.

In FIG. 3, the circuit 21_1, the circuit 21_2, and the circuit 21_*m* include a timing controller 28_1, a timing controller 28_2, and a timing controller 28_*m*, respectively. The scan line driver circuit 13 is electrically connected to the ICs 20_1, 20_2, and 20_*m* through respective terminals Gt1, Gt2, and Gtm and wirings GDL. FIG. 3 is different from FIG. 1 in the above points.

A timing controller needs to operate at high voltage, whereas a CPU needs to operate at low voltage. Therefore, the host 16 in FIG. 1 needs a booster circuit and thus, the host 16 has a complicated circuit configuration. When the IC 20 includes a timing controller as illustrated in FIG. 3, the host 16 can have a simple circuit configuration.

«Arrangement Example of IC»

Figure 4A:
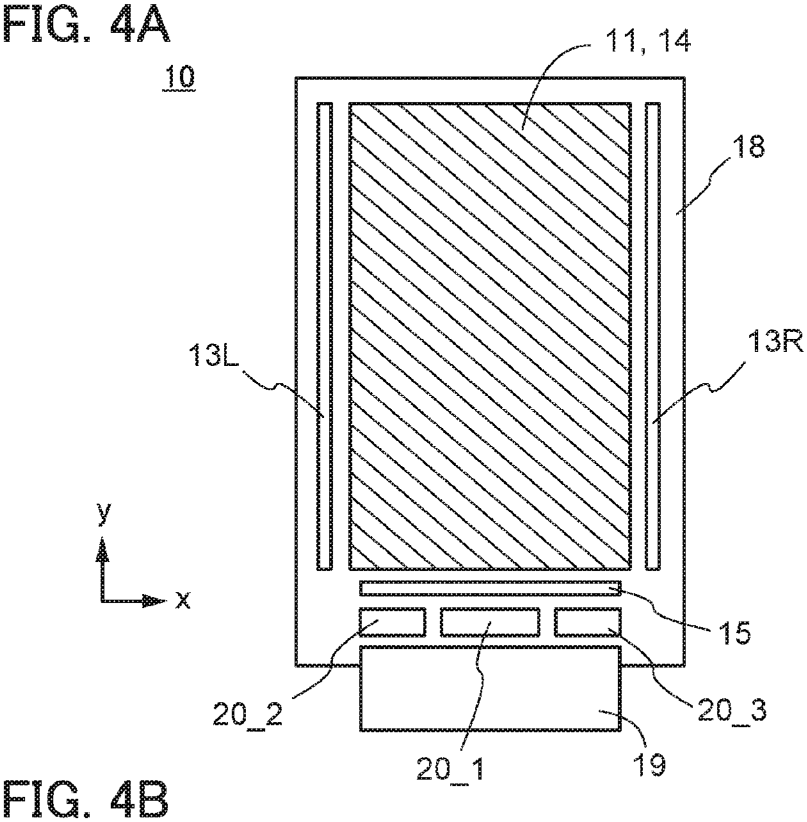
FIGS. 4A and 4B are schematic views each illustrating a structure example of a display device.

FIG. 4A is a schematic view of the display device 10 and illustrates positional relationships of the display portion 11, the touch sensor 14, and their peripheral circuits. In schematic views in FIGS. 4A and 4B, the display portion 11, the touch sensor 14, a scan line driver circuit 13L, a scan line driver circuit 13R, a demultiplexer 15, a flexible printed circuit (FPC) 19, the IC 20_1, the IC 20_2, and the IC 20_3 are provided over a substrate 18. The IC 20_1 is positioned at the center and the ICs 20_2 and 20_3 are positioned on respective sides of the IC 20_1. The ICs 20_1 to 20_3 are connected to the host 16 through the FPC 19. The touch sensor 14 may be formed in the same position as the display portion 11 over the substrate 18 as illustrated in FIG. 4A, and may be formed over a substrate different from the substrate 18.

Figure 4B:
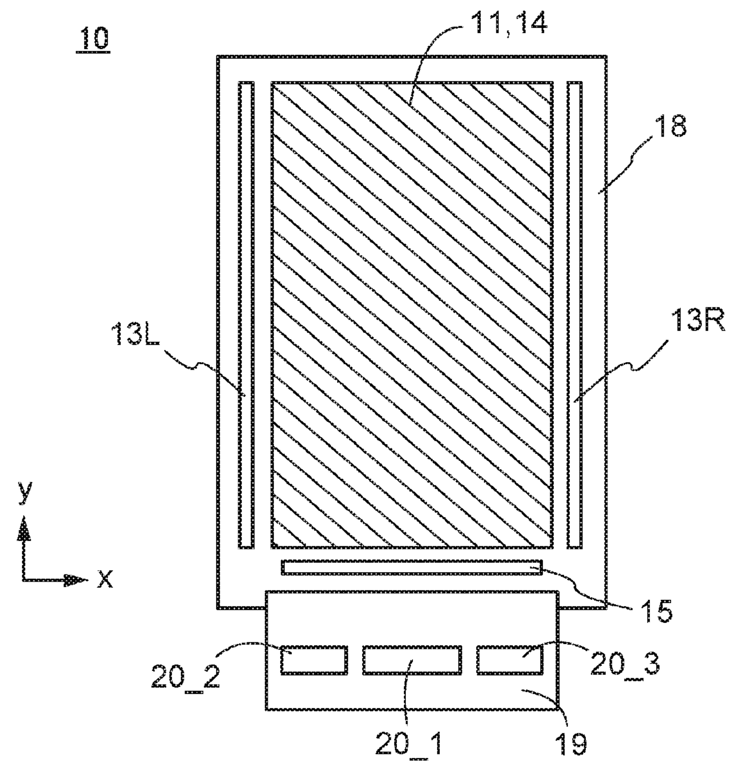

The IC 20 may be provided by a chip-on-film (COF) method, a tape carrier package (TCP) method, or the like. FIG. 4B illustrates an example where the ICs 20_1 to 20_3 are provided over the FPC 19. The area of the substrate 18 can be reduced by providing the IC 20 over the FPC 19, so that the display device 10 can be downsized.

Although FIGS. 4A and 4B each illustrate an example with three ICs, one embodiment of the present invention is not limited thereto. The display device 10 can include four or more ICs. FIGS. 4A and 4B each illustrate an example where the ICs 20_1 to 20_3 are connected to an FPC; however, one embodiment of the present invention is not limited thereto. Respective FPCs may be provided for ICs.

As illustrated in FIGS. 4A and 4B, the IC 20_1 is preferably positioned at or near the center. By providing the IC 20_1 at or near the center, wiring resistance of the wiring CLy can be offered evenly, so that signal processing is easily performed. Note that the position of the IC 20_1 is not limited thereto. The IC 20_2 or the IC 20_3 may be positioned at or near the center in some cases.

FIGS. 5A to 5C, FIGS. 6A to 6D, and FIGS. 7A to 7C are schematic views illustrating arrangement examples of terminals of the ICs 20_1 to 20_3 when the ICs 20_1 to 20_3 are mounted over the substrate 18. Furthermore, FIGS. 5A to 5C, FIGS. 6A to 6D, and FIGS. 7A to 7C illustrate arrangement examples of the terminals on bottom surfaces of the ICs 20_1 to 20_3. Note that the bottom surface refers to a surface of an IC which faces the substrate 18. The IC 20_1 includes the terminal St1, the terminal Rt1, the terminal Tt1, and the terminal Ht1. The IC 20_2 includes the terminal St2 and the terminal Ht2. The IC 20_3 includes a terminal St3 and a terminal Ht3.

As illustrated in FIG. 1, the IC 20_1 is electrically connected to the signal line SL via the terminal St1, to the host 16 via the terminal Ht1, to the wiring CLx via the terminal Tt1, and to the wiring CLy via the terminal Rt1. The IC 20_2 is electrically connected to the signal line SL via the terminal St2 and to the host 16 via the terminal Ht2. The IC 20_3 is electrically connected to the signal line SL via the terminal St3 and to the host 16 via the terminal Ht3.

In FIGS. 5A to 5C, FIGS. 6A to 6D, and FIGS. 7A to 7C, the bottom surface of each of the ICs 20_1 to 20_3 has a first side and a second side opposite to the first side. The IC 20_1 includes the terminal St1 on the first side and the terminal Ht1 on the second side. Similarly, the IC 20_2 includes the terminal St2 on the first side and the terminal Ht2 on the second side, and the IC 20_3 includes the terminal St3 on the first side and the terminal Ht3 on the second side.

Figure 5A:
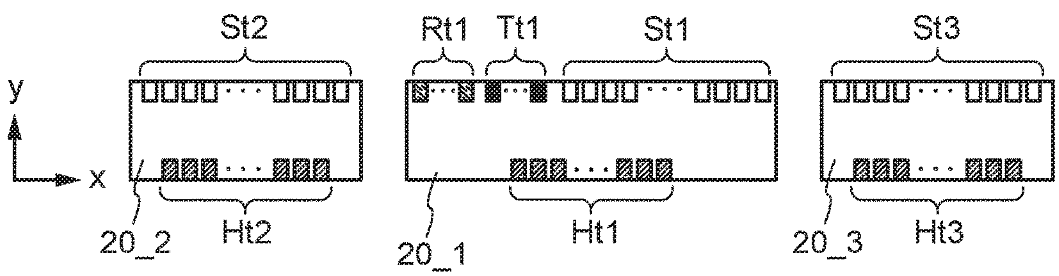
FIGS. 5A to 5C are schematic views each illustrating an example of an arrangement of terminals of an IC.
Figure 5B:
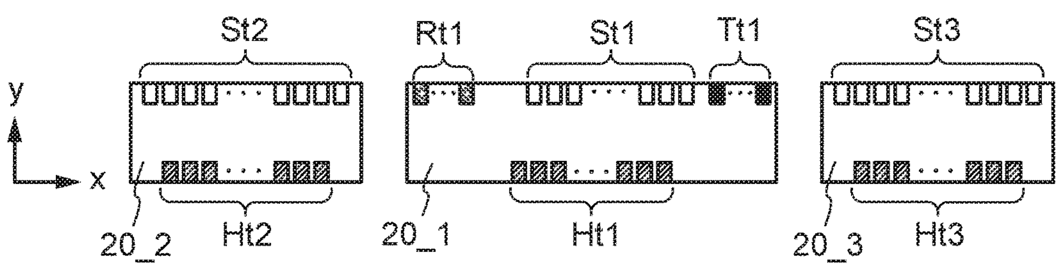
Figure 5C:
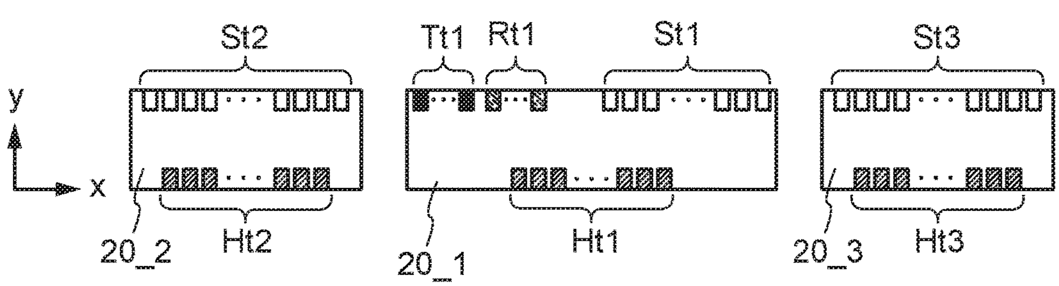

In each of FIGS. 5A to 5C, the IC 20_1 includes the terminals Rt1, Tt1, and St1 on the first side and the terminal Ht1 on the second side. The terminal Rt1 and the terminal St1 are arranged so that the terminal Tt1 is sandwiched therebetween in FIG. 5A, the terminal Rt1 and the terminal Tt1 are arranged so that the terminal St1 is sandwiched therebetween in FIG. 5B, and the terminal Tt1 and the terminal St1 are arranged so that the terminal Rt1 is sandwiched therebetween in FIG. 5C.

An analog signal output from the touch sensor 14 is input to the touch sensor detection circuit 24 through the wiring CLy and the terminal Rt1. To detect an analog signal by the touch sensor detection circuit 24 accurately, the wiring CLy, the terminal Rt1, and the touch sensor detection circuit 24 need to be apart from a noise generation source. Meanwhile, the signal line SL includes much noise because of its large parasitic capacitance. Therefore, the terminal St1 electrically connected to the signal line SL possibly becomes a noise generation source.

The structure illustrated in FIG. 5A is preferable because the terminal Rt1 and the terminal St1 are apart from each other with the terminal Tt1 positioned therebetween. Also in FIGS. 5B and 5C, the terminal Rt1 and the terminal St1 preferably have a sufficient distance therebetween. In each of the structures illustrated in FIGS. 5A to 5C, the terminal Rt1 is less likely to be affected by noise and thus, the display device 10 can perform sensing with higher accuracy.

In each of FIGS. 6A to 6D, the IC 20_1 includes the terminal St1 and one of the terminal Tt1 and the terminal Rt1 on the first side and the terminal Ht1 and the other of the terminal Tt1 and the terminal Rt1 on the second side.

Figure 6A:
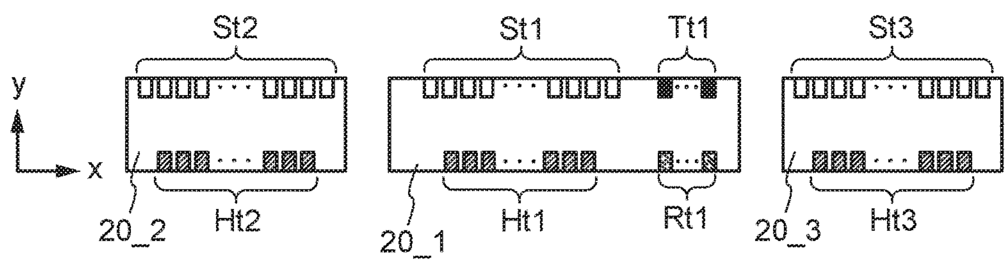
FIGS. 6A to 6D are schematic views each illustrating an example of an arrangement of terminals of an IC.
Figure 6B:
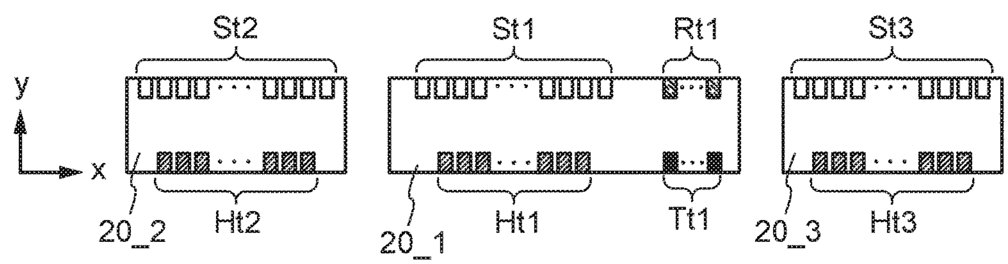
Figure 6C:
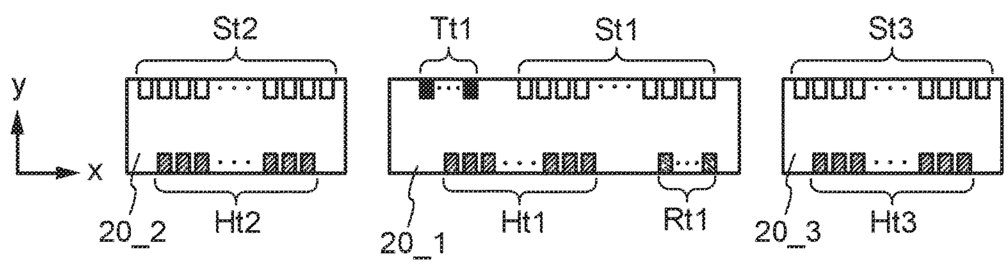
Figure 6D:
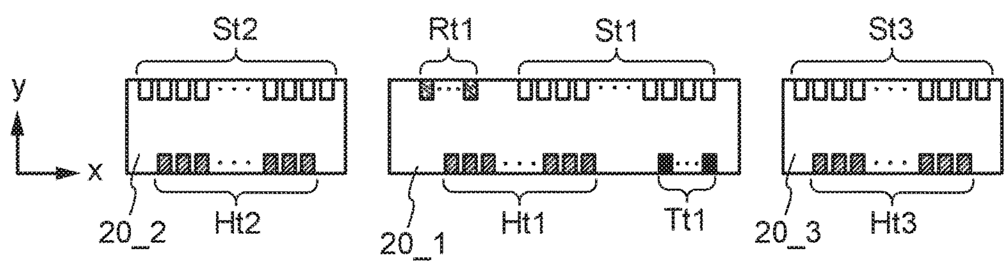

The structures illustrated in FIGS. 6A and 6C are preferable because the terminal Rt1 is on a side opposite to the terminal St1 and the terminal Rt1 and the terminal St1 are provided to have a sufficient distance therebetween. Also in FIGS. 6B and 6D, the terminal Rt1 and the terminal St1 preferably have a sufficient distance therebetween. In each of the structures illustrated in FIGS. 6A to 6D, the terminal Rt1 is less likely to be affected by noise and thus, the display device 10 can perform sensing with higher accuracy.

Figure 7A:
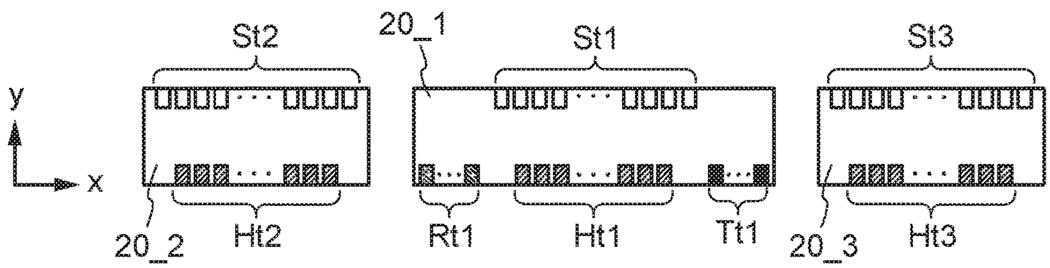
FIGS. 7A to 7C are schematic views each illustrating an example of an arrangement of terminals of an IC.
Figure 7B:
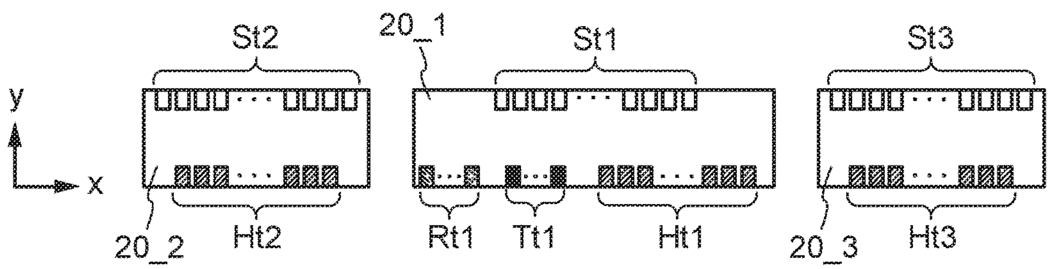
Figure 7C:
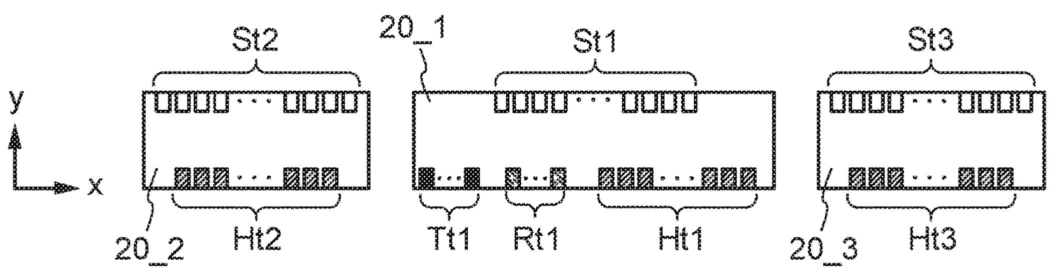

In each of FIGS. 7A to 7C, the IC 20_1 includes the terminal St1 on the first side and the terminal Ht1, the terminal Tt1, and the terminal Rt1 on the second side.

The structures illustrated in FIGS. 7A to 7C are preferable because the terminal Rt1 is on a side opposite to the terminal St1 and the terminal Rt1 and the terminal St1 are provided to have a sufficient distance therebetween. In each of the structures illustrated in FIGS. 7A to 7C, the terminal Rt1 is less likely to be affected by noise and thus, the display device 10 can perform sensing with higher accuracy.

The structures illustrated in FIGS. 4A and 4B, FIGS. 5A to 5C, FIGS. 6A to 6D, and FIGS. 7A to 7C can be applied to the display device 10 illustrated in FIG. 3. In this case, the terminal Gt1 in the IC 20_1, the terminal Gt2 in the IC 20_2, and the terminal Gt3 in the IC 20_3 are provided in appropriate positions. In particular, the terminal Gt1 may be provided between the terminal St1 and the terminal Rt1. In the above structures, the terminal Rt1 is away from the terminal St1 and thus less likely to be affected by noise, so that the display device 10 can perform sensing with higher accuracy.

With the display device in this embodiment, a display device with a touch sensor which has pixels of 4K, 8K, or more and in which a driver circuit of a display portion and a driver circuit of a touch sensor are included in one IC can be provided. Furthermore, a display device including a high accuracy touch sensor can be provided.

(Embodiment 2)

In this embodiment, a configuration example of a display device according to one embodiment of the present invention will be described.

«Configuration Example of Display Device 100»

Figure 8:
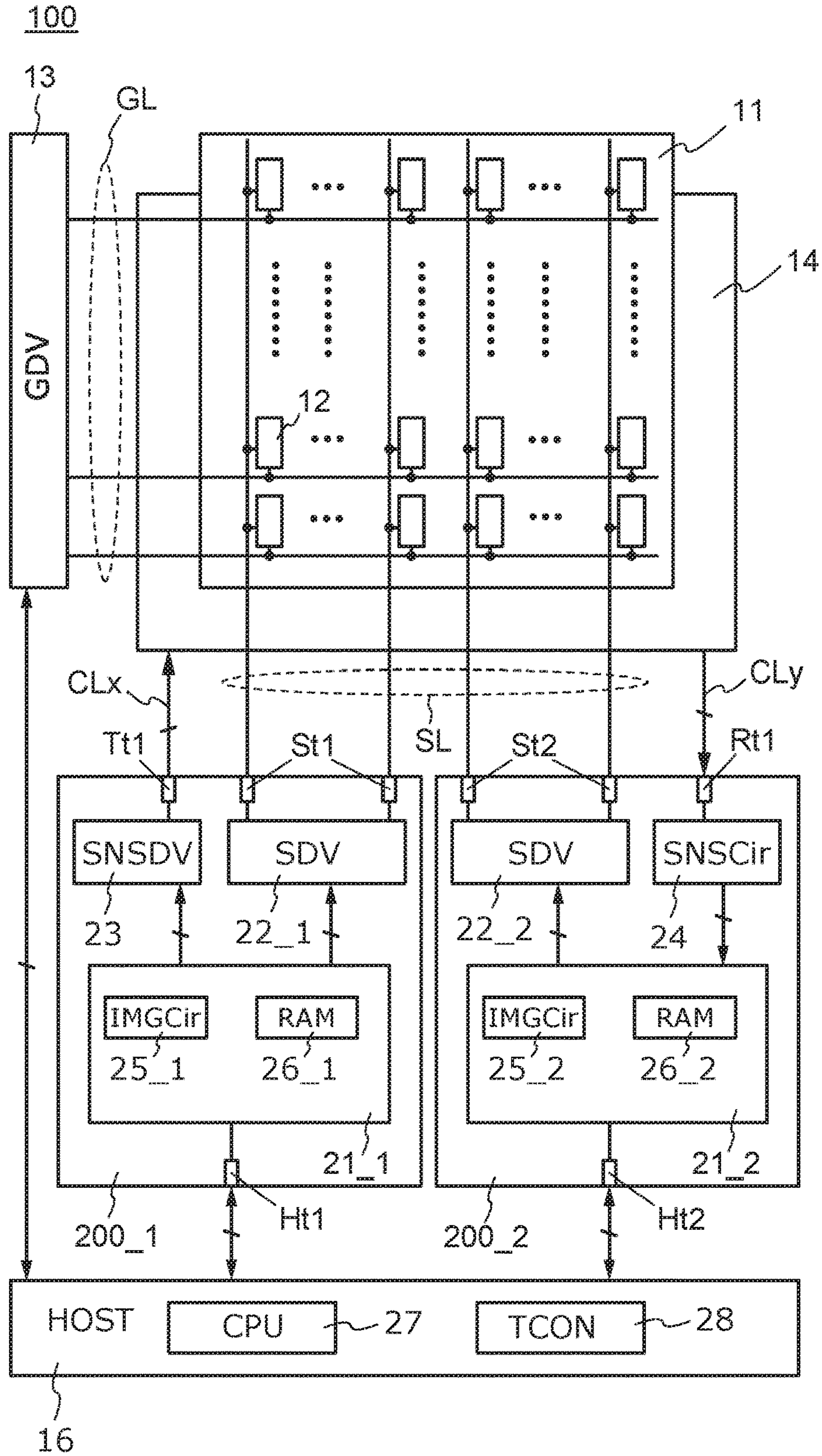
FIG. 8 is a circuit block diagram illustrating a configuration example of a display device.

FIG. 8 is a circuit block diagram illustrating a configuration example of a display device 100 according to one embodiment of the present invention. The display device 100 includes the display portion 11, the touch sensor 14, the scan line driver circuit 13, ICs 200_1 and 200_2, and the host 16.

The IC 200_1 includes the circuit 21_1, the signal line driver circuit 22_1, and the touch sensor driver circuit 23. The IC 200_2 includes the circuit 21_2, the signal line driver circuit 22_2, and the touch sensor detection circuit 24. The circuit 21_1 includes the image processing circuit 25_1 and the RAM 26_1. The circuit 21_2 includes the image processing circuit 25_2 and the RAM 26_2. In the following description, the ICs 200_1 and 200_2 are collectively referred to as an IC 200 in some cases.

The IC 200_1 is electrically connected to the signal line SL via the terminal St1, to the host 16 via the terminal Ht1, and to the wiring CLx via the terminal Tt1. The IC 200_2 is electrically connected to the wiring CLy via the terminal Rt1, to the signal line SL via the terminal St2, and to the host 16 via the terminal Ht2.

The display device 100 is different from the display device 10 in Embodiment 1 in that the touch sensor driver circuit 23 and the touch sensor detection circuit 24 are provided in respective ICs. The description of the display device 10 in Embodiment 1 may be referred to for the details of the other components of the display device 100.

In the case where the display device 100 includes a plurality of ICs like the display device 10, the load for each IC when the IC is crimped to a substrate (or a film, for example) can be reduced. Consequently, the IC can be easily mounted.

The touch sensor detection circuit 24 is preferably away from a noise generation source because the touch sensor detection circuit 24 handles an analog signal. Meanwhile, the wiring CLx includes noise because of its large parasitic capacitance, and thus, the touch sensor driver circuit 23 connected to the wiring CLx possibly becomes a noise generation source. Therefore, the touch sensor detection circuit 24 and the touch sensor driver circuit 23 are preferably apart from each other. In particular, the touch sensor detection circuit 24 and the touch sensor driver circuit 23 are preferably provided in respective ICs as illustrated in FIG. 8. With the above structure, the touch sensor detection circuit 24 is less likely to be affected by noise, so that the display device 100 can perform sensing with higher accuracy.

Figure 9A:
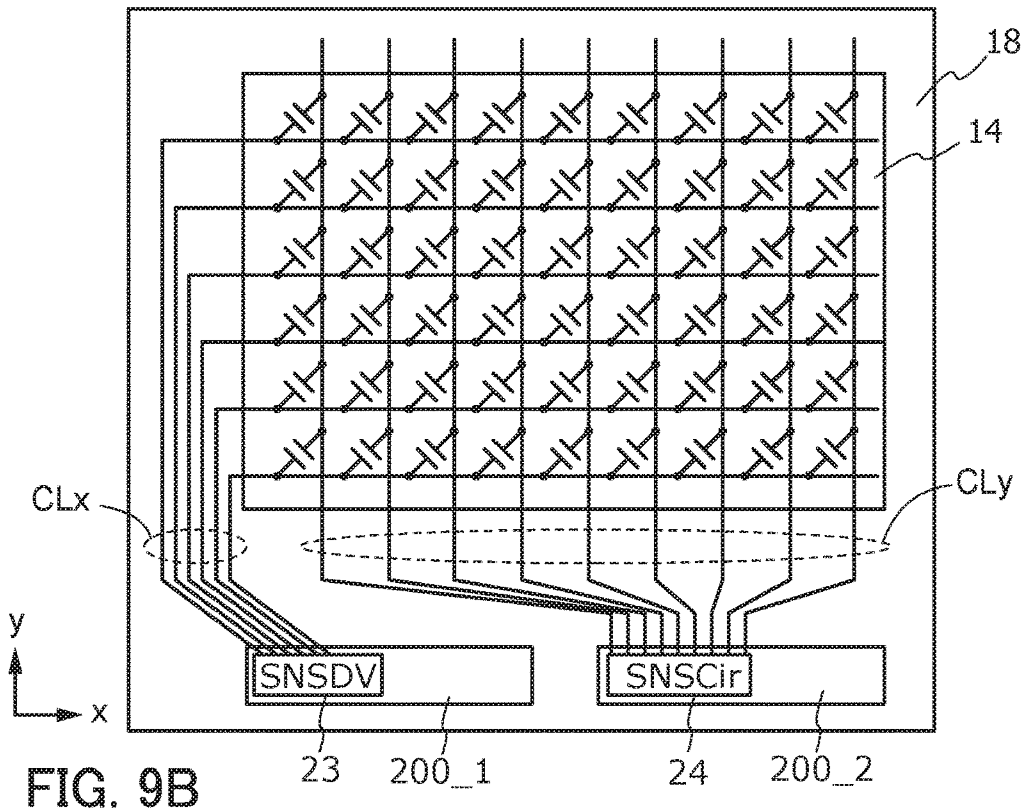
FIGS. 9A and 9B are schematic views each illustrating a structure example of a display device.
Figure 9B:
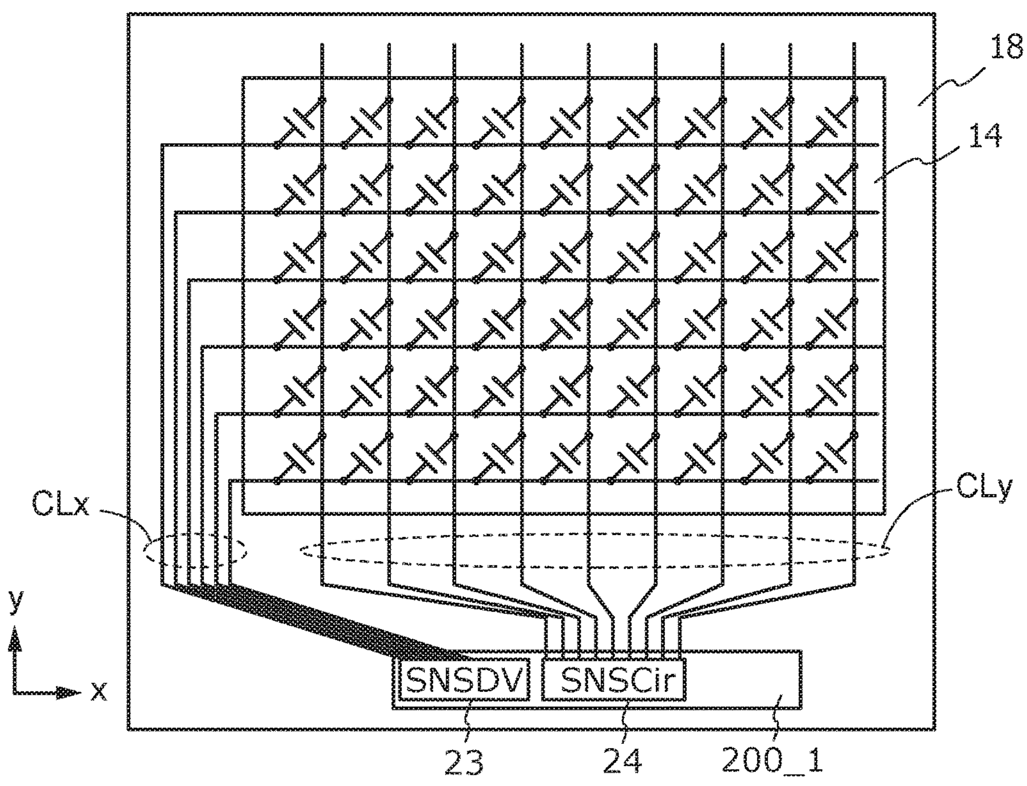

FIGS. 9A and 9B are schematic views illustrating examples of layout of the wirings CLx and CLy included in the touch sensor 14. The display portion 11, the scan line driver circuit 13L, the scan line driver circuit 13R, the demultiplexer 15, and the like are not illustrated for easy understanding. FIG. 9A illustrates the case where the touch sensor driver circuit 23 and the touch sensor detection circuit 24 are provided in respective ICs (the IC 200_1 and the IC 200_2) and FIG. 9B illustrates the case where the touch sensor driver circuit 23 and the touch sensor detection circuit 24 are provided in one IC (the IC 200_1). The wiring CLx in FIG. 9A is shorter than the corresponding wiring CLx in FIG. 9B. The wiring CLx preferably has a short length because the parasitic capacitance and resistance of the wiring CLx can be reduced. As described above, in terms of the layout of the wirings included in the touch sensor, the touch sensor driver circuit 23 and the touch sensor detection circuit 24 are preferably provided in respective ICs.

In the display device 100 illustrated in FIG. 8, the host 16 includes the CPU 27 and the timing controller 28. When the timing controller 28 is not included in the ICs 200, the area and price of the ICs can be reduced and a plurality of ICs can be controlled by one timing controller.

Figure 10:
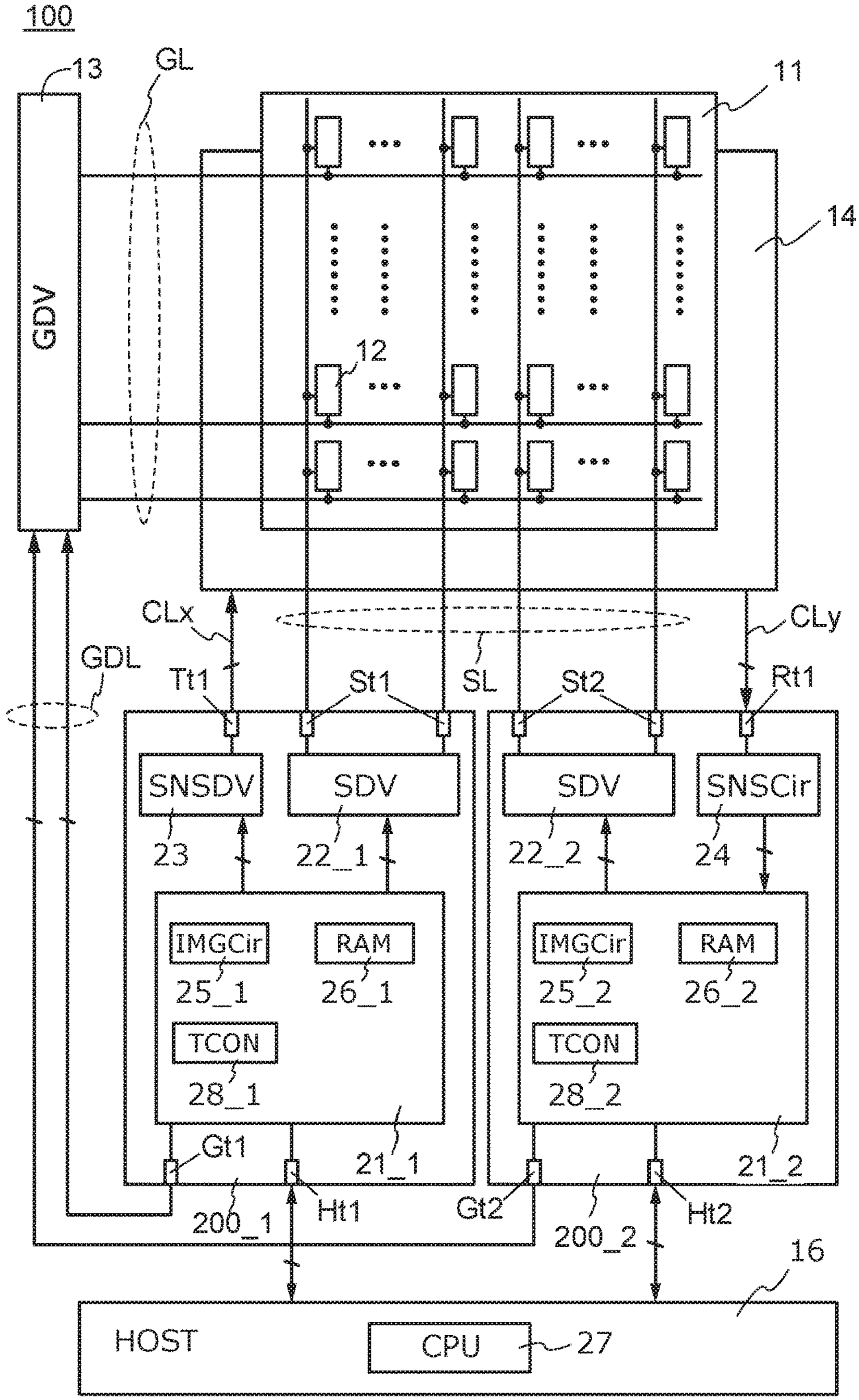
FIG. 10 is a circuit block diagram illustrating a structure example of a display device.

FIG. 10 is a circuit block diagram in which the timing controller 28 is included in the IC 200. In FIG. 10, the circuit 21_1 includes the timing controller 28_1 and the circuit 21_2 includes the timing controller 28_2. The IC 200_1 is electrically connected to the scan line driver circuit 13 through the terminal Gt1 and the wiring GDL, and the IC 200_2 is electrically connected to the scan line driver circuit 13 through the terminal Gt2 and the wiring GDL.

A timing controller needs to operate at high voltage, whereas a CPU needs to operate at low voltage. Therefore, the host 16 in FIG. 8 needs a booster circuit and thus, the host 16 has a complicated circuit configuration. When the IC 200 includes a timing controller as illustrated in FIG. 10, the host 16 can have a simple circuit configuration.

Figure 11:
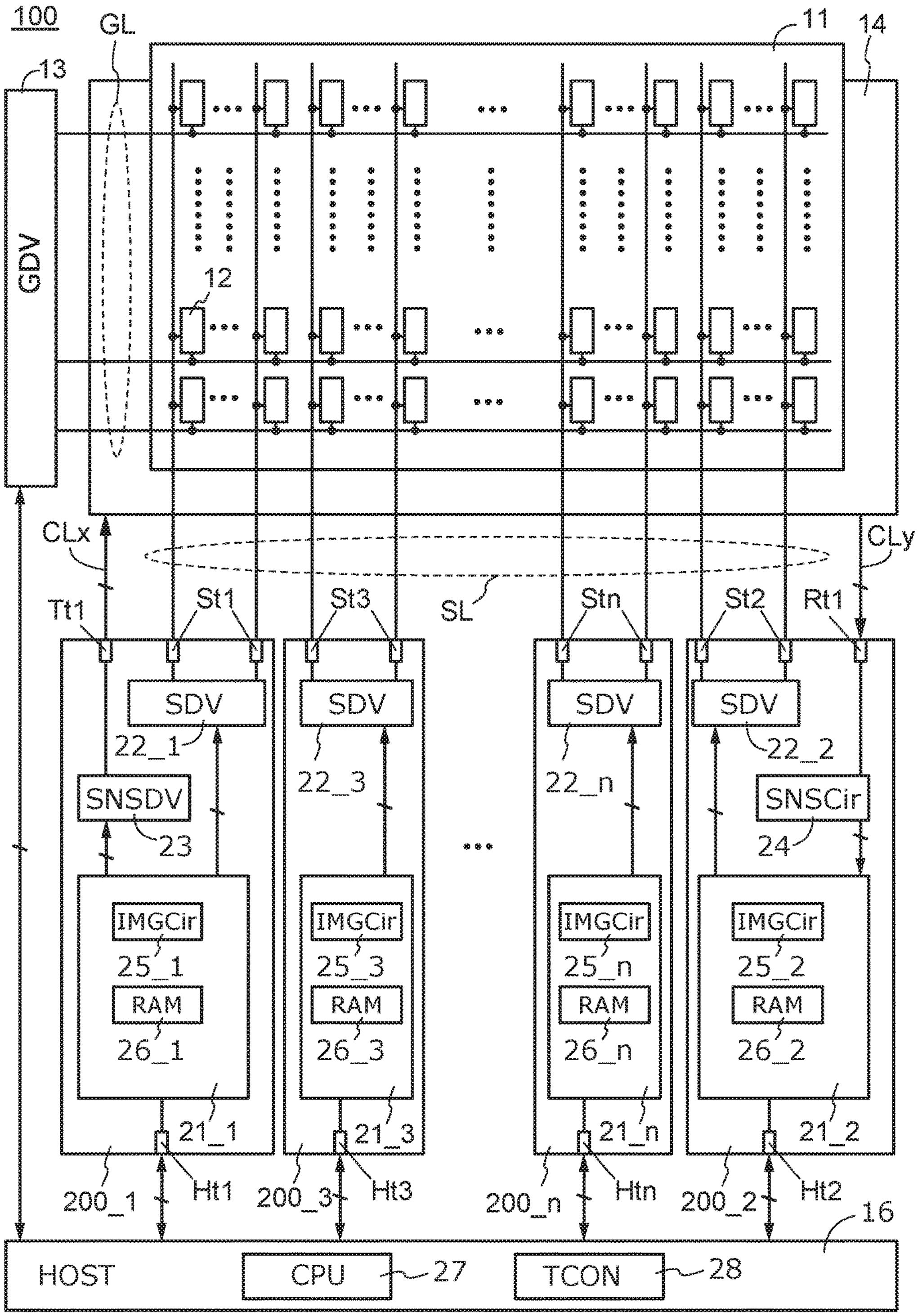
FIG. 11 is a circuit block diagram illustrating a configuration example of a display device.

The display device 100 in FIG. 8 may include two or more ICs. FIG. 11 illustrates a circuit block diagram of that case. The display device 100 in FIG. 11 includes ICs 200_3 to **200_*n* (n is an integer of 3 or more) in addition to the ICs 200_1 and 200_2. The IC 200_3 includes the signal line driver circuit 22_3 and the circuit 21_3. The circuit 21_3 includes the image processing circuit 25_3 and the RAM 26_3. Similarly, the IC 200_*n* includes the signal line driver circuit 22_*n* and the circuit 21_*n*. The circuit 21_*n* includes the image processing circuit 25_*n* and the RAM 26_*n***.

When the display portion 11 includes a large number of pixels, the number of signal lines SL is increased, so that all of the signal lines SL are difficult to provide in two ICs in some cases. In that case, three or more ICs are preferably provided as illustrated in FIG. 11.

«Arrangement Example of IC 200»

Figure 12A:
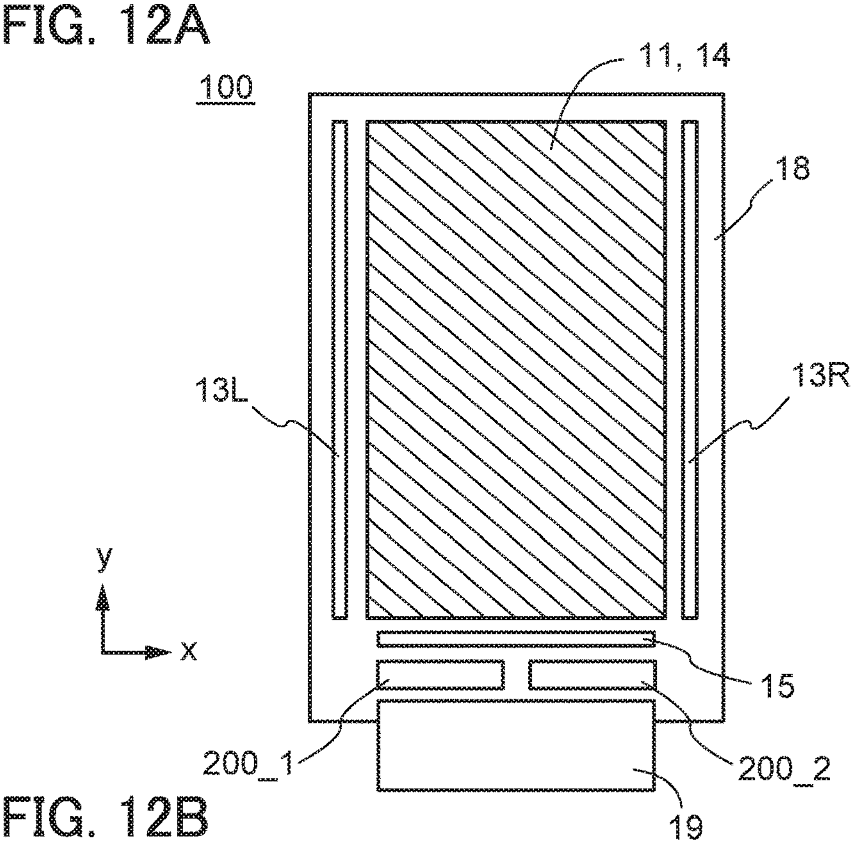
FIGS. 12A and 12B are schematic views each illustrating a structure example of a display device.

FIG. 12A is a schematic view of the display device 100 and illustrates positional relationships of the display portion 11, the touch sensor 14, and peripheral circuits. In schematic views in FIGS. 12A and 12B, the display portion 11, the touch sensor 14, the scan line driver circuit 13L, the scan line driver circuit 13R, the demultiplexer 15, the FPC 19, the IC 200_1, and the IC 200_2 are provided over the substrate 18. The ICs 200_1 and 200_2 are connected to the host 16 through the FPC 19. The touch sensor 14 may be formed in the same position as the display portion 11 over the substrate 18 as illustrated in FIGS. 12A and 12B, and may be formed over a substrate different from the substrate 18.

The IC 200 may be provided by a COF method, a TCP method, or the like. FIG. 12B illustrates an example where the ICs 200_1 and 200_2 are provided over the FPC 19. The area of the substrate 18 can be reduced by providing the IC 200 over the FPC 19, so that the display device 100 can be downsized.

Figure 12B:
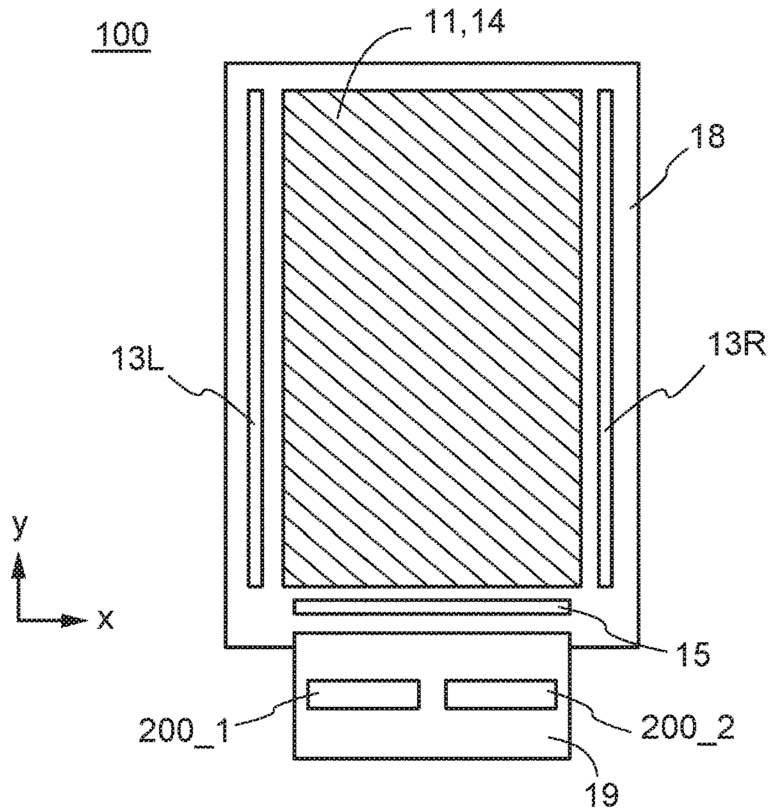

Although FIGS. 12A and 12B each illustrate an example with two ICs, one embodiment of the present invention is not limited thereto. The display device 10 can include three or more ICs as illustrated in FIG. 11. FIGS. 12A and 12B each illustrate an example where two ICs are connected to an FPC; however, one embodiment of the present invention is no limited thereto. Respective FPCs may be provided for ICs.

FIGS. 13A to 13D are schematic views illustrating arrangement examples of terminals of the ICs 200_1 and 200_2 when the ICs 200_1 and 200_2 are mounted over the substrate 18. FIGS. 13A to 13D illustrate arrangement examples of the terminals on bottom surfaces of the ICs 200_1 and 200_2. Note that the bottom surface refers to a surface of an IC which faces the substrate 18. The IC 200_1 includes the terminal St1, the terminal Tt1, and the terminal Ht1. The IC 200_2 includes the terminal St2, the terminal Rt1, and the terminal Ht2.

As illustrated in FIG. 8, the IC 200_1 is electrically connected to the signal line SL via the terminal St1, to the host 16 via the terminal Ht1, and to the wiring CLx via the terminal Tt1. The IC 200_2 is electrically connected to the signal line SL via the terminal St2, to the host 16 via the terminal Ht2, and to the wiring CLy via the terminal Rt1.

In FIGS. 13A to 13D, the bottom surface of each of the IC 200_1 and 200_2 has a first side and a second side opposite to the first side.

Figure 13A:
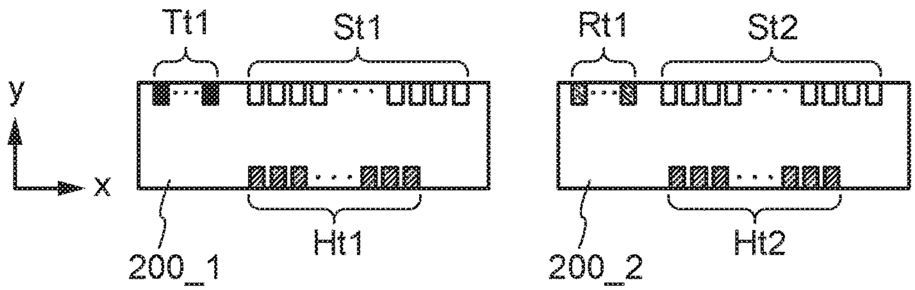
FIGS. 13A to 13D are schematic views each illustrating an example of an arrangement of terminals of an IC.

In FIG. 13A, the IC 200_1 includes the terminal Tt1 and the terminal St1 on the first side and the terminal Ht1 on the second side. The IC 200_2 includes the terminal Rt1 and the terminal St2 on the first side and the terminal Ht2 on the second side.

Figure 13B:
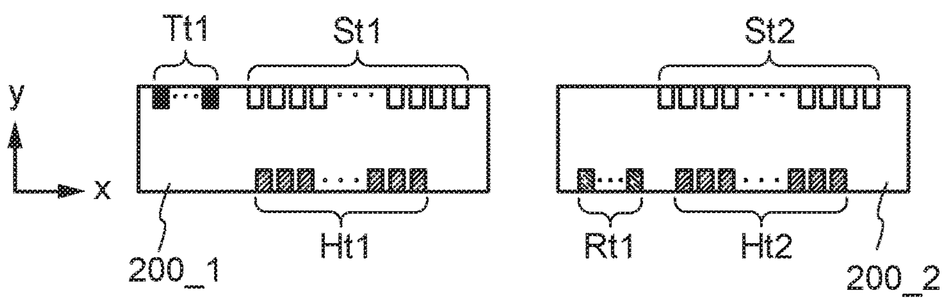

In FIG. 13B, the IC 200_1 includes the terminal Tt1 and the terminal St1 on the first side and the terminal Ht1 on the second side. The IC 200_2 includes the terminal St2 on the first side and the terminal Rt1 and the terminal Ht2 on the second side.

Figure 13C:
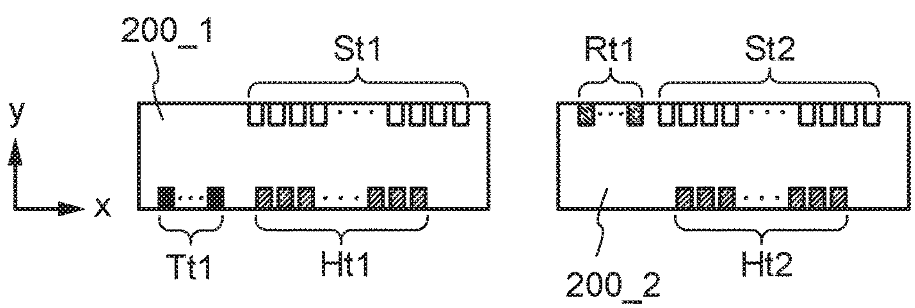

In FIG. 13C, the IC 200_1 includes the terminal St1 on the first side and the terminal Tt1 and the terminal Ht1 on the second side. The IC 200_2 includes the terminal Rt1 and the terminal St2 on the first side and the terminal Ht2 on the second side.

Figure 13D:
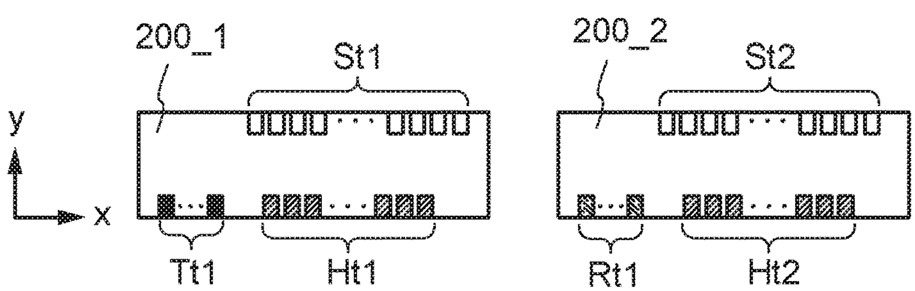

In FIG. 13D, the IC 200_1 includes the terminal St1 on the first side and the terminal Tt1 and the terminal Ht1 on the second side. The IC 200_2 includes the terminal St2 on the first side and the terminal Rt1 and the terminal Ht2 on the second side.

An analog signal output from the touch sensor 14 is input to the touch sensor detection circuit 24 through the wiring CLy and the terminal Rt1. To detect an analog signal by the touch sensor detection circuit 24 accurately, the wiring CLy, the terminal Rt1, and the touch sensor detection circuit 24 need to be apart from a noise generation source. Meanwhile, the signal line SL includes much noise because of its large parasitic capacitance. Therefore, the terminals St1 and St2 electrically connected to the signal lines SL possibly become a noise generation source. The wiring CLx also includes much noise because of its large parasitic capacitance. Therefore, the terminal Tt1 connected to the wiring CLx also possibly becomes a noise generation source.

The structures illustrated in FIGS. 13A to 13D are preferable because the terminal Rt1 and the terminal Tt1 are provided in respective ICs to be apart from each other. In each of the structures of FIGS. 13A to 13D, the terminal Rt1 is less likely to be affected by noise and thus, the display device 100 can perform sensing with higher accuracy.

The structures illustrated in FIGS. 13B and 13D are preferable because the terminal Rt1 and the terminal St2 are apart from each other. In each of the structures illustrated in FIGS. 13B and 13D, the terminal Rt1 is less likely to be affected by noise and thus, the display device 100 can perform sensing with higher accuracy.

The structures illustrated in FIGS. 12A and 12B and FIGS. 13A to 13D can be applied to the display device 100 in FIG. 10. In this case, the terminal Gt1 in the IC 200_1 and the terminal Gt2 in the IC 200_2 which are electrically connected to the wirings GDL are provided in appropriate positions. In particular, the terminal Gt2 may be provided between the terminal St2 and the terminal Rt1. In the above structures, the terminal Rt1 is away from the terminal St2 and thus less likely to be affected by noise, so that the display device 100 can perform sensing with higher accuracy.

With the display device in this embodiment, a display device with a touch sensor which has pixels of 4K, 8K, or more and in which a driver circuit of a display portion and a driver circuit of a touch sensor are included in one IC can be provided. Furthermore, a display device including a high accuracy touch sensor can be provided.

(Embodiment 3)

In this embodiment, sensing methods applicable to the display devices described in the above embodiments will be described.

«Sensing Method»

FIGS. 14A to 14D, FIGS. 15A and 15B, FIGS. 16A to 16C, FIGS. 17A to 17D, FIGS. 18A and 18B, FIGS. 19A to 19C, FIGS. 20A and 20B, and FIGS. 21A and 21B are schematic cross-sectional views each illustrating a sensing method of the display device 10 or the display device 100 and illustrate structure examples where the touch sensor 14 is a mutual capacitive touch sensor. FIGS. 14A to 14D, FIGS. 15A and 15B, and FIGS. 16A to 16C each illustrate an example where a liquid crystal element is used as the display element in the pixel 12, and FIGS. 17A to 17D, FIGS. 18A and 18B, FIGS. 19A to 19C, FIGS. 20A and 20B, and FIGS. 21A and 21B each illustrate an example where an EL element is used as the display element in the pixel 12. Since FIGS. 14A to 14D, FIGS. 15A and 15B, FIGS. 16A to 16C, FIGS. 17A to 17D, FIGS. 18A and 18B, FIGS. 19A to 19C, FIGS. 20A and 20B, and FIGS. 21A and 21B are schematic views, some components are not illustrated to simplify the description.

<Liquid Crystal Element>

Figure 14A:
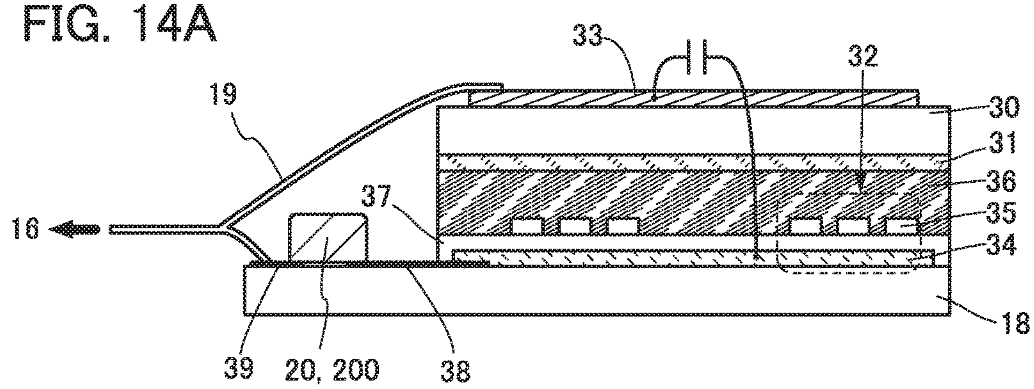
FIGS. 14A to 14D are schematic cross-sectional views each illustrating a sensing method of a display device.

The display device in FIG. 14A includes the substrate 18, a substrate 30, the FPC 19, the IC 20 (or the IC 200), a liquid crystal element 32, a coloring film 31, a conductive film 33, a conductive film 38, a conductive film 39, and the like. The liquid crystal element 32 includes a conductive film 34, a conductive film 35, and a liquid crystal 36. In the example illustrated here, a liquid crystal element using a fringe field switching (FFS) mode is used as the liquid crystal element 32. The conductive film 35 is positioned over the conductive film 34 with an insulating film 37 provided therebetween. For example, the conductive film 35 has a comb-like top surface shape or a top surface shape provided with a slit (a top surface shape is also referred to as a planar shape). One of the conductive films 34 and 35 functions as a common electrode, and the other functions as a pixel electrode.

Although not illustrated, a transistor such as a thin film transistor (TFT) is preferably provided between the substrate 18 and the conductive film 34.

The touch sensor can conduct detection using capacitance formed between the conductive film 33 provided on the substrate 30 side and the conductive film 34 serving as one of a pair of electrodes of the liquid crystal element 32. In other words, the conductive film 33 functions as one of the wiring CLx and the wiring CLy and the conductive film 34 functions as the other of the wiring CLx and the wiring CLy. With such a structure, the one electrode of the liquid crystal element 32 can also serve as an electrode of the touch sensor. Consequently, the process can be simplified and the manufacturing cost can be reduced.

The conductive film 33 is electrically connected to the IC 20 (or the IC 200) through the FPC 19. The conductive film 34 is electrically connected to the IC 20 (or the IC 200) through the conductive film 38. The IC 20 (or the IC 200) is electrically connected to the host 16 through the conductive film 39 and the FPC 19. Note that the conductive film 38 and the conductive film 39 may be formed through the same step as the conductive film 34.

Figure 14B:
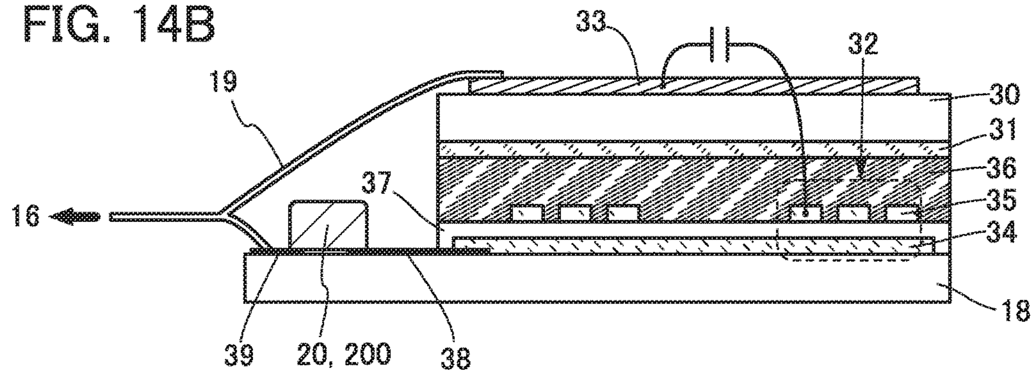

In the display device in FIG. 14A, the touch sensor may be formed using capacitance formed between the conductive film 33 and the conductive film 35. In other words, the conductive film 33 functions as one of the wiring CLx and the wiring CLy, and the conductive film 35 functions as the other of the wiring CLx and the wiring CLy. FIG. 14B shows an example of that case. In FIG. 14B, the conductive film 33 is electrically connected to the IC 20 (or the IC 200) through the FPC 19. The conductive film 35 is electrically connected to the IC 20 (or the IC 200) through a conductive film (not illustrated) formed over the substrate 18.

The IC 20 in each of FIGS. 14A and 14B can have arrangements of the terminals illustrated in FIGS. 5A to 5C, FIGS. 6A to 6D, and FIGS. 7A to 7C. In particular, the structure where the terminal Rt1 is positioned on the side opposite to the terminal Tt1 as illustrated in each of FIGS. 6A to 6D is preferable.

The IC 200 in each of FIGS. 14A and 14B can have arrangements of the terminals in FIGS. 13A to 13D. In particular, the arrangements illustrated in FIGS. 13B and 13C are preferable.

Figure 14C:
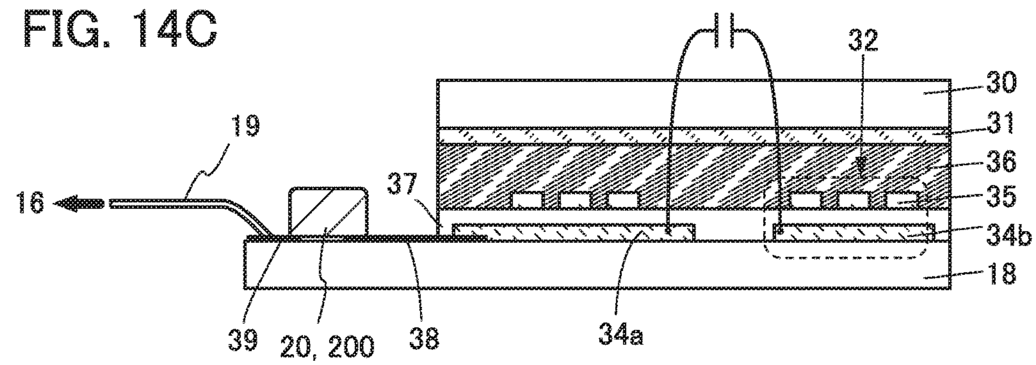

The display device in FIG. 14C is an example where the conductive film 33 is removed from the structure illustrated in FIG. 14A and the touch sensor is formed using capacitance formed between a pair of wirings of the conductive film 34 (a conductive film 34*a* and a conductive film 34*b*). In other words, the conductive film 34*a* functions as one of the wiring CLx and the wiring CLy and the conductive film 34*b* functions as the other of the wiring CLx and the wiring CLy. With such a structure, the process can be simpler than that of the structure illustrated in FIG. 14A. The conductive film 34*a* is electrically connected to the IC 20 (or the IC 200) through the conductive film 38 and the conductive film 34*b* is electrically connected to the IC 20 (or the IC 200) through a conductive film (not illustrated) formed over the substrate 18.

Figure 14D:
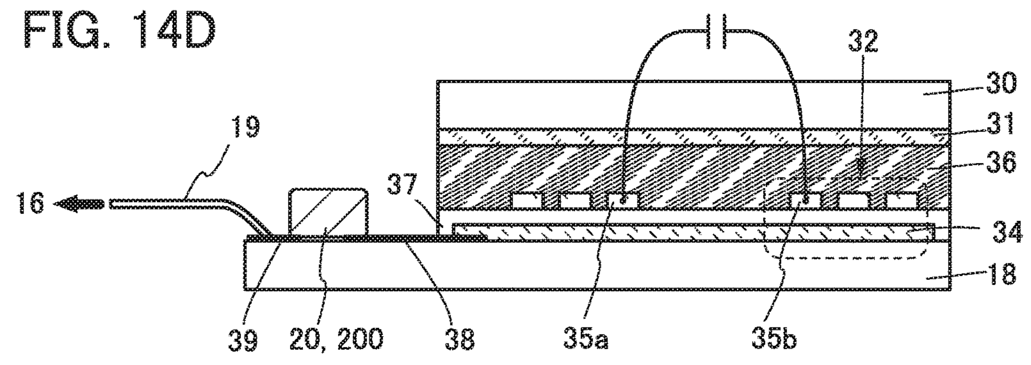

In the display device in FIG. 14C, the touch sensor may be formed using capacitance formed between a pair of wirings (a conductive film 35*a* and a conductive film 35*b*) of the conductive film 35. In other words, the conductive film 35*a* functions as one of the wiring CLx and the wiring CLy and the conductive film 35*b* functions as the other of the wiring CLx and the wiring CLy. FIG. 14D shows an example of that case. In FIG. 14D, the conductive film 35*a* and the conductive film 35*b* are electrically connected to the IC 20 (or the IC 200) through a conductive film (not illustrated) formed over the substrate 18.

The IC 20 in each of FIGS. 14C and 14D can have the arrangements of the terminals illustrated in FIGS. 5A to 5C, FIGS. 6A to 6D, and FIGS. 7A to 7C. In particular, the structure where the terminal St1, the terminal Rt1, and the terminal Tt1 are positioned on the same side as illustrated in each of FIGS. 5A to 5C is preferable.

The IC 200 in each of FIGS. 14C and 14D can have the arrangements of the terminals in FIGS. 13A to 13D. In particular, the arrangement illustrated in FIG. 13A is preferable.

Figure 15A:
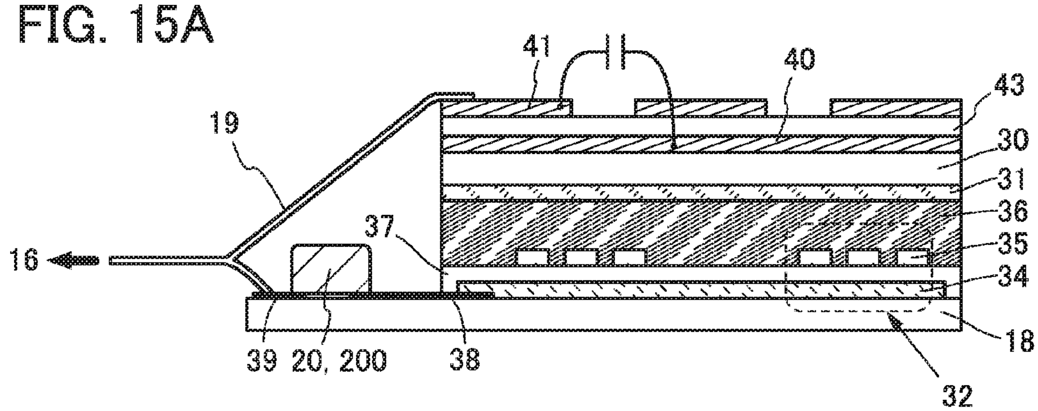
FIGS. 15A and 15B are schematic cross-sectional views each illustrating a sensing method of a display device.

The display device in FIG. 15A is an example where instead of the conductive film 33, a conductive film 40, a conductive film 41, and an insulating film 43 are formed over the substrate 30 in the structure illustrated in FIG. 14A and the touch sensor is formed using capacitance formed between the conductive film 41 and the conductive film 40. In other words, the conductive film 41 functions as one of the wiring CLx and the wiring CLy and the conductive film 40 functions as the other of the wiring CLx and the wiring CLy. In FIG. 15A, the conductive film 41 and the conductive film 40 are electrically connected to the IC 20 (or the IC 200) through the FPC 19.

Figure 15B:
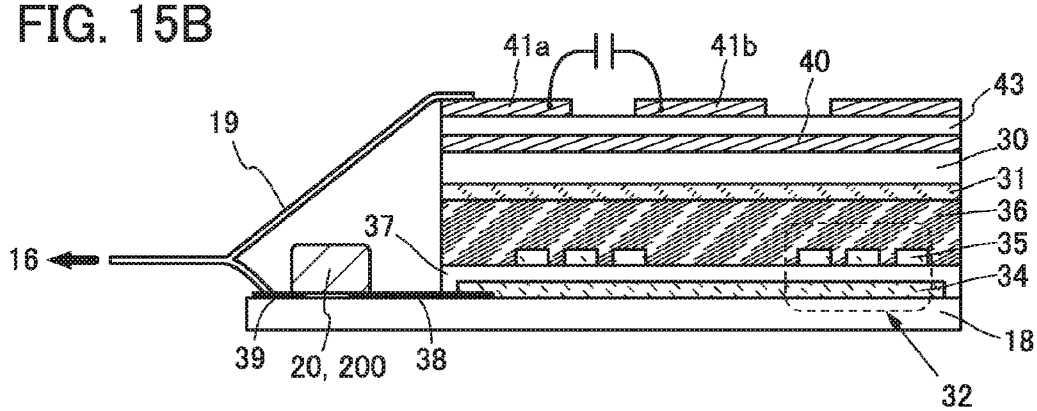

In the display device in FIG. 15A, the touch sensor may be formed using capacitance formed between a pair of wirings (a conductive film 41*a* and a conductive film 41*b*) of the conductive film 41. In other words, the conductive film 41*a* functions as one of the wiring CLx and the wiring CLy and the conductive film 41*b* functions as the other of the wiring CLx and the wiring CLy. FIG. 15B shows an example of that case. In FIG. 15B, the conductive film 41*a* and the conductive film 41*b* are electrically connected to the IC 20 (or the IC 200) through the FPC 19.

The IC 20 in each of FIGS. 15A and 15B can have the arrangements of the terminals illustrated in FIGS. 5A to 5C, FIGS. 6A to 6D, and FIGS. 7A to 7C. In particular, the structure where the terminal Ht1, the terminal Rt1, and the terminal Tt1 are positioned on the same side as illustrated in each of FIGS. 7A to 7C is preferable.

The IC 200 in each of FIGS. 15A and 15B can have the arrangements of the terminals illustrated in FIGS. 13A to 13D. In particular, the arrangement illustrated in FIG. 13D is preferable.

In the sensing methods illustrated in FIGS. 14A to 14D, the electrodes of the touch sensor are formed over the substrate 18, which leads to a decrease in yield in steps of forming a TFT over the substrate 18. In the structure illustrated in each of FIGS. 15A and 15B, the touch sensor is formed in a step different from that of the TFT because the touch sensor is formed over the substrate 30. Thus, with each of the structures illustrated in FIGS. 15A and 15B, a display device can be manufactured at a high yield without affecting the TFT process.

Figure 16A:
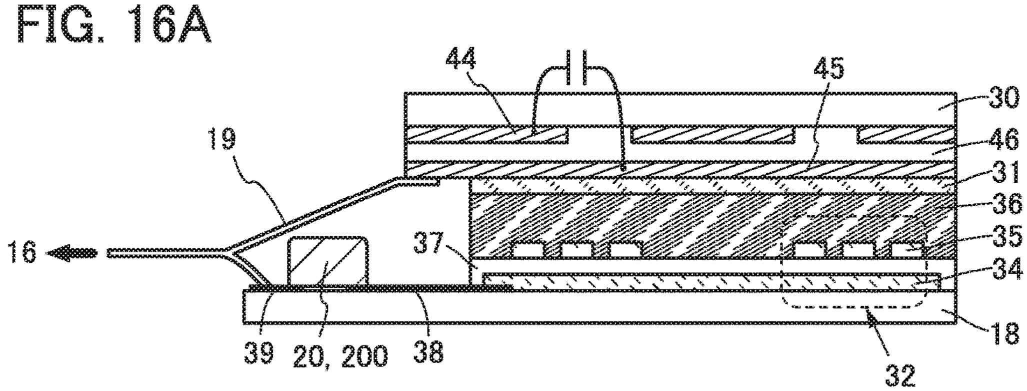
FIGS. 16A to 16C are schematic cross-sectional views each illustrating a sensing method of a display device.

The display device illustrated in FIG. 16A is an example where the conductive film 33 is removed from the structure illustrated in FIG. 14A, a conductive film 44, a conductive film 45, and an insulating film 46 are formed between the substrate 30 and the coloring film 31, and the touch sensor is formed using capacitance formed between the conductive film 44 and the conductive film 45. In other words, the conductive film 44 functions as one of the wiring CLx and the wiring CLy and the conductive film 45 functions as the other of the wiring CLx and the wiring CLy. In FIG. 16A, the conductive film 44 and the conductive film 45 are electrically connected to the IC 20 (or the IC 200) through the FPC 19.

Figure 16B:
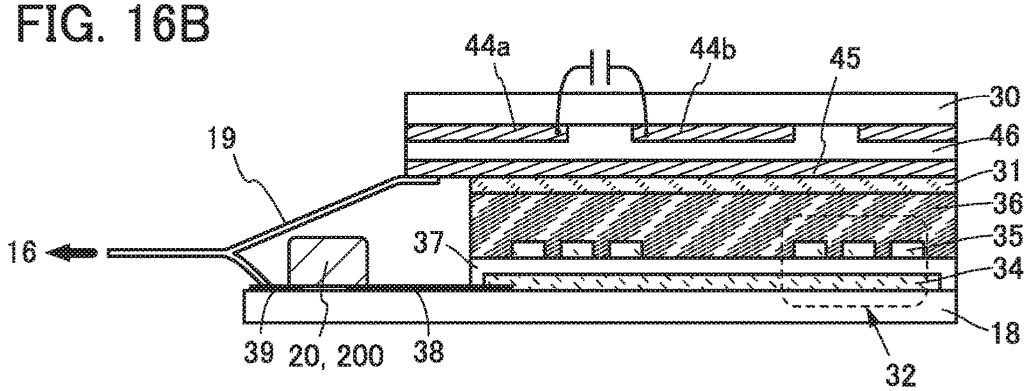

In the display device in FIG. 16A, the touch sensor may be formed using capacitance formed between a pair of wirings (a conductive film 44*a* and a conductive film 44*b*) of the conductive film 44. In other words, the conductive film 44*a* functions as one of the wiring CLx and the wiring CLy and the conductive film 44*b* functions as the other of the wiring CLx and the wiring CLy. FIG. 16B shows an example of that case. In FIG. 16B, the conductive film 44*a* and the conductive film 44*b* are electrically connected to the IC 20 (or the IC 200) through the FPC 19.

Figure 16C:
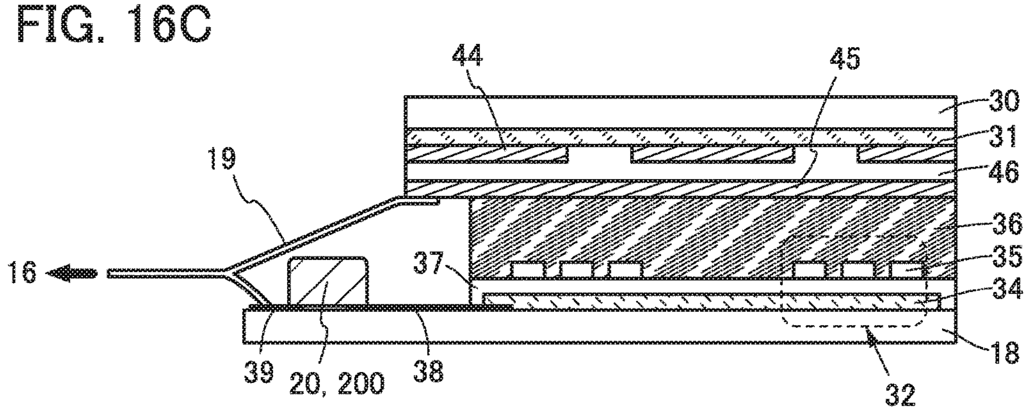

In the display device in each of FIGS. 16A and 16B, the coloring film 31 may be provided between the substrate 30 and the conductive film 44. FIG. 16C illustrates a structure example of that case. The sensing method in that case is the same as those in FIGS. 16A and 16B.

The IC 20 in each of FIGS. 16A to 16C can have the arrangements of the terminals illustrated in FIGS. 5A to 5C, FIGS. 6A to 6D, and FIGS. 7A to 7C. In particular, the structure where the terminal Ht1, the terminal Rt1, and the terminal Tt1 are positioned on the same side as illustrated in each of FIGS. 7A to 7C is preferable.

The IC 200 in each of FIGS. 16A to 16C can have the arrangements of the terminals illustrated in FIGS. 13A to 13D. In particular, the arrangement illustrated in FIG. 13D is preferable.

The touch sensor is formed over the substrate 30 in the structure illustrated in each of FIGS. 16A to 16C, as in the structure illustrated in FIGS. 15A and 15B. Therefore, a display device can be manufactured at a high yield without complicating the TFT process.

Next, FIGS. 17A to 17D, FIGS. 18A and 18B, FIGS. 19A to 19C, FIGS. 20A and 20B, and FIGS. 21A and 21B each illustrate an example where an EL element is used as the display element in the pixel 12.

<Top-Emission EL Element>

Figure 17A:
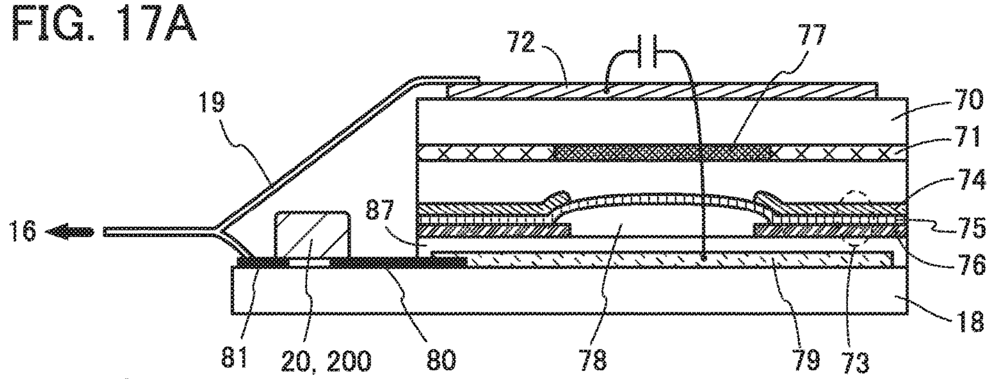
FIGS. 17A to 17D are schematic cross-sectional views each illustrating a sensing method of a display device.

The display device illustrated in FIG. 17A includes the substrate 18, the substrate 70, the FPC 19, the IC 20 (or the IC 200), an EL element 73, an insulating film 78, an insulating film 87, a conductive film 72, a conductive film 79, a conductive film 80, a conductive film 81, a coloring film 71, a light-blocking film 77, and the like. Although not illustrated, a transistor such as a TFT is preferably provided between the substrate 18 and the EL element 73. Furthermore, the conductive film 79 preferably has a function of a gate electrode, a source electrode, or a drain electrode of a transistor.

The EL element 73 includes a conductive film 74, an EL layer 75, and a conductive film 76. The conductive film 74 functions as one of an anode and a cathode of the EL element 73, and the conductive film 76 functions as the other of the anode and the cathode of the EL element 73. The conductive film 76 functions as a reflective film, and the conductive film 74 has a function of transmitting visible light. When the EL layer 75 includes a light-emitting layer and voltage is applied between the conductive film 74 and the conductive film 76, current flows through the EL layer 75, so that the light-emitting layer in the EL layer 75 emits light. The light emitted from the EL layer 75 is extracted to the outside of the display device through the coloring film 71 and the substrate 70. The display device illustrated in FIG. 17A includes a so-called top-emission display device. The EL layer 75 formed over the insulating film 78 does not emit light because current does not flow through the EL layer 75. The light-blocking film 77 may be provided between the insulating film 78 and the substrate 70. By providing the light-blocking film 77, the visibility of the display device can be improved.

The touch sensor can perform sensing by utilizing capacitance formed between the conductive film 79 and the conductive film 72 on the substrate 70 side. In other words, the conductive film 72 functions as one of the wiring CLx and the wiring CLy and the conductive film 79 functions as the other of the wiring CLx and the wiring CLy. Thus, the conductive film functioning as the electrode of the transistor also serves as the electrode of the touch sensor, which can lead to a simple process and low manufacturing cost.

As illustrated in FIG. 17A, the conductive film 74 over the insulating film 78 is preferably removed. This is because when the conductive film 74 exists over the insulating film 78, the conductive film 74 blocks an electric flux line formed between the conductive film 72 and the conductive film 79 and thus impairs the function of the touch sensor.

The conductive film 79 is electrically connected to the IC 20 (or the IC 200) through the conductive film 80. The conductive film 72 is electrically connected to the IC 20 (or the IC 200) through the FPC 19. The IC 20 (or the IC 200) is electrically connected to the host 16 through the conductive film 81 and the FPC 19. Note that the conductive film 80 and the conductive film 81 may be formed through the same step as the conductive film 79.

Figure 17B:
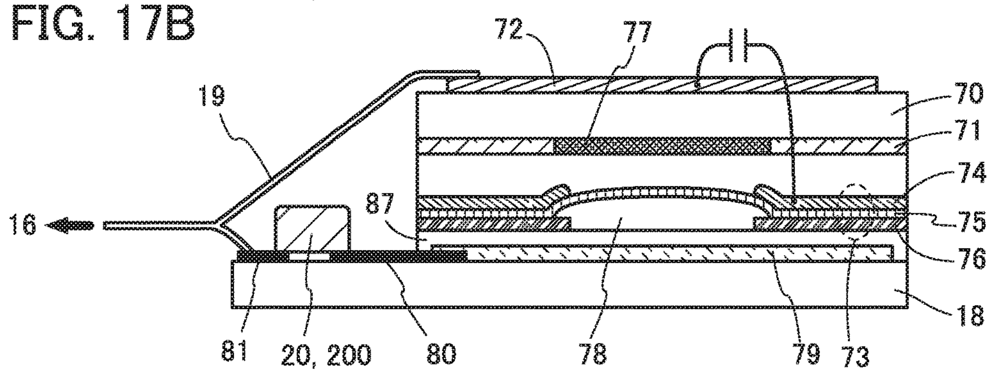

In the display device in FIG. 17A, the touch sensor may be formed using capacitance formed between the conductive film 72 and the conductive film 74. FIG. 17B shows an example of that case. In FIG. 17B, the conductive film 72 functions as one of the wiring CLx and the wiring CLy, and the conductive film 74 functions as the other of the wiring CLx and the wiring CLy. The conductive film 72 is electrically connected to the IC 20 (or the IC 200) through the FPC 19. The conductive film 74 is electrically connected to the IC 20 (or the IC 200) through a conductive film (not illustrated) formed over the substrate 18.

The IC 20 in each of FIGS. 17A and 17B can have the arrangements of the terminals illustrated in FIGS. 5A to 5C, FIGS. 6A to 6D, and FIGS. 7A to 7C. In particular, the structure where the terminal Rt1 is positioned on the side opposite to the terminal Tt1 as illustrated in each of FIGS. 6A to 6D is preferable.

The IC 200 in each of FIGS. 17A and 17B can have the arrangements of the terminals in FIGS. 13A to 13D. In particular, the arrangements illustrated in FIGS. 13B and 13C are preferable.

Figure 17C:
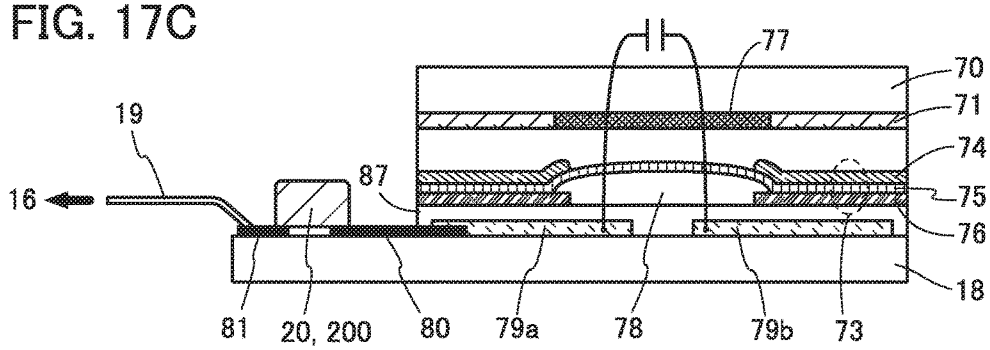

The display device in FIG. 17C is an example where the conductive film 72 is removed from the structure illustrated in FIG. 17A and the touch sensor is formed using capacitance formed between a pair of wirings of the conductive film 79 (a conductive film 79*a* and a conductive film 79*b*). In other words, the conductive film 79*a* functions as one of the wiring CLx and the wiring CLy and the conductive film 79*b* functions as the other of the wiring CLx and the wiring CLy. The conductive film 79*a* is electrically connected to the IC 20 (or the IC 200) through the conductive film 80 and the conductive film 79*b* is electrically connected to the IC 20 (or the IC 200) through a conductive film (not illustrated) formed over the substrate 18. With such a structure, the process can be simpler than that of the structure illustrated in FIG. 17A.

Figure 17D:
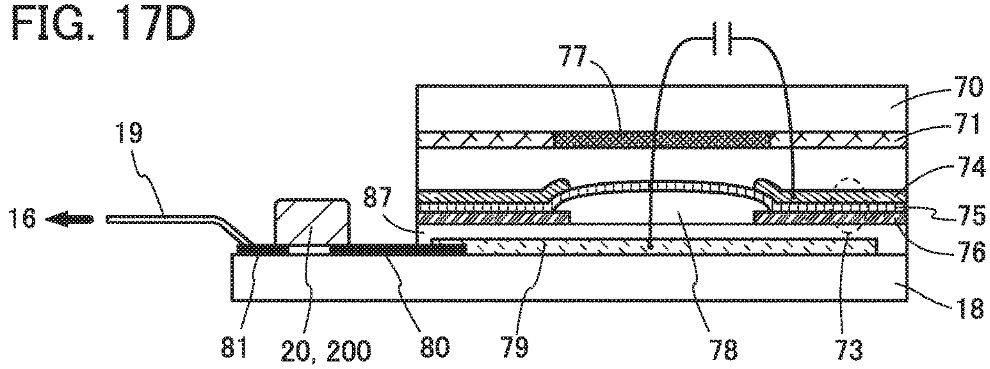

The display device in FIG. 17D is an example where the conductive film 72 is removed from the structure illustrated in FIG. 17A and the touch sensor is formed using capacitance formed between the conductive film 74 and the conductive film 79. In other words, the conductive film 74 functions as one of the wiring CLx and the wiring CLy and the conductive film 79 functions as the other of the wiring CLx and the wiring CLy. The conductive film 79 is electrically connected to the IC 20 (or the IC 200) through the conductive film 80 and the conductive film 74 is electrically connected to the IC 20 (or the IC 200) through a conductive film (not illustrated) formed over the substrate 18. With such a structure, the process can be simpler than that of the structure illustrated in FIG. 17A.

The IC 20 in each of FIGS. 17C and 17D can have the arrangements of the terminals illustrated in FIGS. 5A to 5C, FIGS. 6A to 6D, and FIGS. 7A to 7C. In particular, the structure where the terminal St1, the terminal Rt1, and the terminal Tt1 are positioned on the same side as illustrated in each of FIGS. 5A to 5C is preferable.

The IC 200 in each of FIGS. 17C and 17D can have the arrangements of the terminals in FIGS. 13A to 13D. In particular, the arrangement illustrated in FIG. 13A is preferable.

Figure 18A:
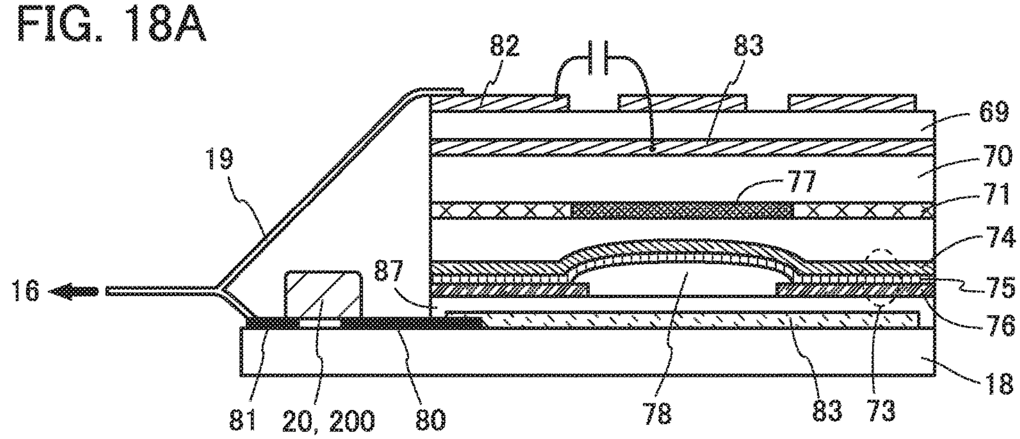
FIGS. 18A and 18B are schematic cross-sectional views each illustrating a sensing method of a display device.

The display device in FIG. 18A is an example where instead of the conductive film 72, a conductive film 82, a conductive film 83, and an insulating film 69 are formed over the substrate 70 in the structure illustrated in FIG. 17A. The touch sensor is formed using capacitance formed between the conductive film 82 and the conductive film 83. In other words, the conductive film 82 functions as one of the wiring CLx and the wiring CLy and the conductive film 83 functions as the other of the wiring CLx and the wiring CLy. The conductive film 82 and the conductive film 83 are electrically connected to the IC 20 (or the IC 200) through the FPC 19.

Figure 18B:
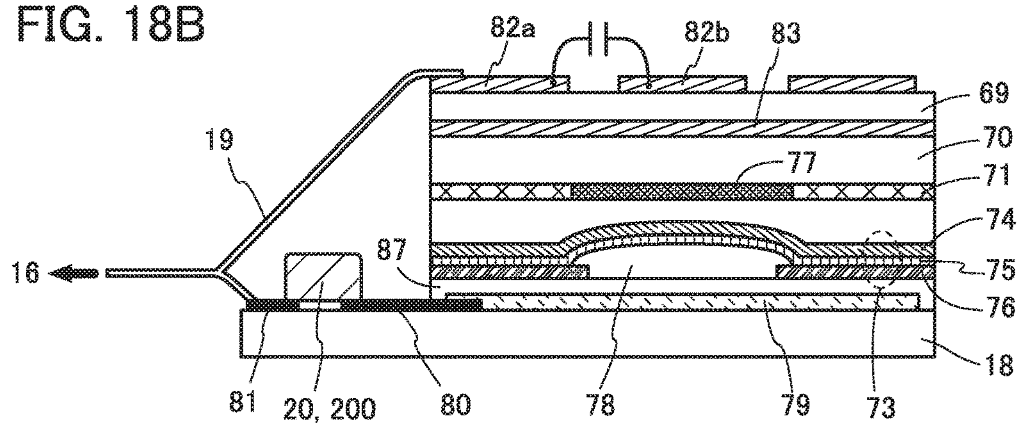

In the display device in FIG. 18A, the touch sensor may be formed using capacitance formed between a pair of wirings (a conductive film 82*a* and a conductive film 82*b*) of the conductive film 82. In other words, the conductive film 82*a* functions as one of the wiring CLx and the wiring CLy and the conductive film 82*b* functions as the other of the wiring CLx and the wiring CLy. FIG. 18B shows an example of that case. In FIG. 18B, the conductive film 82*a* and the conductive film 82*b* are electrically connected to the IC 20 (or the IC 200) through the FPC 19.

The display devices in FIGS. 18A and 18B have structures different from the structures illustrated in FIGS. 17A to 17D in that the conductive film 74 does not block an electric flux line of the touch sensor; thus, the conductive film 74 over the insulating film 78 does not need to be removed.

In the display devices illustrated in FIGS. 18A and 18B, a TFT and a touch sensor are formed in separate steps so that the TFT is formed over the substrate 18 and the touch sensor is formed over the substrate 70. Thus, with each of the structures illustrated in FIGS. 18A and 18B, a display device can be manufactured at a high yield without complicating the TFT process.

The IC 20 in each of FIGS. 18A and 18B can have the arrangements of the terminals illustrated in FIGS. 5A to 5C, FIGS. 6A to 6D, and FIGS. 7A to 7C. In particular, the structure where the terminal Ht1, the terminal Rt1, and the terminal Tt1 are positioned on the same side as illustrated in each of FIGS. 7A to 7C is preferable.

The IC 200 in each of FIGS. 18A and 18B can have the arrangements of the terminals illustrated in FIGS. 13A to 13D. In particular, the arrangement illustrated in FIG. 13D is preferable.

Figure 19A:
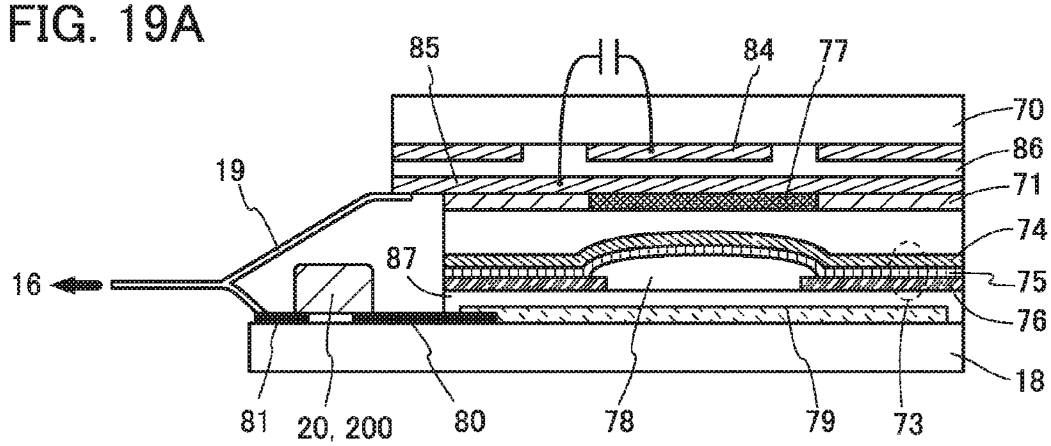
FIGS. 19A to 19C are schematic cross-sectional views each illustrating a sensing method of a display device.
Figure 19B:
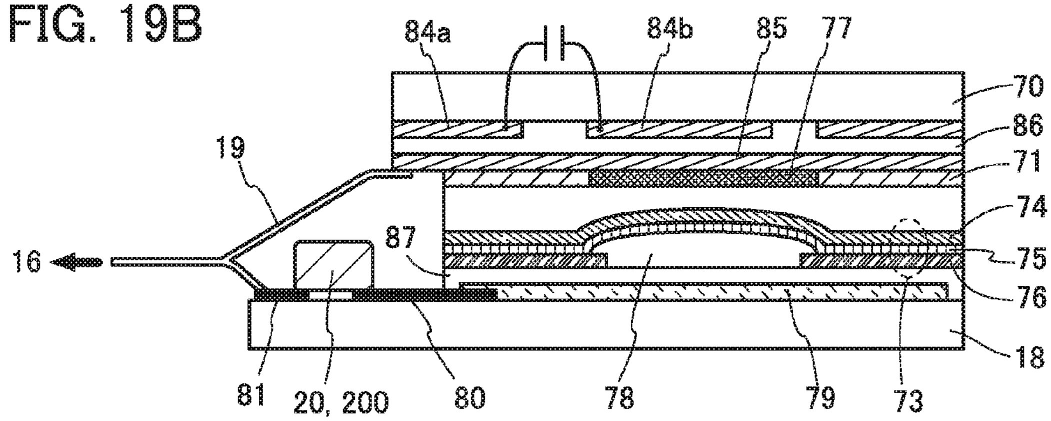
Figure 19C:
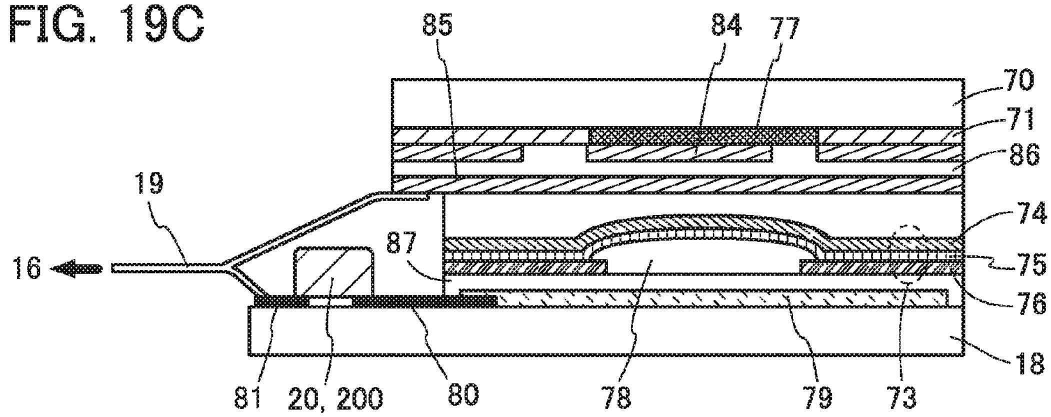

FIGS. 18A and 18B each illustrate the example where the touch sensor is provided outside the substrate 70, and FIGS. 19A to 19C each illustrate an example where the touch sensor is provided between the substrate 70 and the conductive film 74.

In the display device in FIG. 19A, a conductive film 84, a conductive film 85, an insulating film 86, the coloring film 71, and the light-blocking film 77 are formed between the substrate 70 and the conductive film 74, and the touch sensor is formed using capacitance formed between the conductive film 84 and the conductive film 85. In other words, the conductive film 84 functions as one of the wiring CLx and the wiring CLy and the conductive film 85 functions as the other of the wiring CLx and the wiring CLy. The conductive film 85 and the conductive film 84 are electrically connected to the IC 20 (or the IC 200) through the FPC 19.

In the display device in FIG. 19A, the touch sensor may be formed using capacitance formed between a pair of wirings (a conductive film 84*a* and a conductive film 84*b*) of the conductive film 84. In other words, the conductive film 84*a* functions as one of the wiring CLx and the wiring CLy and the conductive film 84*b* functions as the other of the wiring CLx and the wiring CLy. FIG. 19B shows an example of that case. In FIG. 19B, the conductive film 84*a* and the conductive film 84*b* are electrically connected to the IC 20 (or the IC 200) through the FPC 19.

In the display devices in FIGS. 19A and 19B, the coloring film 71 and the light-blocking film 77 are provided between the conductive film 85 and the conductive film 74; however, the coloring film 71 and the light-blocking film 77 may be provided between the conductive film 84 and the substrate 70. FIG. 19C shows an example of that case. The sensing method in FIG. 19C is the same as those in FIGS. 19A and 19B.

In the display devices in FIGS. 19A to 19C, the conductive film 74 does not block an electric flux line of the touch sensor; thus, the conductive film 74 over the insulating film 78 does not need to be removed.

In the display devices illustrated in FIGS. 19A to 19C, a TFT and a touch sensor are formed in separate steps so that the TFT is formed over the substrate 18 and the touch sensor is formed over the substrate 70. Thus, with each of the structures illustrated in FIGS. 19A to 19C, a display device can be manufactured at a high yield without complicating the TFT process.

The IC 20 in each of FIGS. 19A to 19C can have the arrangements of the terminals illustrated in FIGS. 5A to 5C, FIGS. 6A to 6D, and FIGS. 7A to 7C. In particular, the structure where the terminal Ht1, the terminal Rt1, and the terminal Tt1 are positioned on the same side as illustrated in each of FIGS. 7A to 7C is preferable.

The IC 200 in each of FIGS. 19C to 19C can have the arrangements of the terminals in FIGS. 13A to 13D. In particular, the arrangement illustrated in FIG. 13D is preferable.

<Bottom-Emission EL Element>

The display devices illustrated in FIGS. 17A to 17D, FIGS. 18A and 18B, and FIGS. 19A to 19C each have a top-emission type in which light is extracted from the substrate 70 side. In contrast, FIGS. 20A and 20B and FIGS. 21A and 21B each illustrate an example in which light is extracted from the substrate 18 side.

Figure 20A:
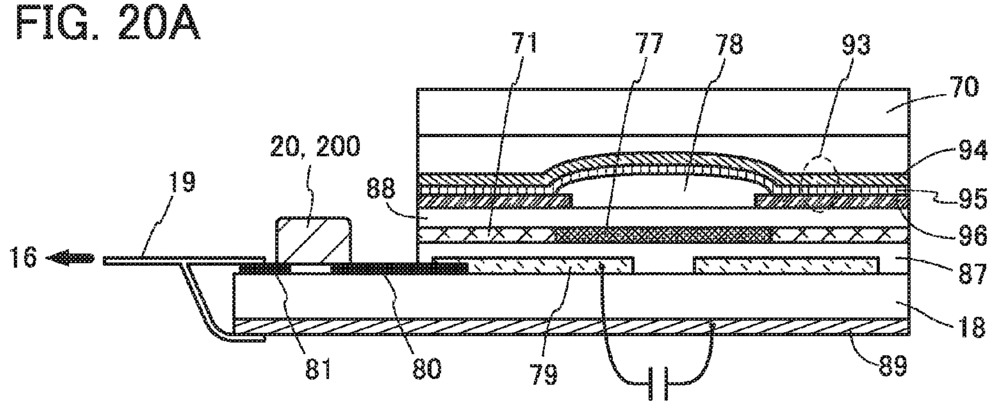
FIGS. 20A and 20B are schematic cross-sectional views each illustrating a sensing method of a display device.

The display device illustrated in FIG. 20A includes the substrate 18, the substrate 70, the FPC 19, the IC 20 (or the IC 200), an EL element 93, the insulating film 78, the insulating film 87, an insulating film 88, a conductive film 89, the conductive film 79, the conductive film 80, the conductive film 81, the coloring film 71, the light-blocking film 77, and the like. Although not illustrated, a transistor such as a TFT is preferably provided between the substrate 18 and the EL element 93. Furthermore, the conductive film 79 preferably has a function of a gate electrode, a source electrode, or a drain electrode of a transistor.

The EL element 93 in FIG. 20A includes a conductive film 94, an EL layer 95, and a conductive film 96. The conductive film 94 functions as one of an anode and a cathode of the EL element 93, and the conductive film 96 functions as the other of the anode and the cathode of the EL element 93. The conductive film 94 functions as a reflective film, and the conductive film 96 has a function of transmitting visible light. When the EL layer 95 includes a light-emitting layer and voltage is applied between the conductive film 94 and the conductive film 96, current flows through the EL layer 95, so that the light-emitting layer in the EL layer 95 emits light. The light emitted from the EL layer 95 is extracted to the outside of the display device through the coloring film 71 and the substrate 18. The EL layer 95 formed over the insulating film 78 does not emit light because current does not flow through the EL layer 95. The light-blocking film 77 is provided between the insulating film 78 and the substrate 18. By providing the light-blocking film 77, the visibility of the display device can be improved.

In the display device in FIG. 20A, the touch sensor can perform sensing by utilizing capacitance formed between the conductive film 89 and the conductive film 79 on the substrate 18 side. In other words, the conductive film 89 functions as one of the wiring CLx and the wiring CLy and the conductive film 79 functions as the other of the wiring CLx and the wiring CLy. Thus, the conductive film functioning as the electrode of the transistor also serves as the electrode of the touch sensor, which can lead to a simple process and low manufacturing cost.

The conductive film 89 is electrically connected to the IC 20 (or the IC 200) through the FPC 19. The conductive film 79 is electrically connected to the IC 20 (or the IC 200) through the conductive film 80. The IC 20 (or the IC 200) is electrically connected to the host 16 through the conductive film 81 and the FPC 19. Note that the conductive film 80 and the conductive film 81 may be formed through the same step as the conductive film 79.

The IC 20 in FIG. 20A can have the arrangements of the terminals illustrated in FIGS. 5A to 5C, FIGS. 6A to 6D, and FIGS. 7A to 7C. In particular, the structure where the terminal Rt1 is positioned on the side opposite to the terminal Tt1 as illustrated in each of FIGS. 6A to 6D is preferable.

The IC 200 in FIG. 20A can have the arrangements of the terminals in FIGS. 13A to 13D. In particular, the arrangements illustrated in FIGS. 13B and 13C are preferable.

Figure 20B:
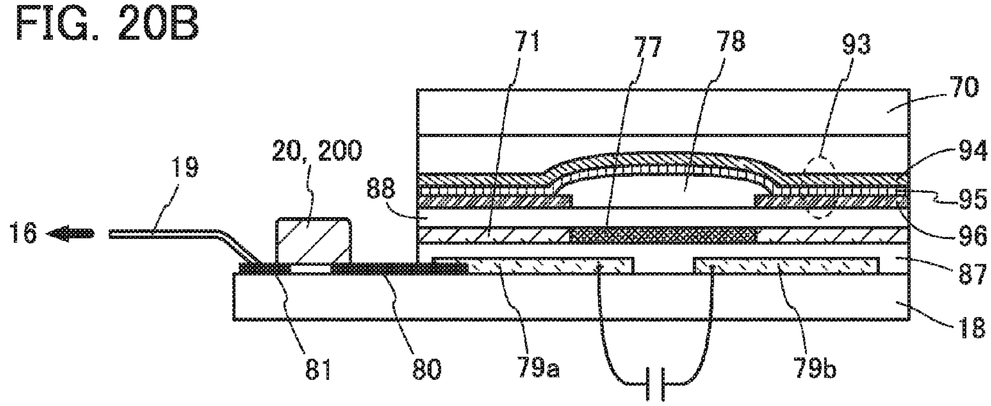

The display device in FIG. 20B is an example where the conductive film 89 is removed from the structure illustrated in FIG. 20A and the touch sensor is formed using capacitance formed between a pair of wirings of the conductive film 79 (the conductive film 79*a* and the conductive film 79*b*). In other words, the conductive film 79*a* functions as one of the wiring CLx and the wiring CLy and the conductive film 79*b* functions as the other of the wiring CLx and the wiring CLy. With such a structure, the process can be simpler than that of the structure illustrated in FIG. 20A. The conductive film 79*a* is electrically connected to the IC 20 (or the IC 200) through the conductive film 80 and the conductive film 79*b* is electrically connected to the IC 20 (or the IC 200) through a conductive film (not illustrated) formed over the substrate 18.

The IC 20 in FIG. 20B can have the arrangements of the terminals illustrated in FIGS. 5A to 5C, FIGS. 6A to 6D, and FIGS. 7A to 7C. In particular, the structure where the terminal St1, the terminal Rt1, and the terminal Tt1 are positioned on the same side as illustrated in each of FIGS. 5A to 5C is preferable.

The IC 200 in FIG. 20B can have the arrangements of the terminals in FIGS. 13A to 13D. In particular, the arrangement illustrated in FIG. 13A is preferable.

Figure 21A:
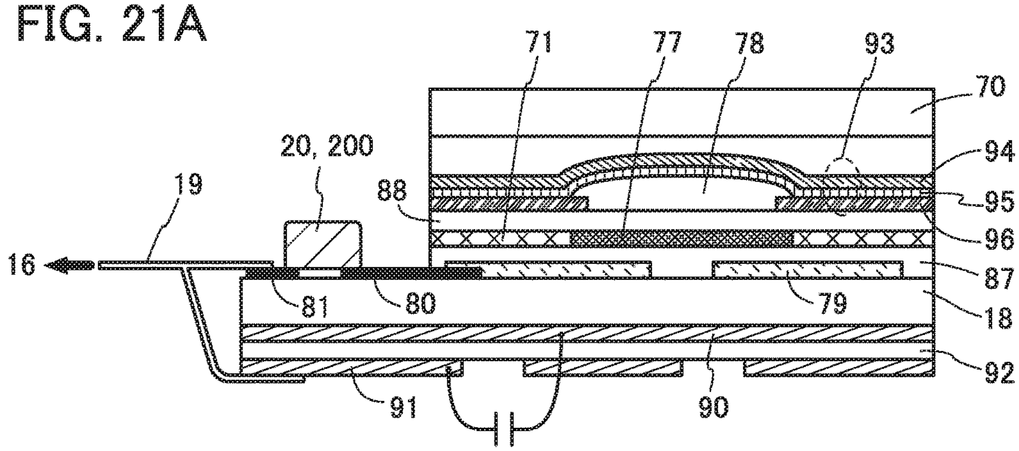
FIGS. 21A and 21B are schematic cross-sectional views each illustrating a sensing method of a display device.

The display device in FIG. 21A is an example where instead of the conductive film 89, a conductive film 90, a conductive film 91, and an insulating film 92 are formed over the substrate 18 in the structure illustrated in FIG. 20A. The touch sensor is formed using capacitance formed between the conductive film 90 and the conductive film 91. In other words, the conductive film 90 functions as one of the wiring CLx and the wiring CLy and the conductive film 91 functions as the other of the wiring CLx and the wiring CLy. The conductive film 90 and the conductive film 91 are electrically connected to the IC 20 (or the IC 200) through the FPC 19.

Figure 21B:
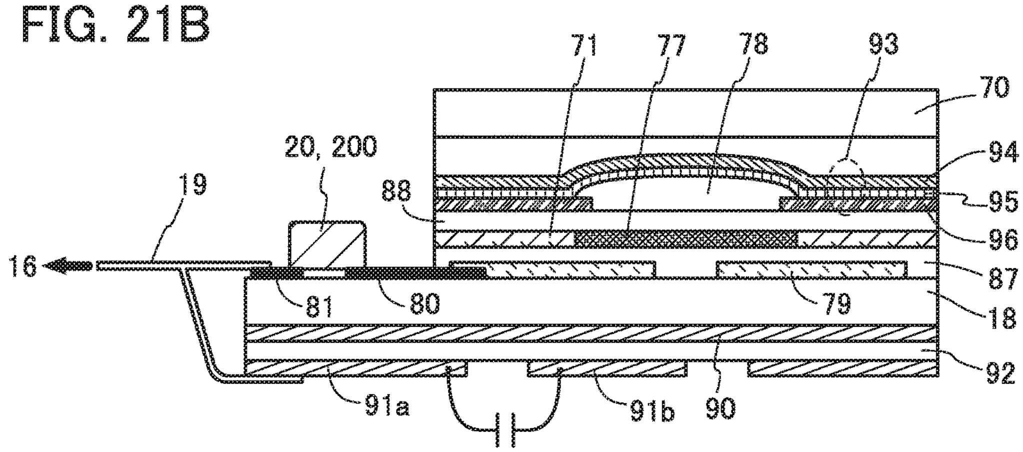

In the display device in FIG. 21A, the touch sensor may be formed using capacitance formed between a pair of wirings (a conductive film 91*a* and a conductive film 91*b*) of the conductive film 91. In other words, the conductive film 91*a* functions as one of the wiring CLx and the wiring CLy and the conductive film 91*b* functions as the other of the wiring CLx and the wiring CLy. FIG. 21B shows an example of that case. The conductive film 91*a* and the conductive film 91*b* are electrically connected to the IC 20 (or the IC 200) through the FPC 19.

The IC 20 in each of FIGS. 21A and 21B can have the arrangements of the terminals illustrated in FIGS. 5A to 5C, FIGS. 6A to 6D, and FIGS. 7A to 7C. In particular, the structure where the terminal Ht1, the terminal Rt1, and the terminal Tt1 are positioned on the same side as illustrated in each of FIGS. 7A to 7C is preferable.

The IC 200 in each of FIGS. 21A and 21B can have the arrangements of the terminals in FIGS. 13A to 13D. In particular, the arrangement illustrated in FIG. 13D is preferable.

In the display device in each of FIGS. 17A to 17D, FIGS. 18A and 18B, FIGS. 19A to 19C, FIGS. 20A and 20B, and FIGS. 21A and 21B, a common EL layer may be formed in all pixels, or EL layers may be formed in respective pixels. For example, an EL layer exhibiting a white color may be formed in all pixels, and colors (e.g., red (R), green (G), and blue (B)) required for respective pixels may be emitted with coloring films. In that case, a high-definition display device can be provided. For example, pixels of RGB may include EL layers exhibiting respective colors. In that case, the color purity of the display device can be improved. Furthermore, a coloring film can be omitted.

«Structure Example of COF»

In the display device of one embodiment of the present invention, the IC 20 (or the IC 200) may be provided over the FPC 19. FIGS. 22A to 22D each illustrate a structure example of that case.

Figure 22A:
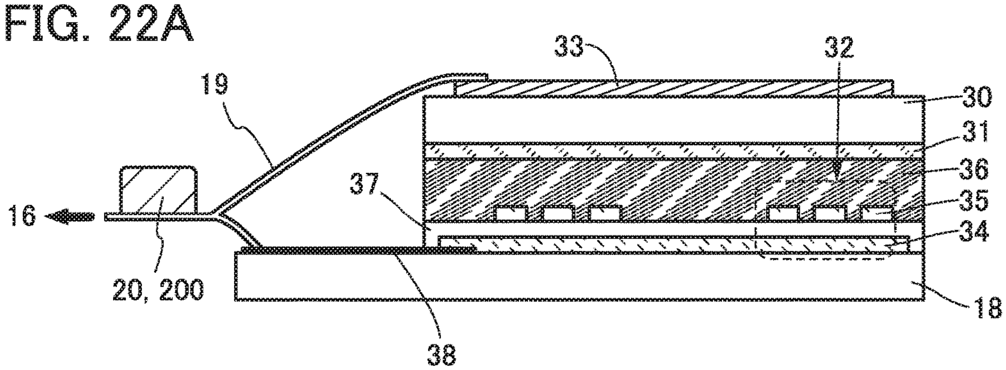
FIGS. 22A to 22D are schematic cross-sectional views each illustrating a structure example of a display device.

FIG. 22A illustrates a structure example in which the IC 20 (or the IC 200) is provided over the FPC 19 in the schematic cross-sectional view in FIG. 14A.

Figure 22B:
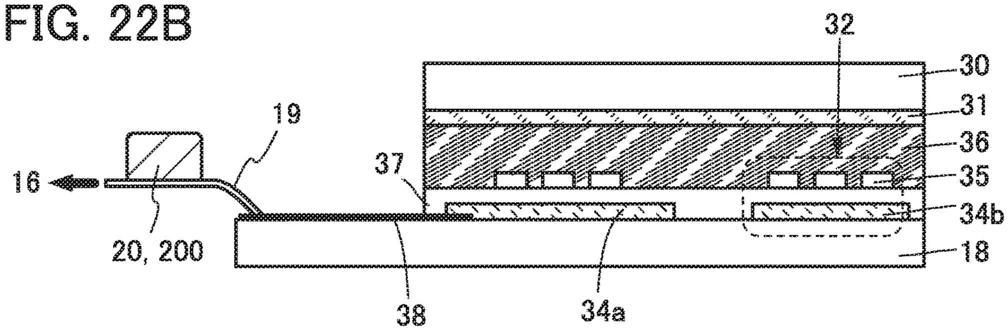

FIG. 22B illustrates a structure example in which the IC 20 (or the IC 200) is provided over the FPC 19 in the schematic cross-sectional view in FIG. 14C.

Figure 22C:
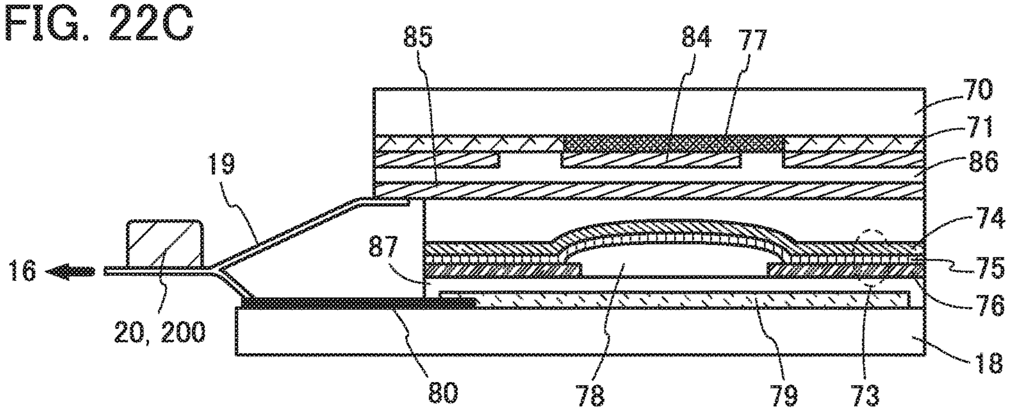

FIG. 22C illustrates a structure example in which the IC 20 (or the IC 200) is provided over the FPC 19 in the schematic cross-sectional view in FIG. 19C.

Figure 22D:
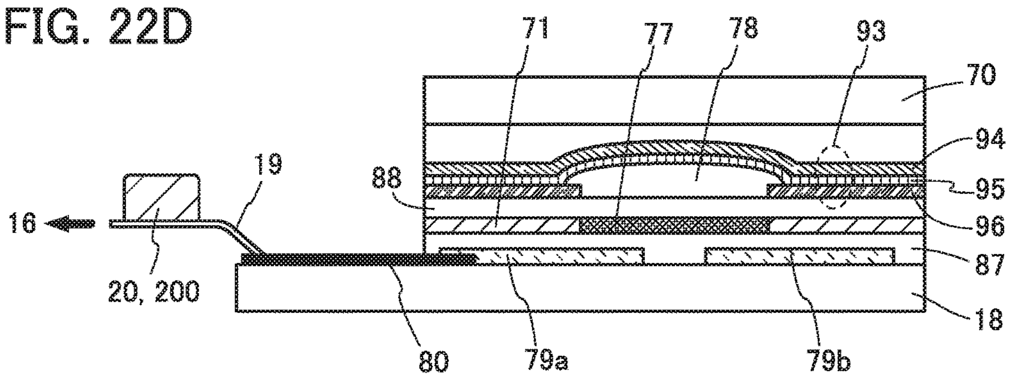

FIG. 22D illustrates a structure example in which the IC 20 (or the IC 200) is provided over the FPC 19 in the schematic cross-sectional view in FIG. 20B.

The IC 20 in each of FIGS. 22A to 22D can have the arrangements of the terminals illustrated in FIGS. 5A to 5C, FIGS. 6A to 6D, and FIGS. 7A to 7C. In particular, the structure where the terminal St1, the terminal Rt1, and the terminal Tt1 are positioned on the same side as illustrated in each of FIGS. 5A to 5C is preferable.

The IC 200 in each of FIGS. 22A to 22D can have the arrangements of the terminals in FIGS. 13A to 13D. In particular, the arrangement illustrated in FIG. 13A is preferable.

Similarly, the IC 20 can be arranged over the FPC 19 in the display device in each of FIGS. 14A to 14D, FIGS. 15A and 15B, FIGS. 16A to 16C, FIGS. 17A to 17D, FIGS. 18A and 18B, FIGS. 19A to 19C, FIGS. 20A and 20B, and FIGS. 21A and 21B. In any case, the IC 20 can have the arrangements of the terminals illustrated in FIGS. 5A to 5C, FIGS. 6A to 6D, and FIGS. 7A to 7C. In particular, the arrangements illustrated in FIGS. 5A to 5C are preferable.

Similarly, the IC 200 can be arranged over the FPC 19 in the display device in each of FIGS. 14A to 14D, FIGS. 15A and 15B, FIGS. 16A to 16C, FIGS. 17A to 17D, FIGS. 18A and 18B, FIGS. 19A to 19C, FIGS. 20A and 20B, and FIGS. 21A and 21B. In any case, the IC 200 can have the arrangements of the terminals illustrated in FIGS. 13A to 13D, and in particular, the arrangement illustrated in FIG. 13A is preferable.

With the display device in this embodiment, a display device with a touch sensor which has pixels of 4K, 8K, or more and in which a driver circuit of a display portion and a driver circuit of a touch sensor are included in one IC can be provided. Furthermore, a display device including a high accuracy touch sensor can be provided.

(Embodiment 4)

In this embodiment, circuit configuration examples of a display device which can be applied to the display device described in the above embodiments with reference to FIGS. 23A and 23B and FIGS. 24A and 24B.

Figure 23A:
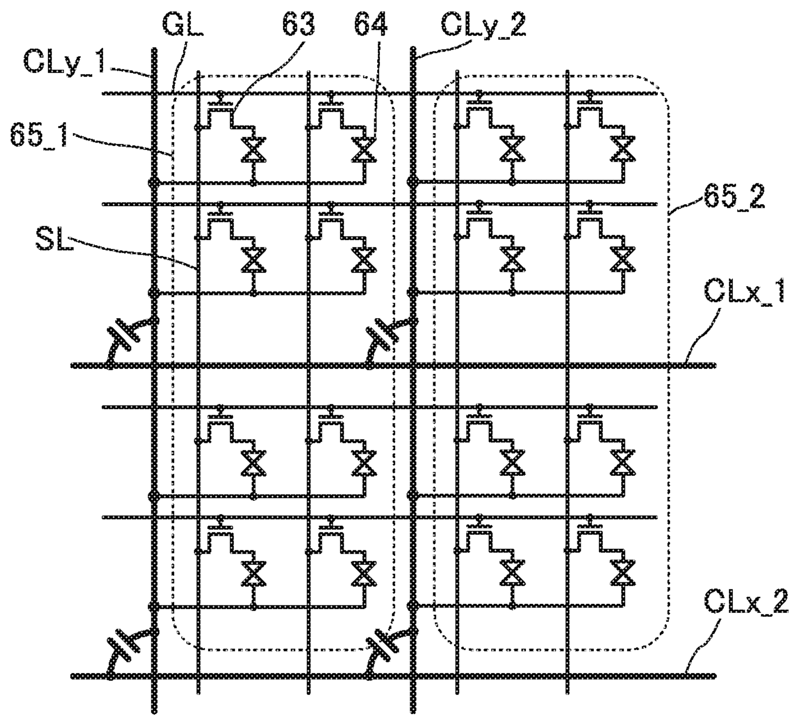
FIGS. 23A and 23B are circuit diagrams each illustrating a structure example of a display portion and a touch sensor.

FIG. 23A illustrates a circuit configuration example of a display device incorporating a touch sensor into a display portion (i.e., so-called the in-cell type). In the so-called in-cell type display device, a liquid crystal element is used as a display element.

Each pixel includes at least a transistor 63 and a liquid crystal element 64. Each pixel further includes a storage capacitor in some cases. A gate of the transistor 63 is electrically connected to a scan line GL, and one of a source and a drain of the transistor 63 is electrically connected to a signal line SL.

The pixel circuit includes a plurality of wirings extending in the X direction (e.g., a wiring CLx_1 and a wiring CLx_2) and a plurality of wirings extending in the Y direction (e.g., a wiring CLy_1 and a wiring CLy_2). They are provided to intersect each other, and capacitance is formed therebetween. The wirings CLy_1 and CLy_2 can be formed at the same time as one electrode of the liquid crystal element 64 by processing one conductive film. The wirings CLx can be provided over a substrate facing the substrate 18. The wirings CLx may be provided over the substrate 18.

For example, among the pixels provided in the pixel circuit, electrodes on one side of liquid crystal elements 64 of some pixels adjacent to each other are electrically connected to each other to form one block. For example, a plurality of linear blocks extending in the Y direction (e.g., a block 65_1 and a block 65_2) are formed here. Although only part of the pixel circuit is illustrated in FIG. 23A, these blocks are repeatedly arranged in the X direction.

Figure 23B:
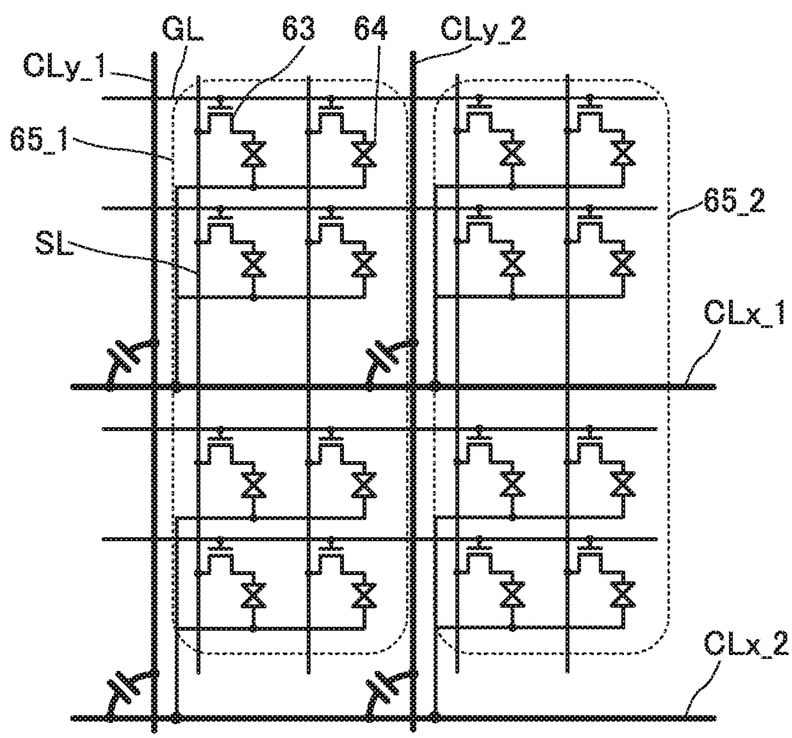

With the above structure, the one electrode of the liquid crystal element in the pixel circuit can also serve as an electrode included in a touch sensor. In FIG. 23A, the wirings CLy_1 and CLy_2 each serve as the electrode included in the touch sensor as well as the one electrode of the liquid crystal element. In contrast, the wirings CLx_1 and CLx_2 each serve only as an electrode included in the touch sensor. In this manner, the structure of the display device can be simplified. Although the plurality of wirings extending in the Y direction (e.g., the wirings CLy_1 and CLy_2) each serve as the electrode included in the touch sensor as well as the one electrode of the liquid crystal element in FIG. 23A, one embodiment of the present invention is not limited thereto. For example, the plurality of wirings extending in the X direction (e.g., the wirings CLx_1 and CLx_2) may each serve as the electrode included in the touch sensor as well as the one electrode of the liquid crystal element. An example of a circuit diagram in that case is shown in FIG. 23B.

With the above circuit configuration, an in-cell display device can be provided. The in-cell display device is preferable because the manufacturing process can be simplified.

Figure 24A:
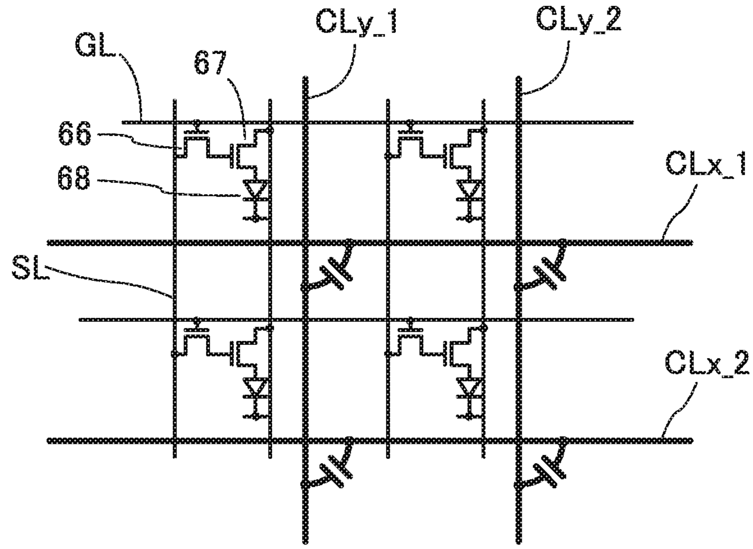
FIGS. 24A and 24B are circuit diagrams each illustrating a structure example of a display portion and a touch sensor.

FIG. 24A illustrates a circuit configuration example in which an EL element is used as a display element. A pixel includes at least a transistor 66, a transistor 67, and an EL element 68. Each pixel further includes a storage capacitor in some cases. In addition, a gate of the transistor 66 is electrically connected to the signal line GL, and one of a source and a drain of the transistor 66 is electrically connected to the signal line SL.

The pixel circuit includes a plurality of wirings extending in the X direction (e.g., the wiring CLx_1 and the wiring CLx_2) and a plurality of wirings extending in the Y direction (e.g., the wiring CLy_1 and the wiring CLy_2). They are provided to intersect each other, and capacitance is formed therebetween.

Figure 24B:
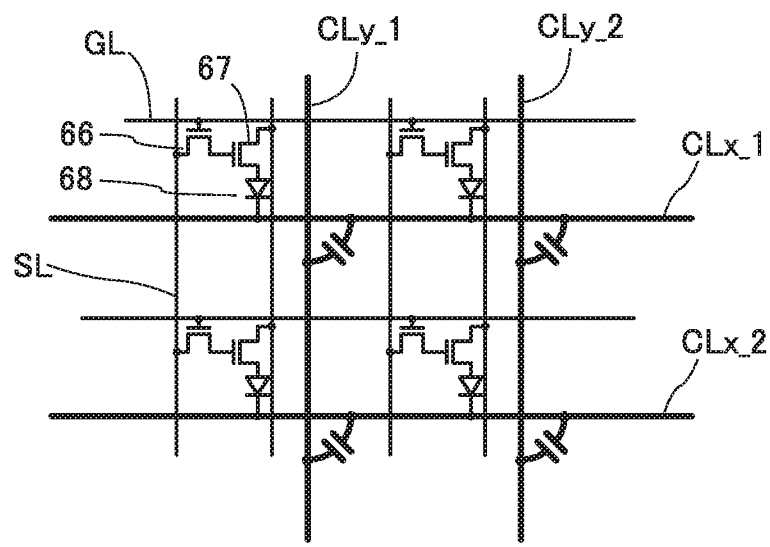

As illustrated in FIG. 24B, the wiring CLx_1 and the wiring CLx_2 may be formed at the same time as one electrode of the EL element 68 by processing one conductive film. In that case, the wiring CLy may be provided over a substrate facing the substrate 18 or may be provided over the substrate 18.

(Embodiment 5)

In this embodiment, cross-sectional structure examples of the display devices described in the above embodiments will be described with reference to drawings. Note that in this embodiment, an example in which a liquid crystal element is used as a display element is described. An example in which an EL element is used as a display element will be described in Embodiment 6.

«Cross-Sectional Structure Example 1»

Figure 25:
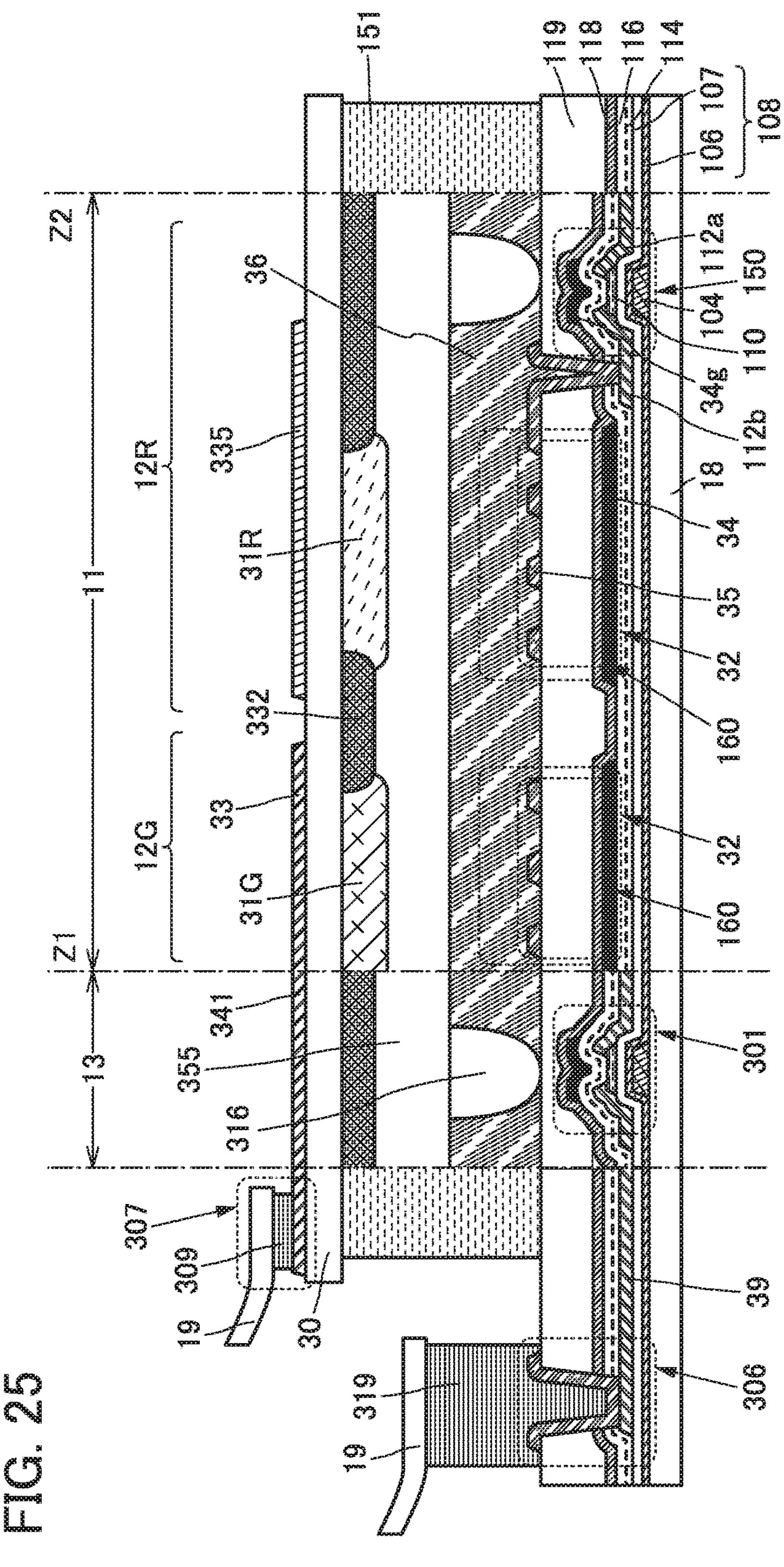
FIG. 25 is a schematic cross-sectional view illustrating a structure example of a display device.

FIG. 25 is a schematic cross-sectional view of a display device. FIG. 25 illustrates cross sections of a region including the FPC 19, a region including the scan line driver circuit 13 (one of the scan line driver circuits 13L and 13R), and a region including the display portion 11 in FIGS. 12A and 12B.

The substrate 18 and the substrate 30 are attached to each other with a sealing material 151. A region surrounded by the substrate 18, the substrate 30, and the sealing material 151 is filled with liquid crystal 36.

The display device illustrated in FIG. 25 includes, in the display portion 11, a transistor 150 including an oxide semiconductor film 110 and a capacitor 160 including an insulating film between a pair of electrodes. Note that in the capacitor 160, one of the pair of electrodes is the conductive film 34, and the other of the pair of electrodes is the conductive film 35.

The transistor 150 includes a gate electrode 104 over the substrate 18, an insulating film 108 serving as a gate insulating film over the gate electrode 104, the oxide semiconductor film 110 overlapping with the gate electrode 104 over the insulating film 108, and a source electrode 112*a* and a drain electrode 112*b* over the oxide semiconductor film 110. In other words, the transistor 150 includes the oxide semiconductor film 110, the insulating film 108 serving as a gate insulating film in contact with the oxide semiconductor film 110, the gate electrode 104 overlapping with the oxide semiconductor film 110 and being in contact with the insulating film 108, and the source electrode 112*a* and the drain electrode 112*b* electrically connected to the oxide semiconductor film 110.

In addition, over the transistor 150, specifically over the oxide semiconductor film 110, the source electrode 112*a*, and the drain electrode 112*b*, insulating films 114, 116, 118, and 119 are formed. The insulating films 114, 116, and 118 function as protective insulating films for the transistor 150. The insulating film 119 functions as a planarization film. In addition, an opening reaching the drain electrode 112*b* is formed in the insulating films 114, 116, 118, and 119. The conductive film 35 is formed over the insulating film 119 to cover the opening. The conductive film 35 has a function of a pixel electrode. Note that a structure without the insulating film 119 may be employed.

The capacitor 160 is provided over the insulating film 116. The capacitor 160 includes the conductive film 34 serving as the one of the pair of electrodes, the insulating films 118 and 119 serving as dielectric films over the conductive film 34, and the conductive film 35 that serves as the other of the pair of electrodes and overlaps with the conductive film 34 with the insulating films 118 and 119 provided therebetween. In other words, the conductive film 35 serves as the pixel electrode and the electrode of the capacitor. Note that the conductive film 34 preferably has a thickness with which a variation in resistivity in the film thickness direction is not caused. Specifically, the thickness is preferably greater than or equal to 30 nm and less than or equal to 70 nm, further preferably greater than or equal to 50 nm and less than or equal to 70 nm.

Furthermore, the display device illustrated in FIG. 25 includes a touch sensor in the display portion 11. The touch sensor includes, as a pair of electrodes, the conductive film 34 and the conductive film 33 that is provided over the substrate 30. The transistor 150, the capacitor 160, and the touch sensor can be collectively referred to as a semiconductor device. Moreover, the transistor 150 and the touch sensor can also be collectively referred to as a semiconductor device. Note that as an auxiliary electrode of electrodes of the touch sensor, a conductive film may be formed in contact with the conductive film 34. For example, a conductive film may be formed in a position overlapping with a light-blocking film 332 using a material similar to that of the gate electrode 104 or that of the source electrode 112*a* and the drain electrode 112*b*. Since the auxiliary electrode overlaps with the light-blocking film 332, delay of signal transmission for detection by the touch sensor can be reduced while the aperture ratio of the pixel is maintained.

The oxide semiconductor film 110 serves as a channel region of the transistor 150. In addition, the conductive film 34 serves as the one of the pair of electrodes of the capacitor 160. Thus, the conductive film 34 has resistivity lower than the oxide semiconductor film 110. As the conductive film 34, an oxide semiconductor film with low resistivity is preferably used. In addition, the oxide semiconductor film 110 and the conductive film 34 preferably contain the same metal element. When the oxide semiconductor film 110 and the conductive film 34 each contain the same metal element, a common manufacturing apparatus (e.g., a deposition apparatus or a processing apparatus) can be used and accordingly the manufacturing cost can be reduced.

In addition, the capacitor 160 has a light-transmitting property. In other words, each of the conductive film 34, the conductive film 35, and the insulating films 118 and 119 that are included in the capacitor 160 are formed of a material with a light-transmitting property. Since the capacitor 160 has a light-transmitting property, the capacitor 160 can be formed large (in a large area) in the pixel except a region where the transistor is formed; thus, the display device can have increased capacitance while improving the aperture ratio. As a result, the display device can have an excellent display quality.

Note that in the case where the conductive film 34 is an oxide semiconductor film with low resistivity, as the insulating film 118 that is over the transistor 150 and is included in the capacitor 160, an insulating film containing at least hydrogen is preferably used. In addition, as an insulating film 107 included in the transistor 150 and the insulating films 114 and 116 over the transistor 150, insulating films containing at least oxygen are preferably used. As described above, these insulating films are used as the insulating films included in the transistor 150 and the capacitor 160 and provided over the transistor 150 and the capacitor 160, so that the resistivity of the oxide semiconductor film 110 included in the transistor 150 and the resistivity of the conductive film 34 included in the capacitor 160 can be controlled.

In addition, when the insulating films included in the capacitor 160 and provided over the transistor 150 and the capacitor 160 are provided as follows, the planarity of the conductive film 35 can be increased. Specifically, the insulating films 114 and 116 are formed over the oxide semiconductor film 110 and the insulating film 118 is formed over the conductive film 34 so that the conductive film 34 is positioned between the insulating films 116 and 118, whereby the resistivity of the conductive film 34 can be controlled without providing an opening in the insulating films 114 and 116 in a position overlapping with the conductive film 34. With such a structure, the orientation of the liquid crystals formed over the conductive film 35 can be favorable.

Note that in FIG. 25, a conductive film 34*g* is provided to overlap with the oxide semiconductor film 110. The conductive film 34*g* is formed at the same time using the same deposition step and the same etching step as the conductive film 34. The conductive film 34*g* serves as the second gate electrode of the transistor 150. In that case, the insulating films 114 and 116 serve as gate insulating films for the second gate electrode. In other words, the transistor 150 includes the insulating films 116 and 117 provided over the oxide semiconductor film 110, the source electrode 112*a*, and the drain electrode 112*b* and the conductive film 34*g* provided over the insulating films 116 and 117 to overlap with the oxide semiconductor film 110.

Since the conductive film 34*g* is formed at the same time using the same deposition step and the same etching step as the conductive film 34, an increase in the number of steps can be prevented. Note that one embodiment of the present invention is not limited to these examples. The conductive film 34*g* can be formed in a step different from the conductive film 34. The conductive film 34*g* may be connected to the gate electrode 104. Alternatively, the conductive film 34*g* may be supplied with a signal or potential different from the signal or potential supplied to the gate electrode 104 without being connected to the gate electrode 104.

Note that the oxide semiconductor film 110 has higher resistivity than the conductive film 34 because it is used as the channel region in the transistor 150. The conductive film 34 has lower resistivity than the oxide semiconductor film 110 because it serves as an electrode. A method of controlling the resistivity of the oxide semiconductor film 110 and the resistivity of the conductive film 34 is described later.

The display device includes the conductive film 35, the conductive film 34, and the like over the substrate 18. The conductive film 35, the conductive film 34, and/or the like are included in a transistor 301, the transistor 150, a connection portion 306, the conductive film 39, and the liquid crystal element 32.

FIG. 25 illustrates the cross section of two pixels as an example of the display portion 11. For example, each of the pixels is a pixel exhibiting a red color, a pixel exhibiting a green color, or a pixel exhibiting a blue color; thus, full-color display can be achieved. In the display portion 11 illustrated in FIG. 25, for example, a pixel 12R includes the transistor 150, the capacitor 160, the liquid crystal element 32, and a coloring film 31R. Furthermore, a pixel 12G includes a transistor that is not illustrated, the capacitor 160, the liquid crystal element 32, and a coloring film 31G.

FIG. 25 illustrates, as an example of the scan line driver circuit 13, an example in which the transistor 301 is provided.

FIG. 25 illustrates an example in which the transistors 301 and 150 each have a structure in which a semiconductor layer where a channel is formed is provided between two gate electrodes. Such transistors can have a higher field-effect mobility and thus have a higher on-state current than other transistors. Consequently, a circuit capable of high-speed operation can be obtained. Furthermore, the area occupied by a circuit portion can be reduced. The use of the transistor having a high on-state current can reduce signal delay in wirings and can suppress display unevenness even in a display panel or a display device in which the number of wirings is increased because of an increase in size or resolution.

Note that the transistor 301 included in the scan line driver circuit 13 and the transistor 150 included in the display portion 11 may have the same structure. The plurality of transistors included in the scan line driver circuit 13 may have the same structure or different structures. The plurality of transistors included in the display portion 11 may have the same structure or different structures.

In the example illustrated in FIG. 25, a liquid crystal element using a fringe field switching (FFS) mode is used as the liquid crystal element 32. The liquid crystal element 32 includes the conductive film 35, the liquid crystal 36, and the conductive film 34. Orientation of the liquid crystal 36 can be controlled with an electric field generated between the conductive film 35 and the conductive film 34.

The conductive film 35 has a comb-like top surface shape or a top surface shape provided with a slit (a top surface shape is also referred to as a planar shape). The conductive film 34 is provided so as to overlap with the conductive film 35. In a region overlapping with the coloring film 31R and the like, there is a portion where the conductive film 35 is not provided over the conductive film 34.

Figure 26:
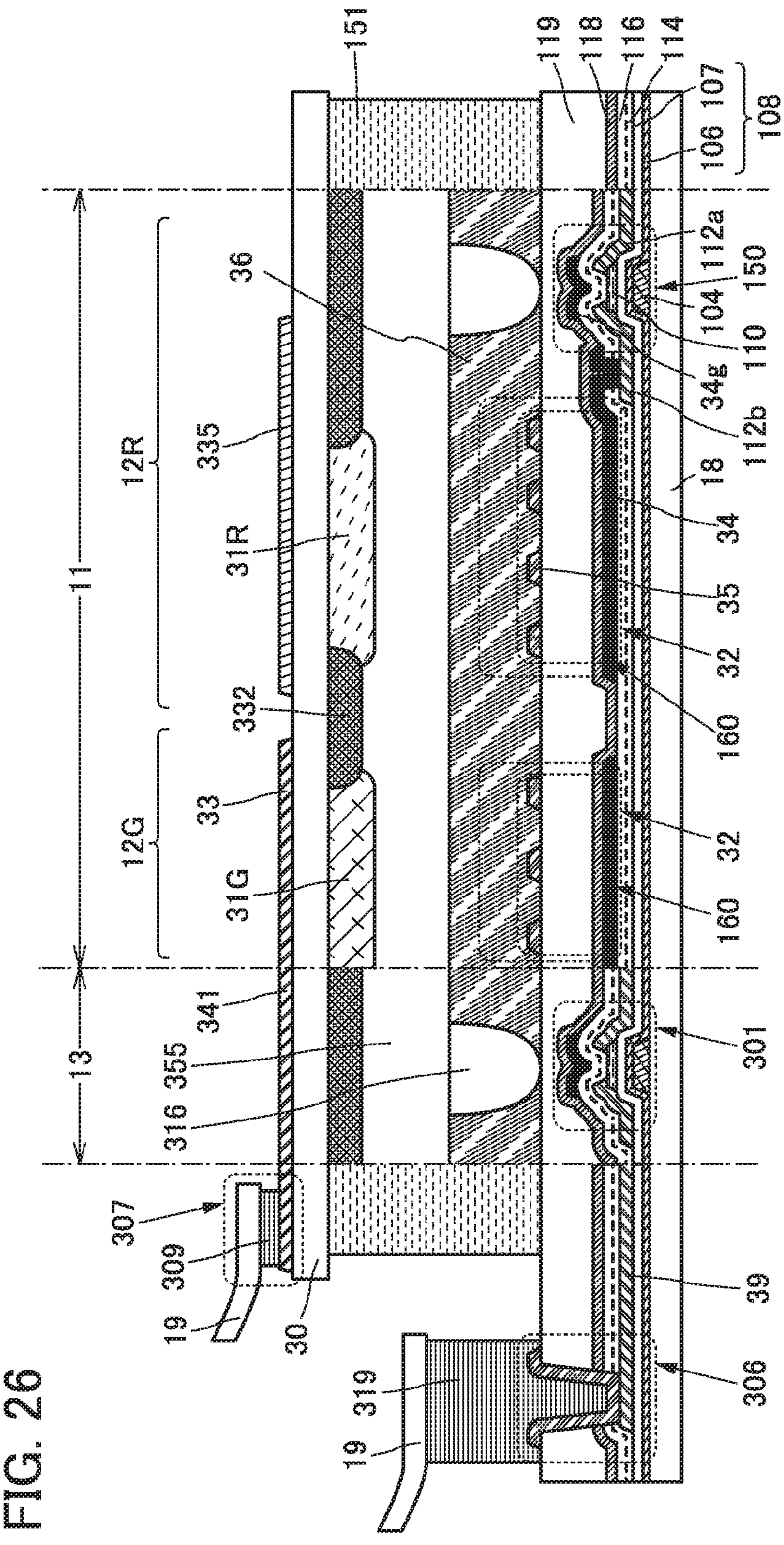
FIG. 26 is a schematic cross-sectional view illustrating a structure example of a display device.

In FIG. 25, the conductive film 35 functions as a pixel electrode, and the conductive film 34 functions as a common electrode. Alternatively, the conductive film 35 that is provided in an upper layer and has a comb-like top surface shape or a top surface shape provided with a slit may be used as the common electrode, and the conductive film 34 that is provided in a lower layer may be used as the pixel electrode (see FIG. 26). In the display device illustrated in FIG. 26, the conductive film 34 is electrically connected to the drain electrode 112*b* of the transistor 150. In this case, the touch sensor in the display device includes the conductive films 33 and 35 as a pair of electrodes.

The connection portion 306 is provided in a region near an end portion of the substrate 18. In the connection portion 306, the conductive film 39 is electrically connected to the FPC 19 through a connection layer 319. In the example illustrated in FIG. 25, the connection portion 306 is formed by stacking part of the conductive film 39 and a conductive film that is formed by processing the same conductive film as the conductive film 35.

The coloring film 31R, the coloring film 31G, the light-blocking film 332, an insulating film 355, and the like are provided on a surface of the substrate 30 that is on the substrate 18 side. The conductive film 33, a conductive film 335, a conductive film 341, and the like are provided on the surface of the substrate 30 that is the side opposite to the substrate 18. A connection portion 307 is provided in a region near an end of the substrate 30. In the connection portion 307, the conductive film 341 is electrically connected to the FPC 19 through a connection layer 309.

The conductive film 33 is electrically connected to the conductive film 341. The conductive film 335 is electrically insulated from the conductive films 33 and 341. The conductive films 33, 341, and 335 are preferably formed at the same time by processing one conductive film. Alternatively, the conductive films 33 and 341 may be continuous. In that case, at least a region that overlaps with the display portion 11 corresponds to the conductive film 33 functioning as one electrode of the touch sensor, and the other region corresponds to the conductive film 341.

Figure 27:
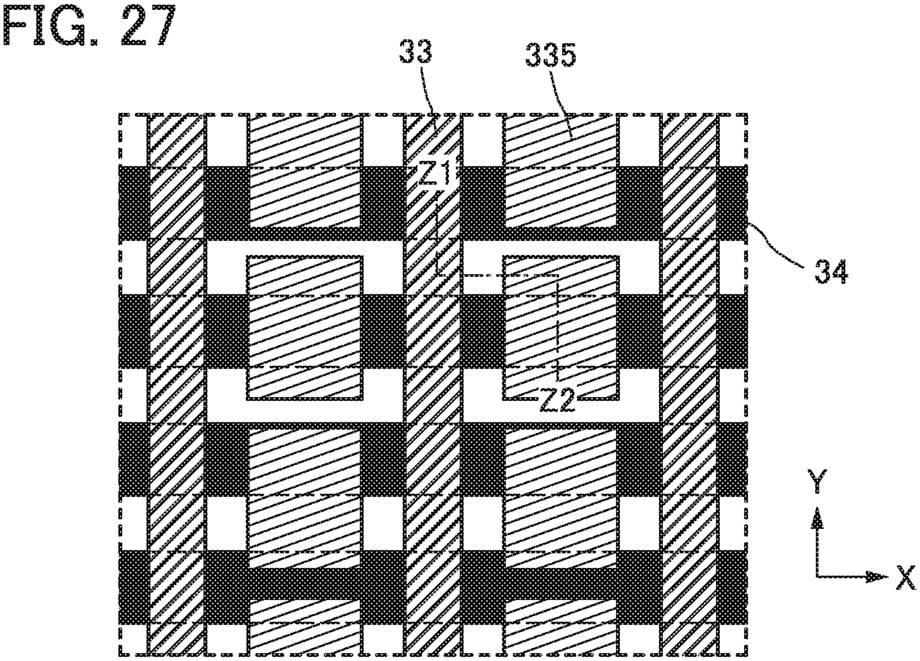
FIG. 27 is a schematic top view illustrating a structure example of a display device.

Here, the arrangement of the electrodes included in the touch sensor is described. FIG. 27 is a schematic top view of the pair of electrodes of the touch sensor included in the display device illustrated in FIG. 25. The dashed-dotted line Z1-Z2 in FIG. 27 corresponds to the display portion 11 in FIG. 25.

The conductive film 33 that is one electrode of the touch sensor extends in the Y direction. The conductive film 34 that is the other electrode of the touch sensor extends in the X direction and intersects the conductive film 33. The conductive film 335 is preferably formed using the same conductive film as the conductive film 33; however, the conductive film 335 is illustrated with hatching that is different from that of the conductive film 33 because the functions of the conductive films 33 and 335 are different. The conductive film 335 is brought into an electrically floating state, so that the potential of one of the conductive film 33 and the conductive film 34 can be transmitted efficiently to the other via the conductive film 335. Accordingly, the sensitivity of the touch sensor can be enhanced.

The coloring films 31R and 31G and the light-blocking film 332 are provided on the surface of the substrate 30 that is on the substrate 18 side (see FIG. 25). The insulating film 355 is provided so as to cover the coloring film 31R, the light-blocking film 332, and the like.

The insulating film 355 has a function of an overcoat preventing impurities contained in the coloring film 31R, the light-blocking film 332, and the like from diffusing into the liquid crystal 36.

A spacer 316 is provided between the insulating film 355 and the insulating film 119 to adjust the distance between the substrate 18 and the substrate 30. Although FIG. 25 illustrates the example in which the spacer 316 is in contact with components (e.g., the insulating film 119) on the substrate 18 side, the spacer 316 is not necessarily in contact with them. Moreover, FIG. 25 illustrates the example in which the spacer 316 is provided on the substrate 30 side; however, the spacer 316 may be provided on the substrate 18 side. For example, the spacer 316 can be provided between adjacent two sub-pixels. A particulate spacer may be used as the spacer 316. Although a material such as silica can be used for the particulate spacer, an elastic material such as an organic resin or rubber is preferably used. In that case, the particulate spacer may have a shape that is vertically crushed.

Surfaces of the conductive film 35, the insulating film 119, the insulating film 355, and the like that are in contact with the liquid crystal 36 may be provided with alignment films for controlling the orientation of the liquid crystal 36.

At least regions of the conductive films 33 and 335 that overlap with the coloring film 31R and the like are preferably formed using a light-transmitting material.

In the case where the display device includes a transmissive liquid crystal display device, for example, two polarizing plates that are not illustrated are provided to be above and below the display portion 11. Light from a backlight provided on the outer side of the polarizing plate enters through the polarizing plate. At this time, orientation of the liquid crystal 36 is controlled with a voltage applied between the conductive film 35 and the conductive film 34. In other words, the intensity of light emitted through the polarizing plate can be controlled. Light excluding light in a particular wavelength range is absorbed by the coloring film, so that red, blue, or green light is emitted.

In addition to the polarizing plate, a circularly polarizing plate can be used, for example. An example of the circularly polarizing plate is a stack including a linear polarizing plate and a quarter-wave retardation plate. With the circularly polarizing plate, the viewing angle dependency can be reduced.

In the example illustrated here, the liquid crystal element 32 is a liquid crystal element using an FFS mode. However, one embodiment of the present invention is not limited thereto, and a liquid crystal element using any of a variety of modes can be used. For example, a liquid crystal element using a vertical alignment (VA) mode, a twisted nematic (TN) mode, an in-plane switching (IPS) mode, an axially symmetric aligned micro-cell (ASM) mode, an optically compensated birefringence (OCB) mode, a ferroelectric liquid crystal (FLC) mode, an antiferroelectric liquid crystal (AFLC) mode, or the like can be used.

Furthermore, a normally black liquid crystal display device, for example, a transmissive liquid crystal display device using a vertical alignment (VA) mode, may be used as the display device. Examples of the vertical alignment mode include a multi-domain vertical alignment (MVA) mode, a patterned vertical alignment (PVA) mode, and an advanced super-view (ASV) mode.

The liquid crystal element is an element that controls transmission and non-transmission of light by optical modulation action of the liquid crystal. Note that optical modulation action of the liquid crystal is controlled by an electric field applied to the liquid crystal (including a horizontal electric field, a vertical electric field, and an oblique electric field). As the liquid crystal used for the liquid crystal element, thermotropic liquid crystal, low-molecular liquid crystal, high-molecular liquid crystal, polymer dispersed liquid crystal (PDLC), ferroelectric liquid crystal, anti-ferroelectric liquid crystal, or the like can be used. Such a liquid crystal material exhibits a cholesteric phase, a smectic phase, a cubic phase, a chiral nematic phase, an isotropic phase, or the like depending on the conditions.

As the liquid crystal material, either of positive liquid crystal and negative liquid crystal may be used, and an appropriate liquid crystal material can be used depending on the mode or design to be used.

In the case of employing a horizontal electric field mode, liquid crystal exhibiting a blue phase for which an alignment film is unnecessary may be used. A blue phase is one of liquid crystal phases, which is generated just before a cholesteric phase changes into an isotropic phase while the temperature of cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition that includes liquid crystal exhibiting a blue phase and a chiral material has a short response time and has optical isotropy. In addition, the liquid crystal composition that includes liquid crystal exhibiting a blue phase and a chiral material does not need alignment treatment and has a small viewing angle dependence. An alignment film does not need to be provided and rubbing treatment is thus not necessary; accordingly, electrostatic discharge damage caused by the rubbing treatment can be prevented, and defects and damage of the liquid crystal display device in the manufacturing process can be reduced.

In this structure example, the display device can detect touch operation or the like by utilizing the capacitance formed between the conductive film 33 and the conductive film 34. That is, the conductive film 34 serves as one of a pair of electrodes of the liquid crystal element 32 as well as one of a pair of electrodes of the touch sensor.

A conductive material transmitting visible light is preferably used for the conductive film 35 and/or the conductive film 33. The conductive film 35 and/or the conductive film 33 is formed using, for example, a conductive material containing a metal oxide. For example, a metal oxide among light-transmitting conductive materials described later can be used.

Alternatively, the conductive film 35 and/or the conductive film 33 is preferably formed using a metal oxide containing the same metal element as other conductive films or a semiconductor layer. In particular, in the case where an oxide semiconductor is used for the semiconductor layer of the transistor in the display device, a conductive oxide containing a metal element contained in the oxide semiconductor is preferably used.

A fixed potential is supplied to the conductive film 33; thus, electromagnetic noise from the outside can be blocked. For example, when sensing is not performed, a constant potential that does not influence the switching of the liquid crystal 36 may be supplied to the conductive film 33. For example, a ground potential, a common potential, or a predetermined constant potential can be supplied. The conductive film 33 and the conductive film 34 may be set at the same potential, for example.

By applying an appropriate potential to the conductive film 33, a component in the thickness direction in the directions of an electric field (the directions of the electric flux lines) generated between the conductive film 35 and the conductive film 34 can be reduced, and an electric field can be effectively applied in the direction substantially perpendicular to the thickness direction (in the lateral direction). Thus, an orientation defect in the liquid crystal 36 can be suppressed, and a malfunction such as light leakage can be prevented.

A substrate that an object such as a finger or a stylus directly touches may be provided above the conductive films 33 and 335 and the substrate 30. In that case, a polarizing plate or a circularly polarizing plate is preferably provided between the substrate 30 and the substrate. In that case, the above substrate is preferably provided with a protective layer (such as a ceramic coat). The protective layer can be formed using an inorganic insulating material such as silicon oxide, aluminum oxide, yttrium oxide, or yttria-stabilized zirconia (YSZ). In addition, tempered glass may be used for the above substrate. The tempered glass that can be used here is one that has been subjected to physical or chemical treatment by an ion exchange method, a thermal tempering method, or the like and has a surface to which compressive stress has been applied.

«Components»

The above components are described below.

<Substrate>

A substrate having a flat surface can be used as the substrate included in the display device. The substrate through which light emitted from the display element is extracted is formed using a material that transmits the light. For example, a material such as glass, quartz, ceramics, sapphire, or an organic resin can be used. Alternatively, a single crystal semiconductor substrate or a polycrystalline semiconductor substrate made of silicon or silicon carbide, a compound semiconductor substrate made of silicon germanium or the like, an SOI substrate, or the like may be used. Still alternatively, any of these substrates provided with a semiconductor element may be used as the substrate.

In the case where a glass substrate is used as the substrate, a large glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be manufactured. Alternatively, a flexible substrate may be used as the substrate, and a transistor, a capacitor, or the like may be provided directly over the flexible substrate.

The weight and thickness of the display device can be decreased by using a thin substrate. Furthermore, a flexible display device can be obtained by using a substrate that is thin enough to have flexibility.

As the glass, for example, non-alkali glass, barium borosilicate glass, aluminoborosilicate glass, or the like can be used.

Examples of a material having flexibility and a light-transmitting property with respect to visible light include glass that is thin enough to have flexibility, polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, a polyvinyl chloride resin, and a polytetrafluoroethylene (PTFE) resin. In particular, a material whose thermal expansion coefficient is low is preferred, and for example, a polyamide imide resin, a polyimide resin, or PET can be suitably used. A substrate in which a glass fiber is impregnated with an organic resin or a substrate whose thermal expansion coefficient is reduced by mixing an organic resin with an inorganic filler can also be used. A substrate using such a material is lightweight, and thus, a display device using this substrate can also be lightweight.

Since the substrate through which light is not extracted does not need to have a light-transmitting property, a metal substrate using a metal material or an alloy material, a ceramic substrate, a semiconductor substrate, or the like can be used as well as the above-described substrates. A metal material and an alloy material, which have high thermal conductivity, are preferable because they can easily conduct heat to the whole sealing substrate and accordingly can prevent a local temperature rise in the display device. To obtain flexibility and bendability, the thickness of a metal substrate is preferably greater than or equal to 10 μm and less than or equal to 200 μm, more preferably greater than or equal to 20 μm and less than or equal to 50 μm.

There is no particular limitation on a material of the metal substrate, but it is preferable to use, for example, aluminum, copper, nickel, or a metal alloy such as an aluminum alloy or stainless steel.

It is preferable to use a substrate subjected to insulation treatment in such a manner that a surface of a conductive substrate is oxidized or an insulating film is formed on a surface. An insulating film may be formed by, for example, a coating method such as a spin-coating method or a dipping method, an electrodeposition method, an evaporation method, or a sputtering method. An oxide film may be formed on the substrate surface by an anodic oxidation method, exposing to or heating in an oxygen atmosphere, or the like.

The flexible substrate may have a stacked structure of a layer of any of the above-mentioned materials and a hard coat layer (e.g., a silicon nitride layer) that protects a surface of the display device from damage or the like, a layer (e.g., an aramid resin layer) that can disperse pressure, or the like. Furthermore, to suppress a decrease in the lifetime of the display element due to moisture and the like, an insulating film with low water permeability may be provided. For example, a film containing nitrogen and silicon (e.g., a silicon nitride film or a silicon oxynitride film) or a film containing nitrogen and aluminum (e.g., an aluminum nitride film) may be provided.

The substrate may be formed by stacking a plurality of layers. In particular, when a glass layer is used, a barrier property against water and oxygen can be improved, and thus, a highly reliable display device can be provided.

A substrate in which a glass layer, an adhesive layer, and an organic resin layer are stacked from the side closer to the display element can be used, for example. The thickness of the glass layer is greater than or equal to 20 μm and less than or equal to 200 μm, preferably greater than or equal to 25 μm and less than or equal to 100 μm. With such a thickness, the glass layer can have both a high barrier property against water and oxygen and high flexibility. The thickness of the organic resin layer is greater than or equal to 10 μm and less than or equal to 200 μm, preferably greater than or equal to 20 μm and less than or equal to 50 μm. By providing such an organic resin layer, occurrence of a break or a crack in the glass layer can be inhibited, and the mechanical strength can be improved. With the substrate that includes such a composite material of a glass material and an organic resin, a highly reliable flexible display device can be provided.

<Transistor>

The transistor includes a conductive film functioning as the gate electrode, the semiconductor layer, a conductive film functioning as the source electrode, a conductive film functioning as the drain electrode, and the insulating film functioning as the gate insulating film. In the above example, a bottom-gate transistor is used.

Note that there is no particular limitation on the structure of the transistor included in the display device of one embodiment of the present invention. For example, a staggered transistor or an inverted staggered transistor may be used. A top-gate transistor or a bottom-gate transistor may be used.

There is no particular limitation on the crystallinity of a semiconductor material used for the transistor, and an amorphous semiconductor or a semiconductor having crystallinity (a microcrystalline semiconductor, a polycrystalline semiconductor, a single-crystal semiconductor, or a semiconductor partly including crystal regions) may be used. It is preferable that a semiconductor having crystallinity be used, in which case deterioration of the transistor characteristics can be suppressed.

As a semiconductor material for the semiconductor layer of the transistor, an element of Group 14, a compound semiconductor, or an oxide semiconductor can be used, for example. Typically, a semiconductor containing silicon, a semiconductor containing gallium arsenide, an oxide semiconductor containing indium, or the like can be used.

An oxide semiconductor is preferably used as a semiconductor in which a channel of the transistor is formed. In particular, an oxide semiconductor having a wider band gap than silicon is preferably used. A semiconductor material having a wider band gap and a lower carrier density than silicon is preferably used because the off-state current of the transistor can be reduced.

As the semiconductor layer, it is particularly preferable to use an oxide semiconductor film including a plurality of crystal parts whose c-axes are aligned substantially perpendicular to a surface on which the semiconductor layer is formed or the top surface of the semiconductor layer and having no grain boundary between adjacent crystal parts.

There is no grain boundary in such an oxide semiconductor; therefore, generation of a crack in an oxide semiconductor film that is caused by stress when a display panel is bent is prevented. Therefore, such an oxide semiconductor can be preferably used for a flexible display device that is used in a bent state, or the like.

Moreover, the use of such an oxide semiconductor for the semiconductor layer makes it possible to provide a highly reliable transistor in which a variation in electrical characteristics is suppressed.

Charge accumulated in a capacitor through a transistor can be held for a long time because of the low off-state current of the transistor. When such a transistor is used for a pixel, operation of a driver circuit can be stopped while a gray scale of an image displayed in each display region is maintained. As a result, a display device with an extremely low power consumption can be obtained.

<Oxide Semiconductor Film>

It is preferable that the oxide semiconductor film 110 includes at least indium (In) and zinc (Zn). In order to reduce variations in electrical characteristics of the transistor including the oxide semiconductor, the oxide semiconductor preferably contains a stabilizer in addition to the above elements. Examples of the stabilizer are gallium (Ga), tin (Sn), hafnium (Hf), aluminum (Al), and zirconium (Zr). Other examples of the stabilizer are lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

As an oxide semiconductor included in the oxide semiconductor film 110, any of the following oxides can be used, for example: an In—Ga—Zn-based oxide, an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

Note that here, an "In—Ga—Zn-based oxide" means an oxide containing In, Ga, and Zn as its main components, and there is no limitation on the ratio of In:Ga:Zn. The In—Ga—Zn-based oxide may contain another metal element in addition to In, Ga, and Zn.

The oxide semiconductor film 110 and the conductive film 34 may include the same metal elements contained in the above oxides. The use of the same metal elements for the oxide semiconductor film 110 and the conductive film 34 can reduce the manufacturing cost. For example, when metal oxide targets with the same metal composition are used, the manufacturing cost can be reduced, and the same etching gas or the same etchant can be used in forming the oxide semiconductor film 110 and the conductive film 34. Note that even when the oxide semiconductor film 110 and the conductive film 34 include the same metal elements, they have different compositions in some cases. For example, a metal element in a film is released during the manufacturing process of the transistor and the capacitor, which might result in different metal compositions.

Note that in the case where the oxide semiconductor film 110 includes an In-M-Zn oxide, when the summation of In and M is assumed to be 100 atomic %, the atomic proportions of In and M are preferably higher than 25 atomic % and lower than 75 atomic %, respectively, more preferably higher than 34 atomic % and lower than 66 atomic %, respectively.

The energy gap of the oxide semiconductor film 110 is 2 eV or more, preferably 2.5 eV or more, more preferably 3 eV or more. In this manner, the off-state current of the transistor can be reduced by using an oxide semiconductor having a wide energy gap.

The thickness of the oxide semiconductor film 110 is greater than or equal to 3 nm and less than or equal to 200 nm, preferably greater than or equal to 3 nm and less than or equal to 100 nm, more preferably greater than or equal to 3 nm and less than or equal to 50 nm.

In the case where the oxide semiconductor film 110 includes an In-M-Zn oxide (M represents any one of the above stabilizers), it is preferable that the atomic ratio of metal elements of a sputtering target used for forming a film of the In-M-Zn oxide satisfy In≥M and Zn≥M As the atomic ratio of the metal elements of such a sputtering target, In:M:Zn=1:1:1, In:M:Zn=1:1:1.2, In:M:Zn=3:1:2, In:M:Zn=1:3:4, In:M:Zn=1:3:6, In:M:Zn=4:2:4.1, and the like are given. Note that the atomic ratio of metal elements in the formed oxide semiconductor film 110 varies from the above atomic ratio of metal elements of the sputtering target within a range of ±40% as an error.

An oxide semiconductor film with a low carrier density is used as the oxide semiconductor film 110. For example, an oxide semiconductor film whose carrier density is lower than or equal to $1\times10^{17}/cm^3$, preferably lower than or equal to $1\times10^{15}/cm^3$, more preferably lower than or equal to $1\times10^{13}/cm^3$, more preferably lower than or equal to $1\times10^{11}/cm^3$ is used as the oxide semiconductor film 110.

Note that, without limitation to the compositions and materials described above, a material with an appropriate composition may be used depending on required semiconductor characteristics and electrical characteristics (e.g., field-effect mobility and threshold voltage) of the transistor. Furthermore, to obtain required semiconductor characteristics of the transistor, it is preferable that the carrier density, the impurity concentration, the defect density, the atomic ratio of a metal element to oxygen, the interatomic distance, the density, and the like of the oxide semiconductor film 110 be set to be appropriate.

When silicon or carbon that is one of elements belonging to Group 14 is contained in the oxide semiconductor film 110, oxygen vacancies are increased, and the oxide semiconductor film 110 has n-type conductivity. Thus, the concentration of silicon or carbon (measured by secondary ion mass spectrometry (SIMS)) of the oxide semiconductor film 110 is lower than or equal to $2\times10^{18}$ atoms/cm$^3$, preferably lower than or equal to $2\times10^{17}$ atoms/cm$^3$.

Furthermore, the concentration of alkali metal or alkaline earth metal in the oxide semiconductor film 110, which is measured by SIMS, is lower than or equal to $1\times10^{18}$ atoms/cm$^3$, preferably lower than or equal to $2\times10^{16}$ atoms/cm$^3$. Alkali metal and alkaline earth metal might generate carriers when bonded to an oxide semiconductor, in which case the off-state current of the transistor might be increased. Therefore, it is preferable to reduce the concentration of alkali metal or alkaline earth metal in the oxide semiconductor film 110.

When nitrogen is contained in the oxide semiconductor film 110, electrons serving as carriers are generated to increase the carrier density, so that the oxide semiconductor film 110 easily has n-type conductivity. Thus, a transistor including an oxide semiconductor that contains nitrogen is likely to be normally on. For this reason, nitrogen in the oxide semiconductor film is preferably reduced as much as possible; the concentration of nitrogen that is measured by SIMS is preferably set to, for example, lower than or equal to $5\times10^{18}$ atoms/$cm^3$.

The oxide semiconductor film 110 may have a non-single-crystal structure, for example. The non-single-crystal structure includes a c-axis aligned a-b-plane-anchored crystalline oxide semiconductor (CAAC-OS) that is described later, a polycrystalline structure, a microcrystalline structure, or an amorphous structure, for example. Among the non-single-crystal structures, an amorphous structure has the highest density of defect states, whereas CAAC-OS has the lowest density of defect states.

The oxide semiconductor film 110 may have an amorphous structure, for example. An oxide semiconductor film having an amorphous structure has disordered atomic arrangement and no crystalline component, for example. Alternatively, an oxide film having an amorphous structure has, for example, an absolutely amorphous structure and no crystal part.

Note that the oxide semiconductor film 110 may be a mixed film including two or more of the following: a region having an amorphous structure, a region having a microcrystalline structure, a region having a polycrystalline structure, a region of CAAC-OS, and a region having a single-crystal structure. The mixed film includes, for example, two or more of the region having an amorphous structure, the region having a microcrystalline structure, the region having a polycrystalline structure, the region of CAAC-OS, and the region having a single-crystal structure in some cases. Furthermore, the mixed film has a stacked-layer structure of two or more of the following in some cases: the region having an amorphous structure, the region having a microcrystalline structure, the region having a polycrystalline structure, the region of CAAC-OS, and the region having a single-crystal structure.

Note that silicon may be used as a semiconductor in which a channel of the transistor is formed. Although amorphous silicon may be used as silicon, silicon having crystallinity is particularly preferable. For example, microcrystalline silicon, polycrystalline silicon, or single crystal silicon is preferably used. In particular, polycrystalline silicon can be formed at a lower temperature than single crystal silicon and has higher field-effect mobility and higher reliability than amorphous silicon. When such a polycrystalline semiconductor is used for a pixel, the aperture ratio of the pixel can be improved. Even in the case where pixels are provided at extremely high resolution, a gate driver circuit and a source driver circuit can be formed over a substrate over which the pixels are formed, and the number of components of an electronic device can be reduced.

(Structure of Oxide Semiconductor)

Next, a structure of an oxide semiconductor will be described.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. In addition, the term "substantially perpendicular" indicates that the angle formed between two straight lines is greater than or equal to 60° and less than or equal to 120°.

In this specification, trigonal and rhombohedral crystal systems are included in a hexagonal crystal system.

An oxide semiconductor film is classified into a non-single-crystal oxide semiconductor film and a single crystal oxide semiconductor film. Alternatively, an oxide semiconductor is classified into, for example, a crystalline oxide semiconductor and an amorphous oxide semiconductor.

Examples of a non-single-crystal oxide semiconductor include a CAAC-OS, a polycrystalline oxide semiconductor, a microcrystalline oxide semiconductor, and an amorphous oxide semiconductor. In addition, examples of a crystalline oxide semiconductor include a single crystal oxide semiconductor, a CAAC-OS, a polycrystalline oxide semiconductor, and a microcrystalline oxide semiconductor.

First, a CAAC-OS film will be described.

The CAAC-OS film is one of oxide semiconductor films having a plurality of c-axis aligned crystal parts.

In a combined analysis image (also referred to as a high-resolution TEM image) of a bright-field image and a diffraction pattern of a CAAC-OS film, which is obtained using a transmission electron microscope (TEM), a plurality of crystal parts can be observed. However, in the high-resolution TEM image, a boundary between crystal parts, that is, a grain boundary is not clearly observed. Thus, in the CAAC-OS film, a reduction in electron mobility due to the grain boundary is less likely to occur.

According to the high-resolution cross-sectional TEM image of the CAAC-OS film observed in a direction substantially parallel to a sample surface, metal atoms are arranged in a layered manner in the crystal parts. Each metal atom layer has a morphology reflecting unevenness of a surface where the CAAC-OS film is formed (hereinafter, a surface where the CAAC-OS film is formed is also referred to as a formation surface) or a top surface of the CAAC-OS film, and is arranged parallel to the formation surface or the top surface of the CAAC-OS film.

On the other hand, according to the high-resolution plan-view TEM image of the CAAC-OS film observed in a direction substantially perpendicular to the sample surface, metal atoms are arranged in a triangular or hexagonal configuration in the crystal parts. However, there is no regularity of arrangement of metal atoms between different crystal parts.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

Note that when the CAAC-OS film with an $InGaZnO_4$ crystal is analyzed by an out-of-plane method, a peak may also be observed when 2θ is around 36°, in addition to the peak at 2θ of around 31°. The peak at 2θ of around 36° indicates that a crystal having no c-axis alignment is included in part of the CAAC-OS film. It is preferable that in the CAAC-OS film, a peak appear when 2θ is around 31° and that a peak not appear when 2θ is around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Furthermore, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a highly purified intrinsic or substantially highly purified intrinsic state. A highly purified intrinsic or substantially highly purified intrinsic oxide semiconductor film has few carrier generation sources, and thus can have a low carrier density. Therefore, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. Electric charge trapped by the carrier traps in the oxide semiconductor film takes a long time to be released and might behave like fixed electric charge. Thus, the transistor including the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Next, a microcrystalline oxide semiconductor film will be described.

A microcrystalline oxide semiconductor film has a region in which a crystal part is observed and a region in which a crystal part is not clearly observed in a high-resolution TEM image. In most cases, the size of a crystal part included in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm, is specifically referred to as nanocrystal (nc). An oxide semiconductor film including nanocrystal is referred to as an nc-OS (nanocrystalline oxide semiconductor) film. In a high-resolution TEM image of the nc-OS film, for example, a grain boundary is not clearly observed in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than the size of a crystal part, a peak indicating a crystal plane does not appear. Furthermore, a halo pattern is shown in a selected-area electron diffraction pattern of the nc-OS film obtained by using an electron beam having a probe diameter (e.g., 50 nm or larger) larger than the size of a crystal part. Meanwhile, spots are shown in a nanobeam electron diffraction pattern of the nc-OS film obtained by using an electron beam having a probe diameter close to or smaller than the size of a crystal part. Furthermore, in a nanobeam electron diffraction pattern of the nc-OS film, regions with high luminance in a circular (ring) pattern are shown in some cases. Moreover, in a nanobeam electron diffraction pattern of the nc-OS film, a plurality of spots are shown in a ring-like region in some cases.

The nc-OS film is an oxide semiconductor film that has high regularity as compared with an amorphous oxide semiconductor film. Therefore, the nc-OS film has a lower density of defect states than an amorphous oxide semiconductor film. Note that there is no regularity of crystal orientation between different crystal parts in the nc-OS film. Therefore, the nc-OS film has a higher density of defect states than the CAAC-OS film.

Next, an amorphous oxide semiconductor film is described.

The amorphous oxide semiconductor film has disordered atomic arrangement and no crystal part. For example, the amorphous oxide semiconductor film does not have a specific state as in quartz.

In a high-resolution TEM image of the amorphous oxide semiconductor film, crystal parts cannot be found.

When the amorphous oxide semiconductor film is subjected to structural analysis by an out-of-plane method with an XRD apparatus, a peak which shows a crystal plane does not appear. A halo pattern is observed when the amorphous oxide semiconductor film is subjected to electron diffraction. Furthermore, a spot is not observed and a halo pattern appears when the amorphous oxide semiconductor film is subjected to nanobeam electron diffraction.

Note that an oxide semiconductor film may have a structure having physical properties between the nc-OS film and the amorphous oxide semiconductor film. The oxide semiconductor film having such a structure is specifically referred to as an amorphous-like oxide semiconductor (a-like OS) film.

In a high-resolution TEM image of the a-like OS film, a void may be observed. Furthermore, in the high-resolution TEM image, there are a region where a crystal part is clearly observed and a region where a crystal part is not observed. In some cases, growth of the crystal part occurs due to the crystallization of the a-like OS film, which is induced by a slight amount of electron beam employed in the TEM observation. In contrast, in the nc-OS film that has good quality, crystallization hardly occurs by a slight amount of electron beam used for TEM observation.

Note that the crystal part size in the a-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers including three In—O layers and six Ga—Zn—O layers are stacked in the c-axis direction. Accordingly, the distance between the adjacent layers is equivalent to the lattice spacing on the (009) plane (also referred to as d value). The value is calculated to be 0.29 nm from crystal structural analysis. Thus, focusing on lattice fringes in the high-resolution TEM image, each of lattice fringes in which the lattice spacing therebetween is greater than or equal to 0.28 nm and less than or equal to 0.30 nm corresponds to the a-b plane of the $InGaZnO_4$ crystal.

Furthermore, the density of an oxide semiconductor film varies depending on the structure in some cases. For example, when the composition of an oxide semiconductor film is determined, the structure of the oxide semiconductor film can be expected by comparing the density of the oxide semiconductor film with the density of a single crystal oxide semiconductor film having the same composition as the oxide semiconductor film. For example, the density of the a-like OS film is higher than or equal to 78.6% and lower than 92.3% of the density of the single crystal oxide semiconductor film having the same composition. For example, the density of each of the nc-OS film and the CAAC-OS film is higher than or equal to 92.3% and lower than 100% of the density of the single crystal oxide semiconductor film having the same composition. Note that it is difficult to deposit an oxide semiconductor film having a density of lower than 78% of the density of the single crystal oxide semiconductor film.

Specific examples of the above description are given. For example, in the case of an oxide semiconductor film having an atomic ratio of In:Ga:Zn=1:1:1, the density of single crystal $InGaZnO_4$ with a rhombohedral crystal structure is 6.357 g/cm$^3$. Accordingly, in the case of the oxide semiconductor film having an atomic ratio of In:Ga:Zn=1:1:1, the density of the a-like OS film is higher than or equal to 5.0 g/cm$^3$ and lower than 5.9 g/cm$^3$. For example, in the case of the oxide semiconductor film having an atomic ratio of In:Ga:Zn=1:1:1, the density of each of the nc-OS film and the CAAC-OS film is higher than or equal to 5.9 g/cm$^3$ and lower than 6.3 g/cm$^3$.

Note that there is a possibility that an oxide semiconductor having a certain composition cannot exist in a single crystal structure. In that case, single crystal oxide semiconductor films with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

Note that an oxide semiconductor film may be a stacked film including two or more films of an amorphous oxide semiconductor film, an a-like OS film, a microcrystalline oxide semiconductor film, and a CAAC-OS film, for example.

<Conductive Film>

As conductive films such as a gate, a source, and a drain of the transistor and a wiring and an electrode in the display device, a single-layer structure or a stacked-layer structure using any of metals such as aluminum, titanium, chromium, nickel, copper, yttrium, zirconium, molybdenum, silver, tantalum, and tungsten, or an alloy containing any of these metals as its main component can be used. For example, a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given. Note that a transparent conductive material containing indium oxide, tin oxide, or zinc oxide may also be used. Copper containing manganese is preferably used because controllability of a shape by etching is increased.

As a light-transmitting conductive material, a conductive oxide such as indium oxide, indium tin oxide (ITO), indium zinc oxide, zinc oxide, or zinc oxide to which gallium is added, or graphene can be used. Alternatively, a metal material such as gold, silver, platinum, magnesium, nickel, tungsten, chromium, molybdenum, iron, cobalt, copper, palladium, or titanium, or an alloy material containing any of these metal materials can be used. Alternatively, a nitride of the metal material (e.g., titanium nitride) or the like may be used. In the case of using the metal material or the alloy material (or the nitride thereof), the thickness is set small enough to be able to transmit light. Alternatively, a stack of any of the above materials can be used as the conductive film. For example, a stacked film of indium tin oxide and an alloy of silver and magnesium is preferably used because the conductivity can be increased.

Alternatively, for the conductive film, an oxide semiconductor similar to that of the semiconductor layer may be used. In that case, it is preferable that the conductive film be formed to have a lower electric resistance than a region in the semiconductor layer where a channel is formed.

For example, such a conductive film can be used as the conductive films 34 and 34*g*. Alternatively, it can be used as another light-transmitting conductive film.

<Method for Controlling Resistivity of Oxide Semiconductor>

An oxide semiconductor film that can be used as each of the oxide semiconductor film 110 and the conductive films 34 and 34*g* includes a semiconductor material whose resistivity can be controlled by oxygen vacancies in the film and/or the concentration of impurities such as hydrogen or water in the film. Thus, treatment to be performed on the oxide semiconductor film 110 and the conductive films 34 and 34*g* is selected from the following to control the resistivity of each of the oxide semiconductor films: treatment for increasing oxygen vacancies and/or the impurity concentration and treatment for reducing oxygen vacancies and/or the impurity concentration.

Specifically, plasma treatment is performed on the oxide semiconductor film used as the conductive film 34 serving as the electrode of the capacitor 160 and the conductive film 34*g* to increase oxygen vacancies and/or impurities such as hydrogen or water in the oxide semiconductor film, so that the oxide semiconductor film can have a high carrier density and low resistivity. Furthermore, an insulating film containing hydrogen is formed in contact with the oxide semiconductor film to diffuse hydrogen from the insulating film containing hydrogen (e.g., the insulating film 118) to the oxide semiconductor film, so that the oxide semiconductor film can have a high carrier density and low resistivity. As described above, the conductive films 34 and 34*g* serve as a semiconductor before the step of increasing oxygen vacancies or diffusing hydrogen in the films, whereas they serve as a conductor after the step.

Note that in increasing oxygen vacancies in the oxide semiconductor film by plasma treatment, when the oxide semiconductor film has a large thickness, the degree of an increase in oxygen vacancies is varied in the oxide semiconductor film in some cases. Moreover, in diffusing hydrogen from the insulating film to the oxide semiconductor film, when the oxide semiconductor film has a large thickness, the degree of an increase in impurities such as hydrogen or water is varied in the oxide semiconductor film in some cases. Specifically, the resistivity of a portion near the bottom surface of the oxide semiconductor film becomes higher than that of a portion near the top surface of the film in some cases. With such a variation, even in the case where the resistivity of the oxide semiconductor film is low, a conductive film such as a wiring is electrically connected to the oxide semiconductor film at its bottom surface side, so that contact resistance between the conductive film and the oxide semiconductor film is increased in some cases. On the other hand, the oxide semiconductor film needs to have a thickness that is large enough to serve as a conductive film. Thus, it is preferable that the conductive films 34 and 34*g* each have a thickness with which a variation in resistivity in the film thickness direction is not caused. Specifically, the thickness is preferably greater than or equal to 30 nm and less than or equal to 70 nm, further preferably greater than or equal to 50 nm and less than or equal to 70 nm.

The oxide semiconductor film 110 that serves as the channel region of the transistor 150 is not in contact with an insulating film 106 containing hydrogen or the insulating film 118 containing hydrogen because the insulating films 107, 114, and 116 are provided. With the use of an insulating film containing oxygen, in other words, an insulating film capable of releasing oxygen, for at least one of the insulating films 107, 114, and 116, oxygen can be supplied to the oxide semiconductor film 110. The oxide semiconductor film 110 to which oxygen is supplied is an oxide semiconductor film having high resistivity because oxygen vacancies in the film or at the interface are compensated. Note that as the insulating film capable of releasing oxygen, a silicon oxide film or a silicon oxynitride film can be used, for example.

To reduce the resistivity of the oxide semiconductor film, an ion implantation method, an ion doping method, a plasma immersion ion implantation method, or the like can be employed to inject hydrogen, boron, phosphorus, or nitrogen into the oxide semiconductor film.

To reduce the resistivity of the oxide semiconductor film, plasma treatment may be performed on the oxide semiconductor film. For the plasma treatment, for example, a gas containing at least one of a rare gas (He, Ne, Ar, Kr, or Xe), hydrogen, and nitrogen is typically used. Specifically, plasma treatment in an Ar atmosphere, plasma treatment in a mixed gas atmosphere of Ar and hydrogen, plasma treatment in an ammonia atmosphere, plasma treatment in a mixed gas atmosphere of Ar and ammonia, plasma treatment in a nitrogen atmosphere, or the like can be employed.

In the oxide semiconductor film subjected to the plasma treatment, an oxygen vacancy is formed in a lattice from which oxygen is released (or in a portion from which oxygen is released). This oxygen vacancy can generate a carrier. When hydrogen is supplied from an insulating film that is in the vicinity of the oxide semiconductor film, specifically, that is in contact with the lower surface or the upper surface of the oxide semiconductor film, and hydrogen is bonded to the oxygen vacancy, an electron serving as a carrier might be generated.

The oxide semiconductor film in which oxygen vacancies are filled and the hydrogen concentration is reduced can be referred to as a highly purified intrinsic or substantially highly purified intrinsic oxide semiconductor film. The term "substantially intrinsic" refers to the state where the oxide semiconductor film has a carrier density of lower than $8\times10^{11}/cm^3$, preferably lower than $1\times10^{11}/cm^3$, more preferably lower than $1\times10^{10}/cm^3$. A highly purified intrinsic or substantially highly purified intrinsic oxide semiconductor film has few carrier generation sources and thus can have a low carrier density. The highly purified intrinsic or substantially highly purified intrinsic oxide semiconductor film has a low density of defect states and accordingly can have a low density of trap states.

The highly purified intrinsic or substantially highly purified intrinsic oxide semiconductor film has an extremely low off-state current; even when an element has a channel width of $1\times10^6$ μm and a channel length of 10 μm, the off-state current can be lower than or equal to the measurement limit of a semiconductor parameter analyzer, i.e., lower than or equal to $1\times10^{-13}$ A, at a voltage (drain voltage) between a source electrode and a drain electrode of from 1 V to 10 V. Accordingly, the transistor 150 in which the channel region is formed in the oxide semiconductor film 110 formed using a highly purified intrinsic or substantially highly purified intrinsic oxide semiconductor film can have a small variation in electrical characteristics and high reliability.

For example, an insulating film containing hydrogen, in other words, an insulating film capable of releasing hydrogen, typically, a silicon nitride film, is used as the insulating film 118, whereby hydrogen can be supplied to the conductive film 34. The hydrogen concentration in the insulating film capable of releasing hydrogen is preferably higher than or equal to $1\times10^{22}$ atoms/cm$^3$. Such an insulating film is formed in contact with the conductive films 34 and 34*g*, whereby hydrogen can be effectively contained in the conductive films 34 and 34*g*. In this manner, the resistivity of the oxide semiconductor film can be controlled by changing the structures of the insulating films in contact with the oxide semiconductor film 110 and the conductive films 34 and 34*g*. Note that a material similar to the insulating film 118 may be used for the insulating film 106. The use of silicon nitride for the insulating film 106 prevents the gate electrode 104 from being supplied with oxygen diffused from the insulating film 107 and being oxidized.

Hydrogen contained in the oxide semiconductor film reacts with oxygen bonded to a metal atom to be water and also causes an oxygen vacancy in a lattice from which oxygen is released (or a portion from which oxygen is released). Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Accordingly, the conductive film 34 formed in contact with the insulating film containing hydrogen is an oxide semiconductor film that has a higher carrier density than the oxide semiconductor film 110.

Hydrogen in the oxide semiconductor film 110 of the transistor 150 in which a channel region is formed is preferably reduced as much as possible. Specifically, in the oxide semiconductor film 110, the concentration of hydrogen that is measured by SIMS is lower than or equal to $2\times10^{20}$ atoms/cm$^3$, preferably lower than or equal to $5\times10^{19}$ atoms/$cm^3$, more preferably lower than or equal to $1\times10^{19}$ atoms/$cm^3$, more preferably lower than $5\times10^{18}$ atoms/$cm^3$, more preferably lower than or equal to $1\times10^{18}$ atoms/$cm^3$, more preferably lower than or equal to $5\times10^{17}$ atoms/$cm^3$, more preferably lower than or equal to $1\times10^{16}$ atoms/$cm^3$.

The conductive films 34 and 34*g* are each an oxide semiconductor film that has a higher hydrogen concentration and/or a larger number of oxygen vacancies than the oxide semiconductor film 110 and has a lower resistivity than the oxide semiconductor film 110. The hydrogen concentration in the conductive films 34 and 34*g* is higher than or equal to $8\times10^{19}$ atoms/$cm^3$, preferably higher than or equal to $1\times10^{20}$ atoms/$cm^3$, more preferably higher than or equal to $5\times10^{20}$ atoms/$cm^3$. The hydrogen concentration in the conductive films 34 and 34*g* is greater than or equal to 2 times, preferably greater than or equal to 10 times the hydrogen concentration in the oxide semiconductor film 110. The resistivity of the conductive films 34 and 34*g* is preferably greater than or equal to $1\times10^{-8}$ times and less than $1\times10^{-1}$ times the resistivity of the oxide semiconductor film 110. The resistivity of the conductive films 34 and 34*g* is typically higher than or equal to $1\times10^{-3}$ Ωcm and lower than $1\times10^{4}$ Ωcm, preferably higher than or equal to $1\times10^{-3}$ Ωcm and lower than $1\times10^{-1}$ Ωcm.

<Insulating Film>

As each of the insulating films 106 and 107 serving as a gate insulating film of the transistor 150, an insulating film including at least one of the following films formed by a plasma chemical vapor deposition (CVD) method, a sputtering method, or the like can be used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film. Note that the stacked structure of the insulating films 106 and 107 is not necessarily employed, and an insulating film with a single-layer structure selected from the above films may be used.

The insulating film 106 has a function of a blocking film that inhibits penetration of oxygen. For example, in the case where excess oxygen is supplied to the insulating film 107, the insulating film 114, the insulating film 116, and/or the oxide semiconductor film 110, the insulating film 106 can inhibit penetration of oxygen.

Note that the insulating film 107 that is in contact with the oxide semiconductor film 110 serving as a channel region of the transistor 150 is preferably an oxide insulating film and preferably includes a region including oxygen in excess of the stoichiometric composition (an oxygen-excess region). In other words, the insulating film 107 is an insulating film that is capable of releasing oxygen. In order to provide the oxygen-excess region in the insulating film 107, the insulating film 107 is formed in an oxygen atmosphere, for example. Alternatively, the oxygen-excess region may be formed by supplying oxygen to the formed insulating film 107. As a method for supplying oxygen, an ion implantation method, an ion doping method, a plasma immersion ion implantation method, plasma treatment, or the like can be employed.

In the case where hafnium oxide is used for the insulating films 106 and 107, the following effect is attained. Hafnium oxide has a higher dielectric constant than silicon oxide and silicon oxynitride. Therefore, the thicknesses of the insulating films 106 and 107 can be made large as compared with the case where silicon oxide is used; as a result, a leakage current due to a tunnel current can be low. That is, it is possible to provide a transistor with a low off-state current. Moreover, hafnium oxide with a crystalline structure has higher dielectric constant than hafnium oxide with an amorphous structure. Therefore, it is preferable to use hafnium oxide with a crystalline structure in order to provide a transistor with a low off-state current. Examples of the crystalline structure include a monoclinic crystal structure and a cubic crystal structure. Note that one embodiment of the present invention is not limited to the above examples.

In this embodiment, a silicon nitride film is formed as the insulating film 106, and a silicon oxide film is formed as the insulating film 107. The silicon nitride film has a higher dielectric constant than a silicon oxide film and needs a larger thickness for capacitance equivalent to that of the silicon oxide film. Thus, when the silicon nitride film is included as the insulating film 108 serving as the gate insulating film of the transistor 150, the physical thickness of the insulating film can be increased. Therefore, the electrostatic breakdown of the transistor 150 can be prevented by inhibiting a reduction in the withstand voltage of the transistor 150 and improving the withstand voltage of the transistor 150.

<Protective Insulating Film>

As each of the insulating films 114, 116, and 118 serving as a protective insulating film of the transistor 150, an insulating film including at least one of the following films formed by a plasma CVD method, a sputtering method, or the like can be used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film.

Note that the insulating film 114 that is in contact with the oxide semiconductor film 110 serving as a channel region of the transistor 150 is preferably an oxide insulating film capable of releasing oxygen. In other words, the insulating film capable of releasing oxygen is an insulating film that includes a region containing oxygen in excess of that in the stoichiometric composition (oxygen-excess region). In order to provide the oxygen-excess region in the insulating film 114, the insulating film 114 is formed in an oxygen atmosphere, for example. Alternatively, the oxygen-excess region may be formed by supplying oxygen to the formed insulating film 114. As a method for supplying oxygen, an ion implantation method, an ion doping method, a plasma immersion ion implantation method, plasma treatment, or the like can be employed.

The use of the insulating film capable of releasing oxygen as the insulating film 114 can reduce the number of oxygen vacancies in the oxide semiconductor film 110 by transferring oxygen to the oxide semiconductor film 110 serving as the channel region of the transistor 150. For example, the number of oxygen vacancies in the oxide semiconductor film 110 can be reduced by using an insulating film having the following feature: the number of oxygen molecules released from the insulating film by heat treatment at a temperature higher than or equal to 100° C. and lower than or equal to 700° C., or higher than or equal to 100° C. and lower than or equal to 500° C. is greater than or equal to $1.0\times10^{18}$ molecules/$cm^3$ when measured by thermal desorption spectroscopy (hereinafter referred to as TDS).

It is preferable that the number of defects in the insulating film 114 be small, typically the spin density corresponding to a signal that appears at g=2.001 due to a dangling bond of silicon be lower than or equal to $3\times10^{17}$ spins/$cm^3$ by ESR measurement. This is because if the density of defects in the insulating film 114 is high, oxygen is bonded to the defects and the amount of oxygen that permeates the insulating film 114 is decreased. Furthermore, it is preferable that the amount of defects at the interface between the insulating film 114 and the oxide semiconductor film 110 be small and typically, the spin density of a signal that appears at g=1.89 or more and 1.96 or less due to the defect in the oxide semiconductor film 110 be lower than or equal to $1\times10^{17}$ spins/cm$^3$, more preferably lower than or equal to the lower limit of detection by ESR measurement.

Note that all oxygen entering the insulating film 114 from the outside moves to the outside of the insulating film 114 in some cases. Alternatively, some oxygen entering the insulating film 114 from the outside remains in the insulating film 114 in some cases. Furthermore, movement of oxygen occurs in the insulating film 114 in some cases in such a manner that oxygen enters the insulating film 114 from the outside and oxygen contained in the insulating film 114 moves to the outside of the insulating film 114. When an oxide insulating film that is permeable to oxygen is formed as the insulating film 114, oxygen released from the insulating film 216 provided over the insulating film 114 can be moved to the oxide semiconductor film 208 through the insulating film 114.

The insulating film 114 can be formed using an oxide insulating film having a low density of states due to nitrogen oxide. Note that the density of states due to nitrogen oxide can be formed between the energy of the valence band maximum ($E_{v\_os}$) and the energy of the conduction band minimum ($E_{c\_os}$) of the oxide semiconductor film. A silicon oxynitride film that releases less nitrogen oxide, an aluminum oxynitride film that releases less nitrogen oxide, or the like can be used as the oxide insulating film.

Note that a silicon oxynitride film that releases a small amount of nitrogen oxide is a film of which the amount of released ammonia is larger than the amount of released nitrogen oxide in TDS; the amount of released ammonia is typically greater than or equal to $1\times10^{18}$ molecules/cm$^3$ and less than or equal to $5\times10^{19}$ molecules/cm$^3$. The amount of released ammonia corresponds to the released amount caused by heat treatment at a film surface temperature higher than or equal to 50° C. and lower than or equal to 650° C., preferably higher than or equal to 50° C. and lower than or equal to 550° C.

Nitrogen oxide ($NO_x$; x is greater than 0 and less than or equal to 2, preferably greater than or equal to 1 and less than or equal to 2), typically $NO_2$ or NO, forms levels in the insulating film 114, for example. The levels are positioned in the energy gap of the oxide semiconductor film 208. Therefore, when nitrogen oxide is diffused to the interface between the insulating film 114 and the oxide semiconductor film 208, an electron is trapped by the level on the insulating film 114 side. As a result, the trapped electron remains in the vicinity of the interface between the insulating film 114 and the oxide semiconductor film 208; thus, the threshold voltage of the transistor is shifted in the positive direction.

Nitrogen oxide reacts with ammonia and oxygen in heat treatment. Since nitrogen oxide contained in the insulating film 114 reacts with ammonia contained in the insulating film 216 in heat treatment, nitrogen oxide contained in the insulating film 114 is reduced. Therefore, an electron is hardly trapped at the interface between the insulating film 114 and the oxide semiconductor film 208.

In a transistor using the oxide insulating film as the insulating film 114, the shift in threshold voltage can be reduced, which leads to a smaller change in electrical characteristics of the transistor.

Note that in an ESR spectrum obtained at 100 K or lower of the insulating film 114, by heat treatment in a manufacturing process of the transistor, typically heat treatment at a temperature lower than 400° C. or lower than 375° C. (preferably higher than or equal to 340° C. and lower than or equal to 360° C.), a first signal that appears at a g-factor of greater than or equal to 2.037 and less than or equal to 2.039, a second signal that appears at a g-factor of greater than or equal to 2.001 and less than or equal to 2.003, and a third signal that appears at a g-factor of greater than or equal to 1.964 and less than or equal to 1.966 are observed. The split width of the first and second signals and the split width of the second and third signals, which are obtained by ESR measurement using an X-band, are each approximately 5 mT. The sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is less than $1\times10^{18}$ spins/cm$^3$, typically greater than or equal to $1\times10^{17}$ spins/cm$^3$ and less than $1\times10^{18}$ spins/cm$^3$.

In the ESR spectrum at 100 K or lower, the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 correspond to signals attributed to nitrogen oxide ($NO_x$; x is greater than 0 and less than or equal to 2, preferably greater than or equal to 1 and less than or equal to 2). Typical examples of nitrogen oxide include nitrogen monoxide and nitrogen dioxide. In other words, the smaller the sum of the spin densities of the first signal that appears at a g-factor greater than or equal to 2.037 and less than or equal to 2.039, the second signal that appears at a g-factor greater than or equal to 2.001 and less than or equal to 2.003, and the third signal that appears at a g-factor greater than or equal to 1.964 and less than or equal to 1.966 is, the lower the content of nitrogen oxide in the oxide insulating film is.

The nitrogen concentration of the oxide insulating film measured by SIMS is lower than or equal to $6\times10^{20}$ atoms/cm$^3$.

The oxide insulating film is formed by a PECVD method at a substrate temperature higher than or equal to 220° C. and lower than or equal to 350° C. using silane and dinitrogen monoxide, whereby a dense and hard film can be formed.

The insulating film 116 in contact with the insulating film 114 is formed using an oxide insulating film whose oxygen content is in excess of that in the stoichiometric composition. Part of oxygen is released from the oxide insulating film whose oxygen content is in excess of that in the stoichiometric composition by heating. The oxide insulating film whose oxygen content is in excess of that in the stoichiometric composition is an oxide insulating film of which the amount of released oxygen converted into oxygen atoms is greater than or equal to $1.0\times10^{19}$ atoms/cm$^3$, preferably greater than or equal to $3.0\times10^{20}$ atoms/cm$^3$ in TDS. Note that the temperature of the film surface in the TDS is preferably higher than or equal to 100° C. and lower than or equal to 700° C., or higher than or equal to 100° C. and lower than or equal to 500° C.

Furthermore, it is preferable that the amount of defects in the insulating film 116 be small, typically the spin density of a signal that appears at g=2.001 due to a dangling bond of silicon be less than $1.5\times10^{18}$ spins/cm$^3$, preferably less than or equal to $1\times10^{18}$ spins/cm$^3$ by ESR measurement. Note that the insulating film 116 is provided more apart from the oxide semiconductor film 110 than the insulating film 114 is; thus, the insulating film 116 may have higher defect density than the insulating film 114.

The thickness of the insulating film 114 can be greater than or equal to 5 nm and less than or equal to 150 nm, preferably greater than or equal to 5 nm and less than or equal to 50 nm, more preferably greater than or equal to 10 nm and less than or equal to 30 nm. The thickness of the insulating film 116 can be greater than or equal to 30 nm and less than or equal to 500 nm, preferably greater than or equal to 150 nm and less than or equal to 400 nm.

The insulating films 114 and 116 can be formed using insulating films formed of the same kinds of materials; thus, a boundary between the insulating films 114 and 116 cannot be clearly observed in some cases. Thus, in this embodiment, the boundary between the insulating films 114 and 116 is shown by a dashed line. Although a two-layer structure of the insulating films 114 and 116 is described in this embodiment, the present invention is not limited to this. For example, a single-layer structure of the insulating film 114, a single-layer structure of the insulating film 116, or a stacked-layer structure of three or more layers may be used.

The insulating film 118 serving as a dielectric film of the capacitor 160 is preferably a nitride insulating film. The relative dielectric constant of a silicon nitride film is higher than that of a silicon oxide film, and the silicon nitride film needs to have a larger film thickness than the silicon oxide film to obtain a capacitance equivalent to that of the silicon oxide film. Thus, when the silicon nitride film is included in the insulating film 118 serving as the dielectric film of the capacitor 160, the physical thickness of the insulating film can be increased. Accordingly, a reduction in the withstand voltage of the capacitor 160 can be inhibited. Furthermore, the electrostatic breakdown of the capacitor 160 can be prevented by improving the withstand voltage. Note that the insulating film 118 also has a function of decreasing the resistivity of the conductive film 34 that functions as the electrode of the capacitor 160.

The insulating film 118 has a function of blocking oxygen, hydrogen, water, alkali metal, alkaline earth metal, or the like. By providing the insulating film 118, it is possible to prevent outward diffusion of oxygen from the oxide semiconductor film 110, outward diffusion of oxygen contained in the insulating films 114 and 116, and entry of hydrogen, water, or the like into the oxide semiconductor film 110 from the outside. Note that instead of the nitride insulating film having a blocking effect against oxygen, hydrogen, water, alkali metal, alkaline earth metal, and the like, an oxide insulating film having a blocking effect against oxygen, hydrogen, water, and the like, may be provided. As the oxide insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, and a hafnium oxynitride film can be given.

Examples of an insulating material that can be used for a planarization film, an overcoat, a spacer, and the like include a resin such as an acrylic resin or an epoxy resin, a resin having a siloxane bond, and an inorganic insulating material such as silicon oxide, silicon oxynitride, silicon nitride oxide, silicon nitride, or aluminum oxide.

<Adhesive Layer>

For the adhesive layer, a curable resin such as a heat curable resin, a photocurable resin, or a two-component type curable resin can be used. For instance, an acrylic resin, polyurethane, an epoxy resin, or a resin having a siloxane bond can be used.

<Connection Layer>

For the connection layer, an anisotropic conductive film (ACF), an anisotropic conductive paste (ACP), or the like can be used.

<Coloring Film>

Examples of a material that can be used for the coloring film include a metal material, a resin material, and a resin material containing a pigment or dye.

The above is the description of the components.

«Cross-Sectional Structure Example 2»

Figure 28:
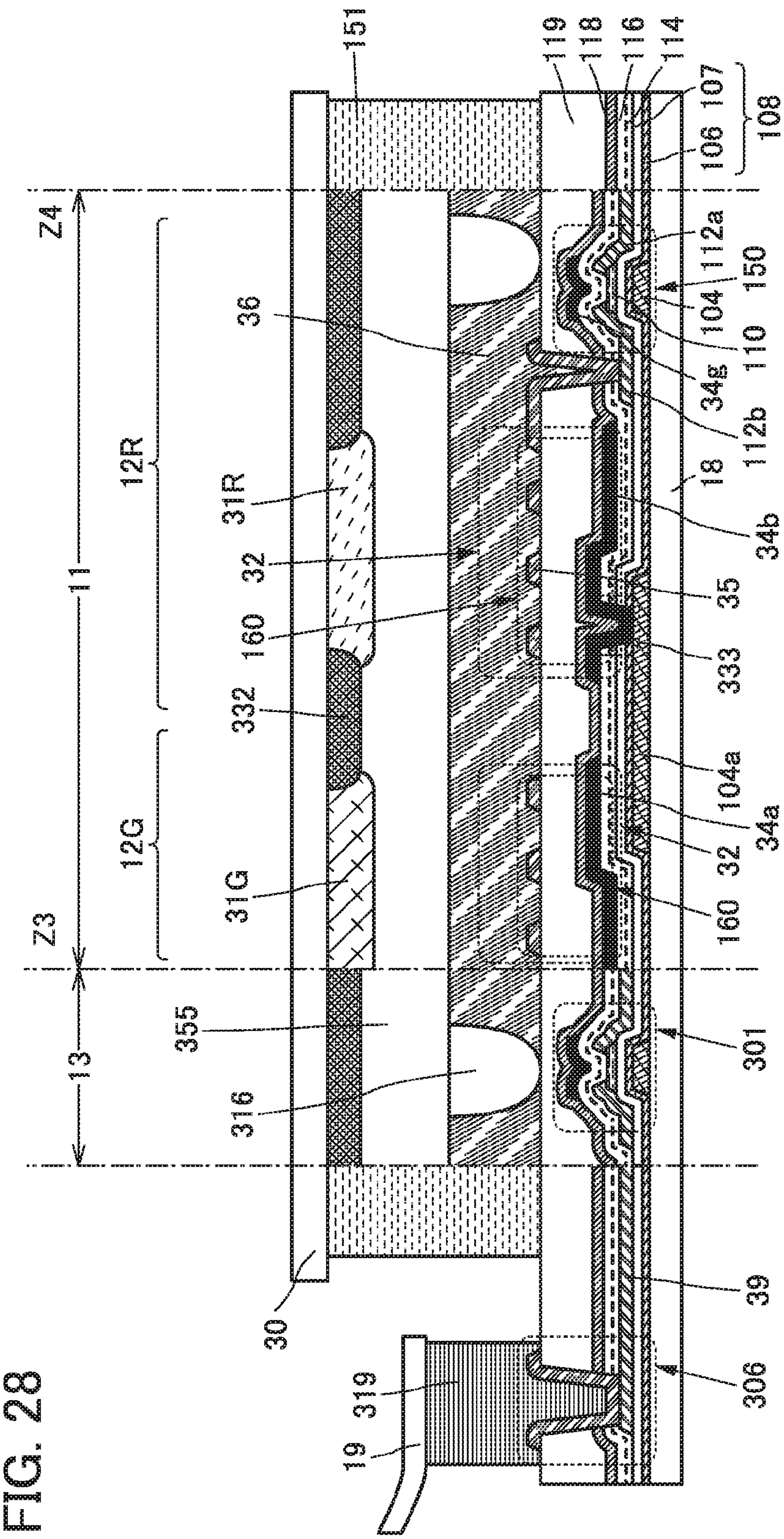
FIG. 28 is a schematic cross-sectional view illustrating a structure example of a display device.

FIG. 28 illustrates a structure example of a cross section of a display device that is partly different from the above-described structure examples. Note that the description of the portions already described is omitted and different portions are described.

FIG. 28 has a structure in which the conductive films 33, 335, and 341 and the FPC 375 are not provided on the display surface side of the substrate 30. The conductive film 34 serving as a common electrode of the liquid crystal element 32 also serves as the pair of electrodes of the touch sensor. Specifically, a conductive film 34*a* that extends in one direction and a conductive film 34*b* that is electrically connected to a conductive film 104*a* extending in the direction orthogonal to the conductive film 34*a* serve as the pair of electrodes of the touch sensor. With such a structure, the steps can be simpler than those of the structure illustrated in FIG. 25. Note that the conductive film 34*b* is electrically connected to the conductive film 104*a* via an opening 333 provided in the insulating films 108, 114, and 116. The conductive film 104*a* can be formed at the same time using the same material as the gate electrode 104.

Figure 29A:
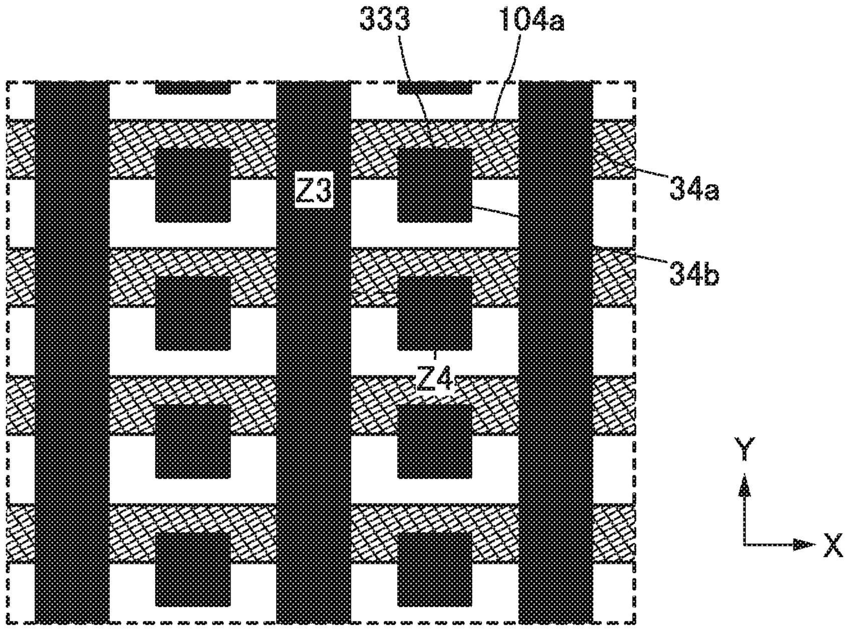
FIGS. 29A and 29B are schematic top views illustrating structure examples of a display device.

Here, the arrangement of the electrodes included in the touch sensor is described. FIG. 29A is a schematic top view of the pair of electrodes of the touch sensor included in the display device illustrated in FIG. 28. The dashed-dotted line Z3-Z4 in FIG. 29A corresponds to the display portion 11 in FIG. 28.

The conductive film 34*a* that is one electrode of the touch sensor extends in the Y direction. The conductive film 34*b* that is the other electrode of the touch sensor is electrically connected to the conductive film 104*a* via the opening 333. The conductive film 104*a* extends in the X direction and intersects the conductive film 34*a*.

Figure 29B:
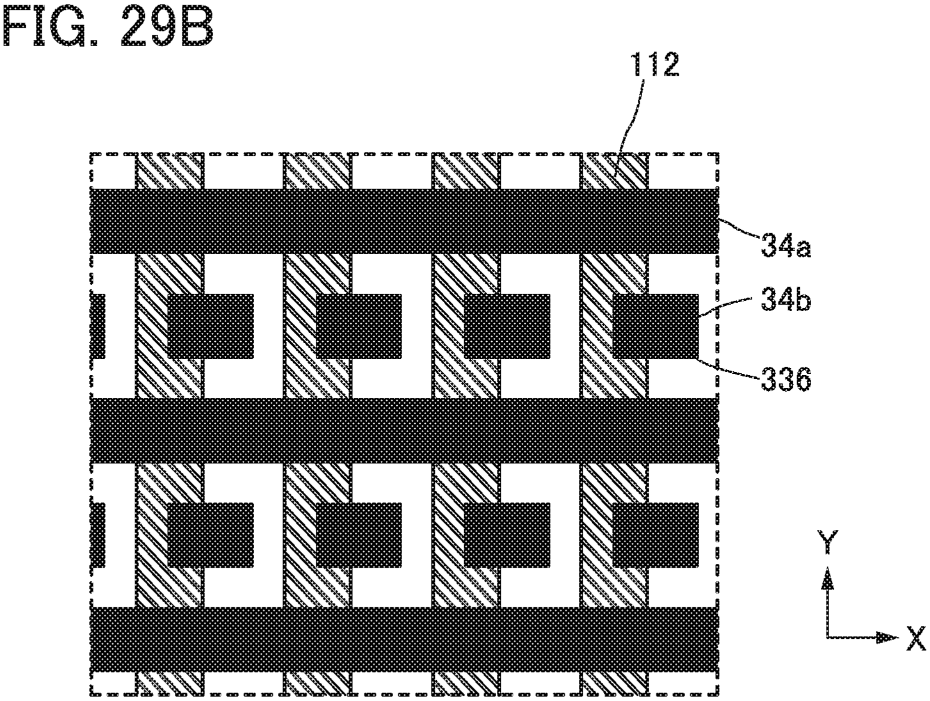

Alternatively, as the conductive film extending in one direction, a conductive film 112 that is formed at the same time using the same material as the source electrode 112*a* and the drain electrode 112*b* may be used instead of the conductive film 104*a* (see FIG. 29B). Note that FIG. 29B shows an example in which the conductive film 34*a* extends in the X direction and the conductive film 112 extends in the Y direction. The conductive film 34*b* is electrically connected to the conductive film 112 via an opening 336 provided in the insulating film 118 (not illustrated).

(Embodiment 6)

In this embodiment, a cross-sectional structure example of the display device of one embodiment will be described with reference to drawings. In this embodiment, an example in which an EL element is used as a display element is described. Note that description of the portions already described in Embodiment 5 is omitted and different portions are described.

«Cross-Sectional Structure Example 1»

Figure 30:
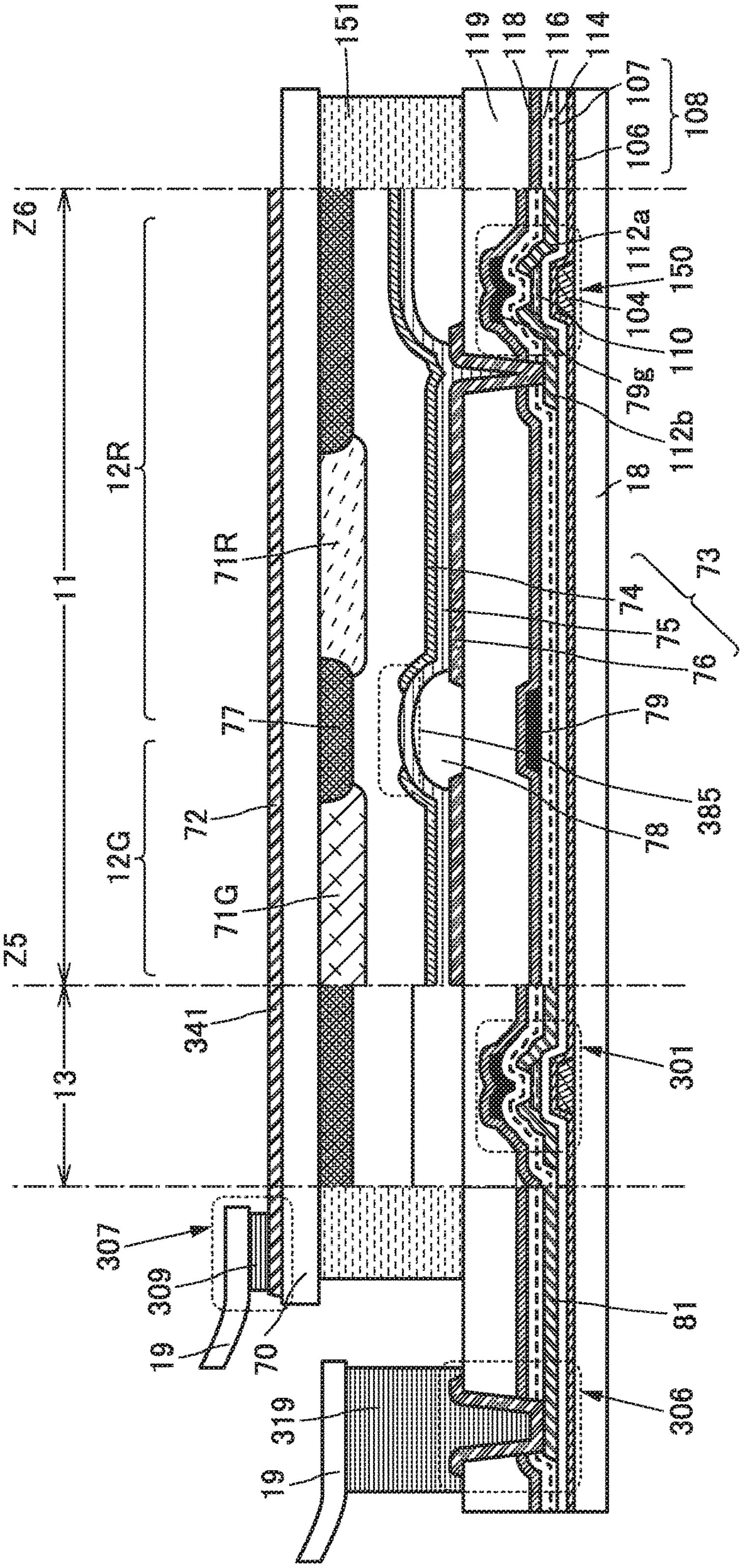
FIG. 30 is a schematic cross-sectional view of a structural example of a display device.

FIG. 30 is a schematic cross-sectional view of a display device. FIG. 30 illustrates cross sections of a region including the FPC 19, a region including the scan line driver circuit 13 (one of the scan line driver circuits 13L and 13R), and a region including the display portion 11 in FIGS. 12A and 12B.

FIG. 30 illustrates the cross section of two pixels as an example of the display portion 11. For example, each of the pixels is a pixel exhibiting a red color, a pixel exhibiting a green color, or a pixel exhibiting a blue color; thus, full-color display can be achieved. In the display portion 11 illustrated in FIG. 30, for example, the pixel 12R includes the transistor 150, the EL element 73, and a coloring film 71R. Furthermore, the pixel 12G includes a transistor that is not illustrated, the EL element 73, and a coloring film 71G.

The display device illustrated in FIG. 30 includes the EL element 73 in the display portion 11. The EL element 73 includes the conductive film 76, the EL layer 75, and the conductive film 74. The conductive film 76 serving as a reflective film is electrically connected to the drain electrode 112*b* of the transistor 150 via an opening provided in the insulating films 114, 116, 118, and 119. The conductive film 74 is also referred to as a lower electrode. A material transmitting visible light is used for the conductive film 74. Moreover, the conductive film 74 may serve as a semi-reflective film. The conductive film 74 can also be referred to as an upper electrode. By applying a voltage between the conductive films 76 and 74, light emitted by a light-emitting layer included in the EL layer 75 can be extracted through a coloring film (e.g., the coloring film 71R) provided in the substrate 70. The display device illustrated in FIG. 30 includes a so-called top-emission display device.

The insulating film 78 serving as a partition is provided over the insulating film 119. The insulating film 119 is provided to overlap with end portions of the conductive films 76 of two adjacent pixels. The EL layer 75 is provided over the conductive film 76 and the insulating film 78. The conductive film 74 is provided over the EL layer 75 to overlap with at least the conductive film 76. For example, in the display device illustrated in FIG. 30, the conductive film 74 includes an opening 385 in a position overlapping with a space between two conductive films 76 of two pixels that are adjacent in one direction.

The conductive film 79 is provided in a position overlapping with the opening 385. The conductive film 79 can be formed at the same time using the same material as the conductive film 79*g* serving as the second gate electrode of the transistor 150; thus, the process can be simplified.

The touch sensor included in the display device is formed using the conductive film 72 that is provided over the substrate 70 and the conductive film 79 that is provided over the substrate 18. With the use of capacitance formed between the conductive film 72 and the conductive film 79, the approach or contact of an object can be sensed.

As an auxiliary electrode of electrodes of the touch sensor, a conductive film may be formed in contact with the conductive film 79. For example, a conductive film may be formed in a position overlapping with the light-blocking film 77 using a material similar to that of the gate electrode 104 or that of the source electrode 112*a* and the drain electrode 112*b*. Since the auxiliary electrode overlaps with the light-blocking film 77, delay of signal transmission for detection by the touch sensor can be reduced while the aperture ratio of the pixel is maintained.

As the conductive film 79, an oxide semiconductor film with low resistivity is preferably used. In addition, the oxide semiconductor film 110 and the conductive film 79 preferably contain the same metal element. When the oxide semiconductor film 110 and the conductive film 79 each contain the same metal element, a common manufacturing apparatus (e.g., a deposition apparatus or a processing apparatus) can be used and accordingly the manufacturing cost can be reduced.

Note that in FIG. 30, the conductive film 79*g* is provided to overlap with the oxide semiconductor film 110. The conductive film 79*g* is formed at the same time using the same deposition step and the same etching step as the conductive film 79. The conductive film 79*g* serves as the second gate electrode of the transistor 150. In that case, the insulating films 114 and 116 serve as gate insulating films for the second gate electrode. In other words, the transistor 150 includes the insulating films 114 and 116 provided over the oxide semiconductor film 110, the source electrode 112*a*, and the drain electrode 112*b* and the conductive film 79*g* provided over the insulating films 114 and 116 to overlap with the oxide semiconductor film 110.

Since the conductive film 79*g* is formed at the same time using the same deposition step and the same etching step as the conductive film 79, an increase in the number of steps can be prevented. Note that one embodiment of the present invention is not limited to these examples. The conductive film 79*g* can be formed in a step different from the conductive film 79. The conductive film 79*g* may be connected to the gate electrode 104. Alternatively, the conductive film 79*g* may be supplied with a signal or potential different from the signal or potential supplied to the gate electrode 104 without being connected to the gate electrode 104.

Note that the oxide semiconductor film 110 has higher resistivity than the conductive film 79 because it is used as the channel region in the transistor 150. The conductive film 79 has lower resistivity than the oxide semiconductor film 110 because it serves as an electrode. The description of Embodiment 5 can be referred to for a method of controlling the resistivity of the oxide semiconductor film 110 and the resistivity of the conductive film 79.

The coloring film 71R, the coloring film 71G, the light-blocking film 77, and the like are provided on a surface of the substrate 70 that is on the substrate 18 side. The conductive film 72, the conductive film 341, and the like are provided on the surface of the substrate 70 that is the side opposite to the substrate 18. The connection portion 307 is provided in a region near an end of the substrate 70. In the connection portion 307, the conductive film 341 is electrically connected to the FPC 19 through the connection layer 309.

A substrate that an object such as a finger or a stylus directly touches may be provided above the conductive film 72 and the substrate 70. In that case, a polarizing plate or a circularly polarizing plate is preferably provided between the substrate 70 and the substrate. In that case, the above substrate is preferably provided with a protective layer. The protective layer can be formed using an inorganic insulating material such as silicon oxide, aluminum oxide, yttrium oxide, or yttria-stabilized zirconia. In addition, tempered glass may be used for the above substrate. The tempered glass that can be used here is one that has been subjected to physical or chemical treatment by an ion exchange method, a thermal tempering method, or the like and has a surface to which compressive stress has been applied.

Figure 31:
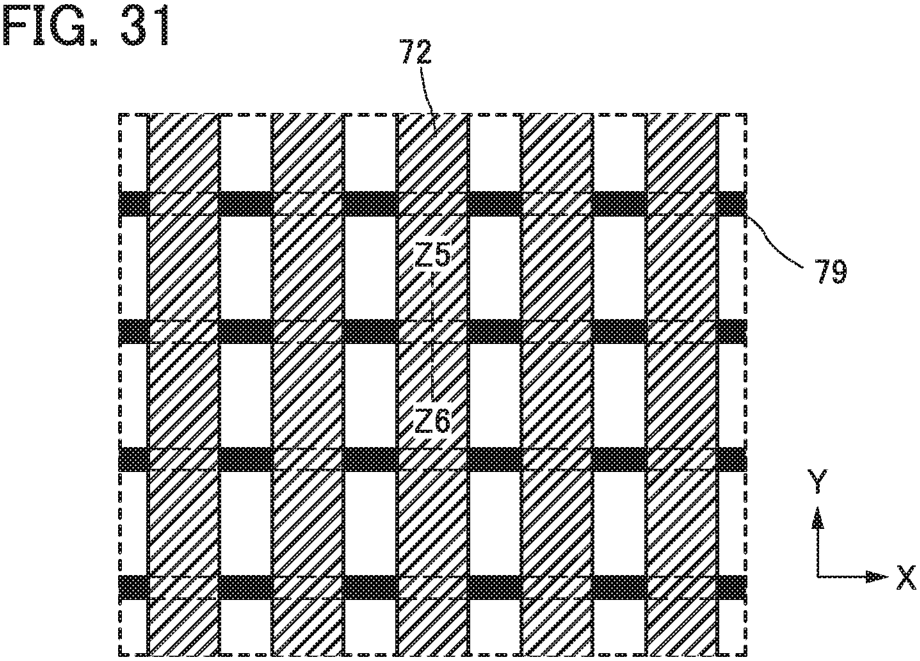
FIG. 31 is a schematic top view illustrating a structure example of a display device.

Here, the arrangement of the electrodes included in the touch sensor is described. FIG. 31 is a schematic top view of the pair of electrodes of the touch sensor included in the display device illustrated in FIG. 30. The dashed-dotted line Z5-Z6 in FIG. 31 corresponds to the display portion 11 in FIG. 30.

The conductive film 72 that is one electrode of the touch sensor extends in the Y direction. The conductive film 79 that is the other electrode of the touch sensor extends in the X direction and intersects the conductive film 72. Note that the conductive film 72 may extend in the X direction and the conductive film 79 may extend in the Y direction.

In the display device, the substrate 18 and the substrate 70 are attached to each other with the sealing material 151. A region surrounded by the substrate 18, the substrate 70, and the sealing material 151 is a hollow, and is preferably filled with an inert gas such as nitrogen or argon. The region may be filled with a sealant. For the sealant, a polyvinyl chloride (PVC) resin, an acrylic resin, a polyimide resin, an epoxy resin, a silicone resin, a polyvinyl butyral (PVB) resin, an ethylene vinyl acetate (EVA) resin, or the like can be used. A drying agent may be contained in the resin. In the display device, an insulating film functioning as an overcoat may be provided to be in contact with the coloring films 71R and 71G and the light-blocking film 77.

Figure 32:
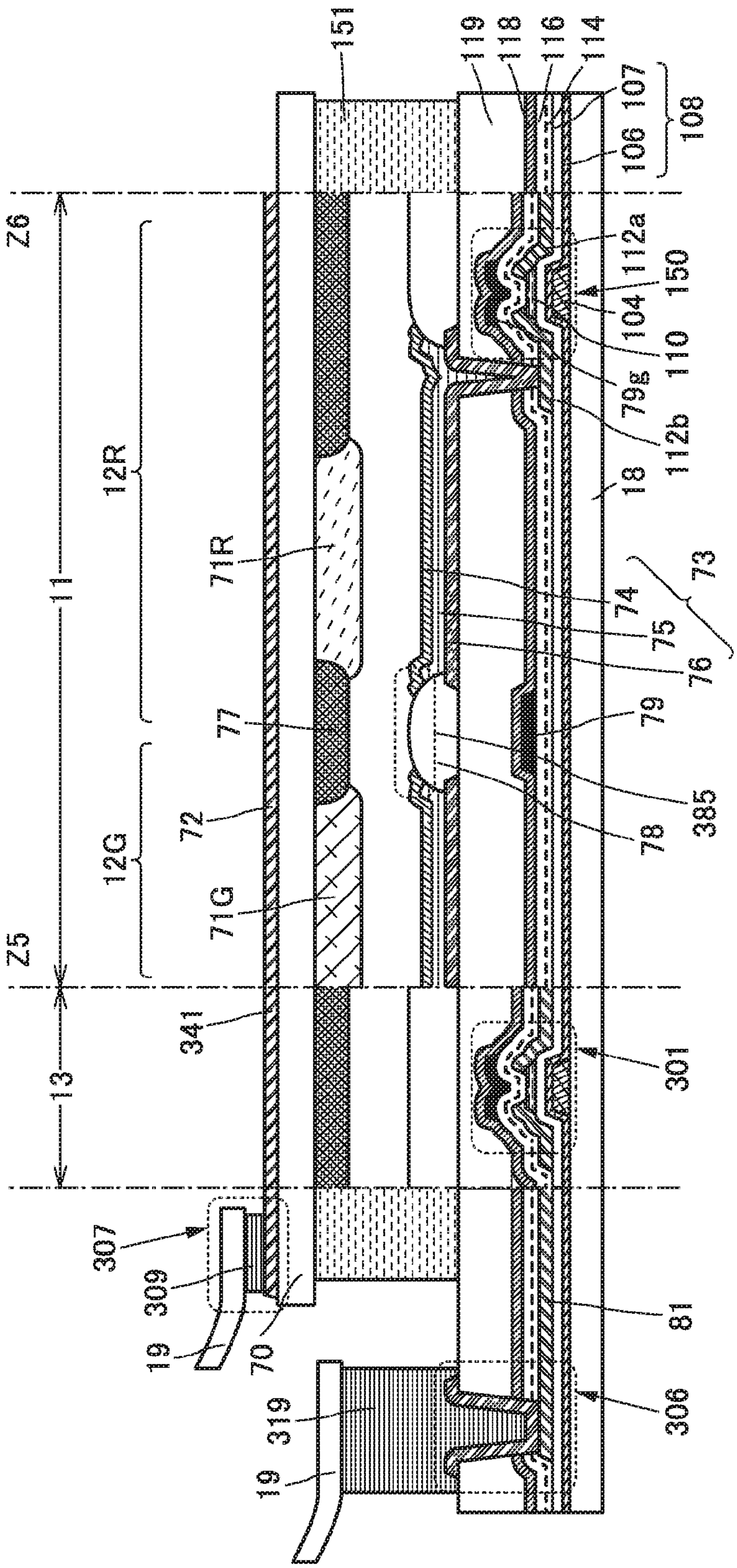
FIG. 32 is a schematic cross-sectional view illustrating a structure example of a display device.

The EL layer 75 is shared by a plurality of pixels in the EL element 73 in FIG. 30; however, the EL layer 75 may be provided for each pixel (see FIG. 32). In this case, the EL layer 75 including a light-emitting layer emitting light whose color corresponds to emission color required by a pixel may be provided for each pixel. A structure without a coloring film (e.g., the coloring films 71R and 71G) may be employed.

<EL Element>

The EL element 73 is described in detail. In the EL element 73 illustrated in FIG. 42A, the EL layer 75 is sandwiched between a pair of electrodes (the conductive film 76 and the conductive film 74). Note that in FIGS. 42A and 42B, the conductive film 76 functions as an anode and the conductive film 74 functions as a cathode.

The EL layer 75 includes at least a light-emitting layer and may have a stacked-layer structure including a functional layer other than the light-emitting layer. As the functional layer other than the light-emitting layer, a layer containing a substance having a high hole-injection property, a substance having a high hole-transport property, a substance having a high electron-transport property, a substance having a high electron-injection property, a bipolar substance (a substance having high electron and hole transport properties), or the like can be used. Specifically, functional layers such as a hole-injection layer, a hole-transport layer, an electron-transport layer, and an electron-injection layer can be used in appropriate combination.

Figure 42A:
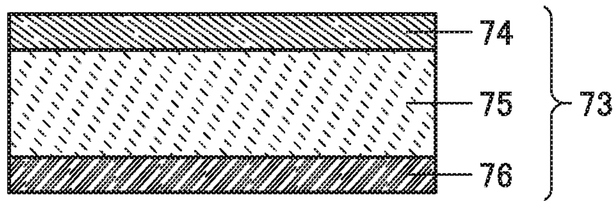
FIGS. 42A and 42B are schematic views each illustrating a structure example of an EL element.

The EL element 73 illustrated in FIG. 42A emits light when current flows by applying a potential difference between the conductive films 76 and 74 and holes and electrons are recombined in the EL layer 75. In other words, a light-emitting region is formed in the EL layer 75.

Figure 42B:
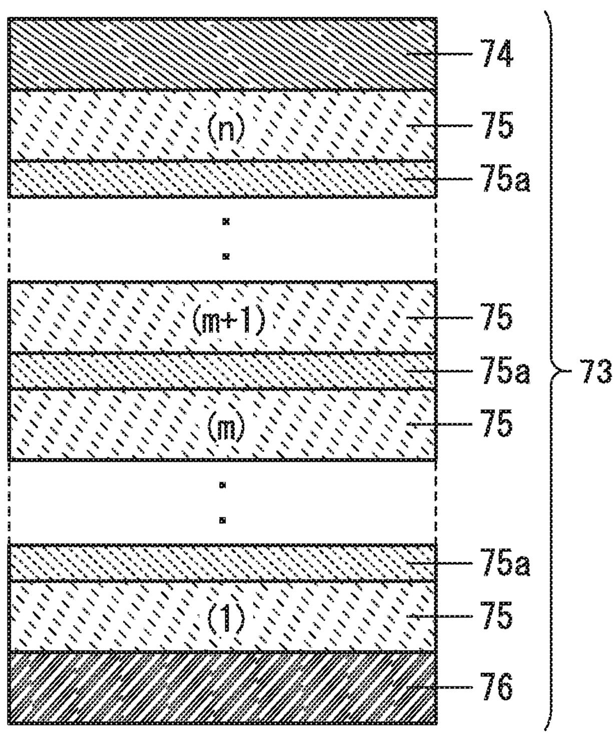

Note that a plurality of EL layers 75 may be stacked between the conductive films 76 and 74 as illustrated in FIG. 42B. In the case where n (n is a natural number of 2 or more) layers are stacked, an electric charge generation layer 75*a* is preferably provided between an m-th EL layer 75 and an (m+1)th EL layer 75. Note that m is a natural number greater than or equal to 1 and less than n.

The electric charge generation layer 75*a* can be formed using, for example, a composite material of an organic compound and a metal oxide. Examples of the metal oxide are vanadium oxide, molybdenum oxide, tungsten oxide, or the like. As the organic compound, a variety of compounds can be used; for example, an aromatic amine compound, a carbazole derivative, an aromatic hydrocarbon, and an oligomer, a dendrimer, and a polymer having a basic skeleton of these compounds can be used. Note that as the organic compound, it is preferable to use an organic compound that has a hole-transport property and has a hole mobility of $10^{-6}$ $cm^2/Vs$ or higher. However, other substances may be used as long as their hole-transport properties are higher than their electron-transport properties. These materials used for the electric charge generation layer 75*a* have excellent carrier-injection properties and carrier-transport properties; thus, the EL element 73 can be driven with low current and with low voltage. Other than the composite material, a material obtained by adding an alkali metal, an alkaline earth metal, a compound of the alkali metal, a compound of the alkaline earth metal, or the like to the composite material can be used for the electric charge generation layer 75*a*.

Note that the electric charge generation layer 75*a* may be formed by a combination of a composite material of an organic compound and a metal oxide with another material. For example, the electric charge generation layer 75*a* may be formed by a combination of a layer containing the composite material of an organic compound and a metal oxide with a layer containing one compound selected from electron-donating substances and a compound having a high electron-transport property. Furthermore, the electric charge generation layer 75*a* may be formed by a combination of a layer containing the composite material of an organic compound and a metal oxide with a transparent conductive film.

The EL element 73 having such a structure is unlikely to result in energy transfer between the neighboring EL layers 75 and can easily realize high emission efficiency and a long lifetime. Furthermore, it is easy to obtain phosphorescence from one light-emitting layer and fluorescence from the other light-emitting layer.

The electric charge generation layer 75*a* has a function of injecting holes to one of the EL layers 75 that is in contact with the electric charge generation layer 75*a* and a function of injecting electrons to the other EL layer 75 that is in contact with the electric charge generation layer 75*a*, when voltage is applied to the conductive films 76 and 74.

The EL element 73 illustrated in FIG. 42B can provide a variety of emission colors by changing the type of the light-emitting substance used for the EL layers 75. In addition, a plurality of light-emitting substances having different emission colors may be used as the light-emitting substances, so that light emission having a broad spectrum or white light emission can be obtained.

In the case of obtaining white light emission using the EL element 73 in FIG. 42B, as for a combination of a plurality of EL layers, a structure for emitting white light including red light, blue light, and green light may be used. For example, the structure may include an EL layer containing a blue fluorescent substance as a light-emitting substance and an EL layer containing green and red phosphorescent substances as light-emitting substances. Alternatively, the structure may include an EL layer emitting red light, an EL layer emitting green light, and an EL layer emitting blue light. Further alternatively, with a structure including EL layers emitting light of complementary colors, white light emission can be obtained. In a stacked-layer element including two EL layers that emit lights with complementary colors, the combinations of colors are as follows: blue and yellow, blue-green and red, and the like.

Note that in the structure of the above stacked-layer element, by providing the electric charge generation layer between the stacked light-emitting layers, the element can exhibit light emission with high luminance at a low current density, and have a long lifetime.

«Cross-Sectional Structure Example 2»

Figure 33:
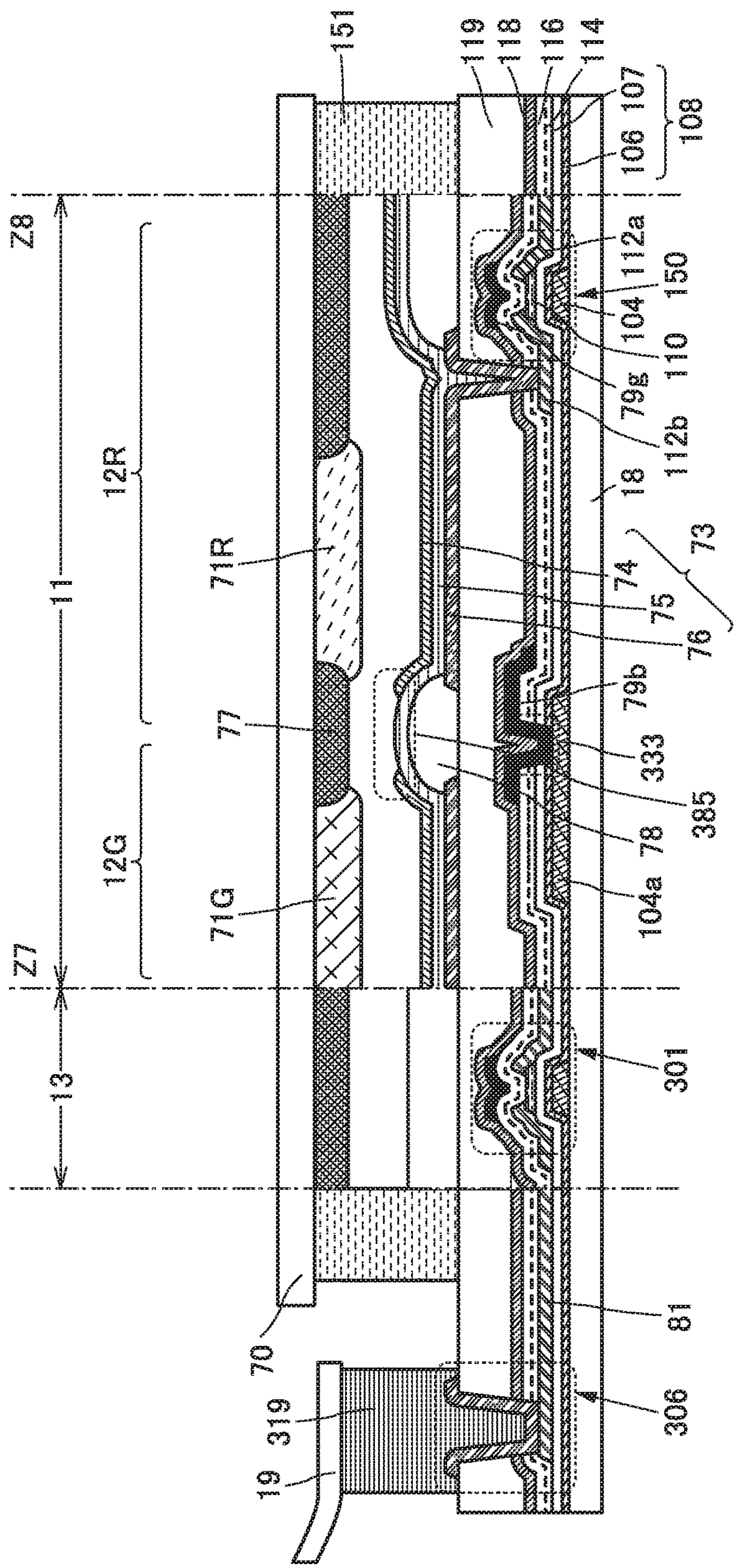
FIG. 33 is a schematic cross-sectional view illustrating a structure example of a display device.

FIG. 33 illustrates a structure example of a cross section of a touch panel that is partly different from the structure of FIG. 30. Note that the description of the portions already described is omitted and different portions are described.

FIG. 33 has a structure in which the conductive films 72 and 341 and the FPC 19 are not provided on the display surface side of the substrate 70. The conductive film 79 serves as the pair of electrodes of the touch sensor. Specifically, the conductive film 79*a* (not illustrated) that extends in one direction and the conductive film 79*b* that is electrically connected to the conductive film 104*a* extending in the direction orthogonal to the conductive film 79*a* serve as the pair of electrodes of the touch sensor. With such a structure, the steps can be simpler than those of the structure illustrated in FIG. 30. Note that the conductive film 79*b* is electrically connected to the conductive film 104*a* via the opening 333 provided in the insulating films 108, 114, and 116. The conductive film 104*a* can be formed in the same step as the gate electrode 104.

Figure 34:
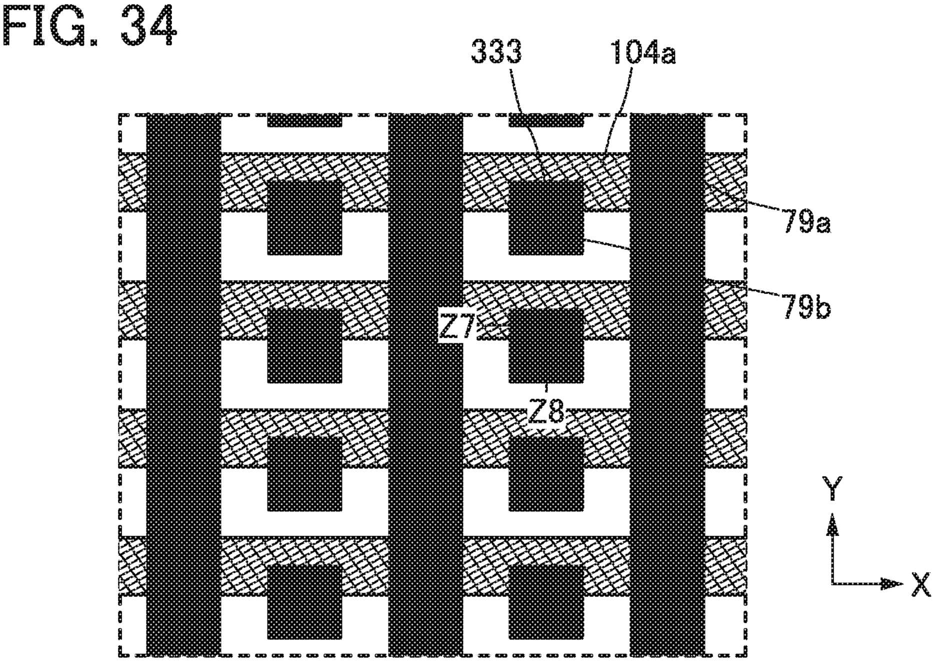
FIG. 34 is a schematic top view illustrating a structure example of a display device.

Here, the arrangement of the electrodes included in the touch sensor is described. FIG. 34 is a schematic top view of the pair of electrodes of the touch sensor included in the display device illustrated in FIG. 33. The dashed-dotted line Z7-Z8 in FIG. 34 corresponds to the display portion 11 in FIG. 33.

The conductive film 79*a* that is one electrode of the touch sensor extends in the Y direction. The conductive film 79*b* that is the other electrode of the touch sensor is electrically connected to the conductive film 104*a* via the opening 333. The conductive film 104*a* extends in the X direction and intersects the conductive film 79*a*.

Figure 35:
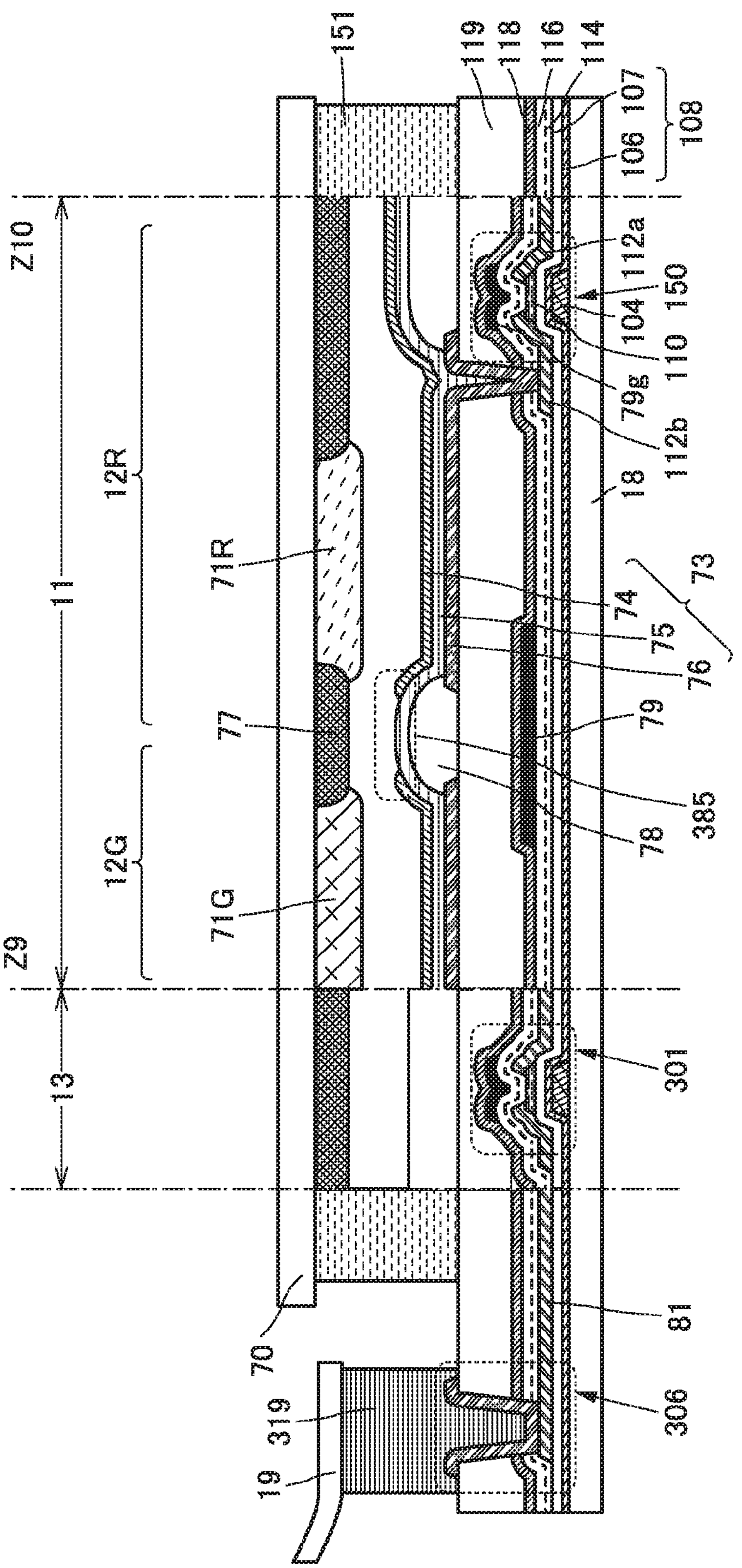
FIG. 35 is a schematic cross-sectional view illustrating a structure example of a display device.
Figure 36:
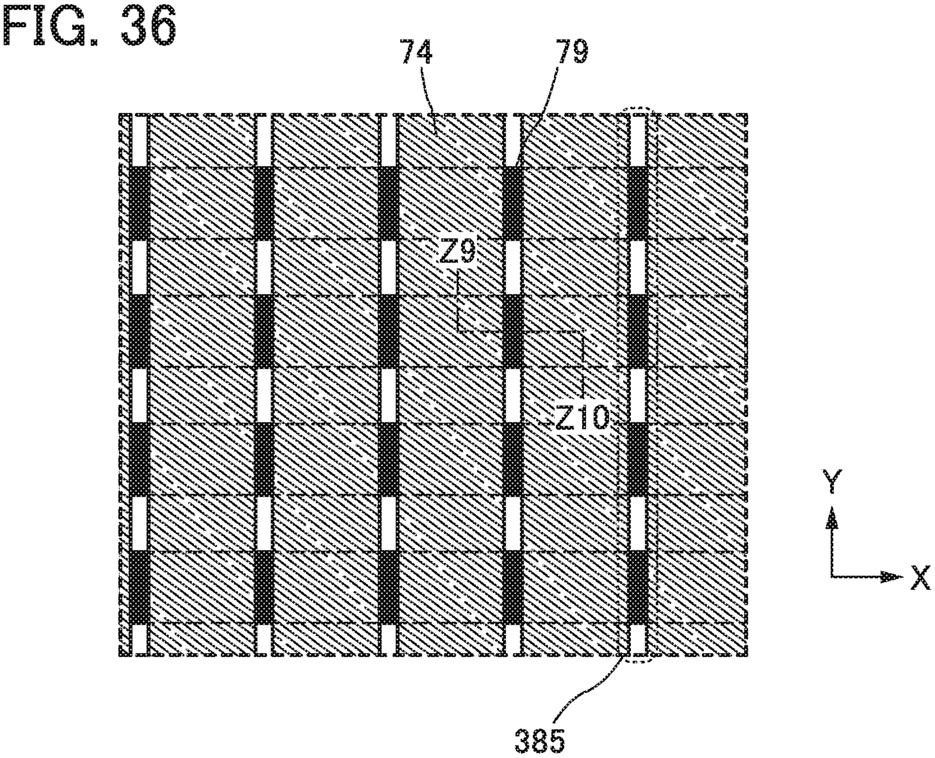
FIG. 36 is a schematic top view illustrating a structure example of a display device.

The conductive film 74 serving as one electrode of the EL element 73 may serve as the other electrode of the touch sensor. In the display device in FIG. 35, the conductive film 79 that is the one electrode of the touch sensor extends in the X direction. The conductive film 74 extends in the Y direction and intersects the conductive film 79. FIG. 36 is a schematic top view of the pair of electrodes of the touch sensor included in the display device illustrated in FIG. 35. The dashed-dotted line Z9-Z10 in FIG. 36 corresponds to the display portion 11 in FIG. 35. The opening 385 included in the conductive film 74 extends in the direction orthogonal to the direction in which the conductive film 79 extends. Part of the opening 385 overlaps with the conductive film 79.

«Cross-Sectional Structure Example 3»

Figure 37:
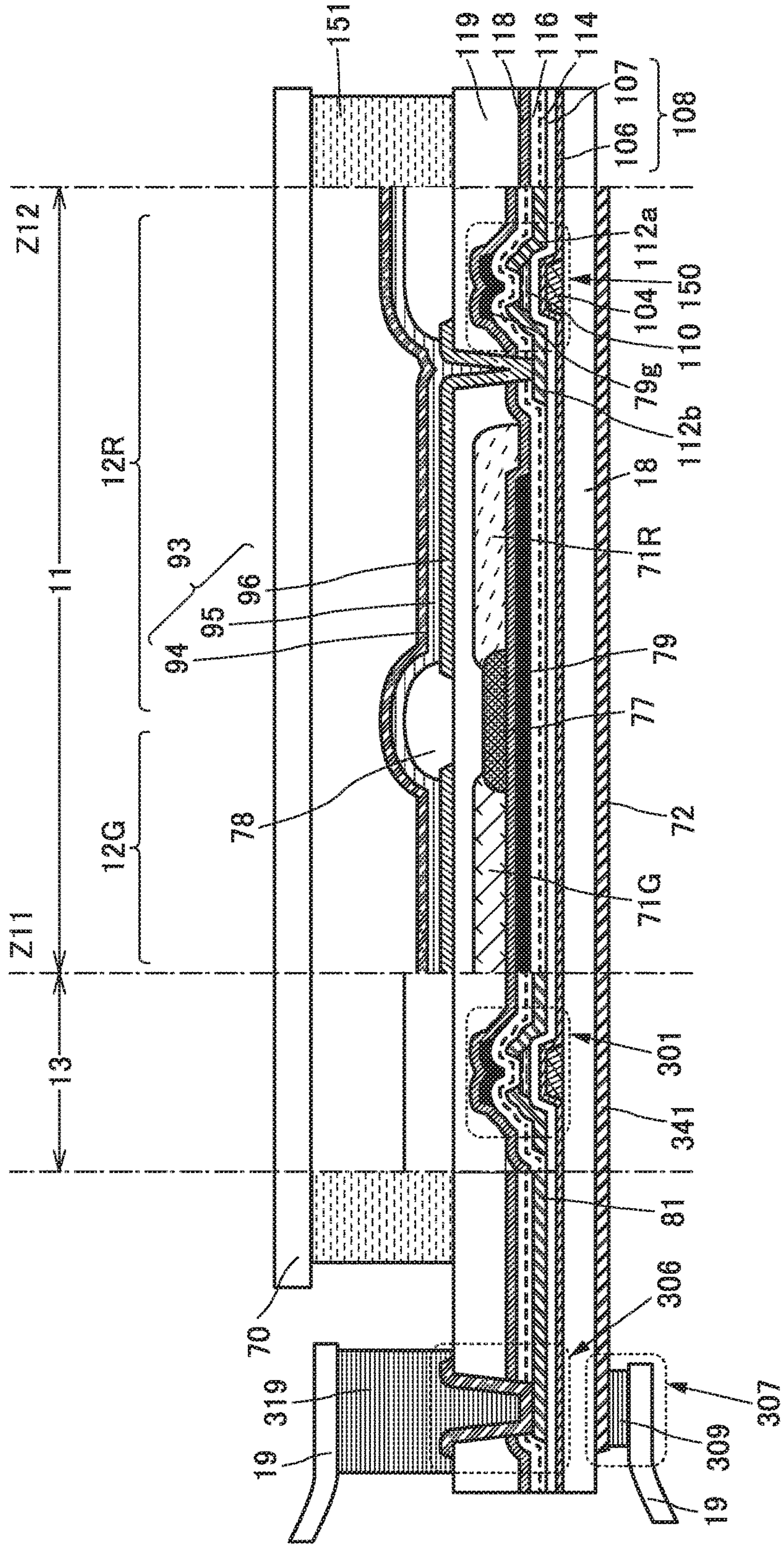
FIG. 37 is a schematic cross-sectional view illustrating a structure example of a display device.

FIG. 37 illustrates a cross-sectional structure example of a touch panel that partly differs from the above-described structure examples. Note that description of the portions already described is omitted and different portions are described.

A display device illustrated in FIG. 37 includes the EL element 93 in the display portion 11. The EL element 93 includes the conductive film 96, the EL layer 95, and the conductive film 94. The conductive film 96 is electrically connected to the drain electrode 112*b* of the transistor 150 via an opening provided in the insulating films 114, 116, 118, and 119. A material transmitting visible light is used for the conductive film 96. Moreover, the conductive film 96 may serve as a semi-reflective film. The conductive film 94 serves as a reflective film. By applying a voltage between the conductive films 96 and 94, light emitted by a light-emitting layer included in the EL layer 95 can be extracted through a coloring film (e.g., the coloring film 71R) provided in the substrate 18. The display device illustrated in FIG. 37 includes a display device having a so-called bottom-emission structure. The description of FIGS. 42A and 42B can be referred to for the details of the EL element 93 by replacing the EL element 73, the conductive film 74, the EL layer 75, and the conductive film 76 with the EL element 93, the conductive film 94, the EL layer 95, and the conductive film 96, respectively, in FIGS. 42A and 42B.

The light-blocking film 77 and the coloring films 71R and 71G are provided over the insulating film 118. The light-blocking film 77 is provided in a position overlapping with the insulating film 78. The coloring films 71R and 71G are provided in a position overlapping with the conductive film 96. The EL layer 95 and the conductive film 94 are provided in this order over the conductive film 96.

The conductive films 72 and 341 and the FPC 19 are provided on the display surface side (the side opposite to the substrate 70) of the substrate 18. A touch sensor included in the display device is formed using the conductive film 72 and the conductive film 79 that serve as a pair of electrodes. With the conductive film 72 provided on the display surface side of the substrate 18, another conductive film (e.g., the conductive film 96 and the conductive film 94) is not interposed between the pair of electrodes. The conductive film 79 transmits visible light and thus can be provided in a region overlapping with the conductive film 96 through which light emitted from the EL element 93 passes. Accordingly, the conductive film 79 can be provided in a large area; thus, the capacitance of the touch sensor can be large.

Figure 38:
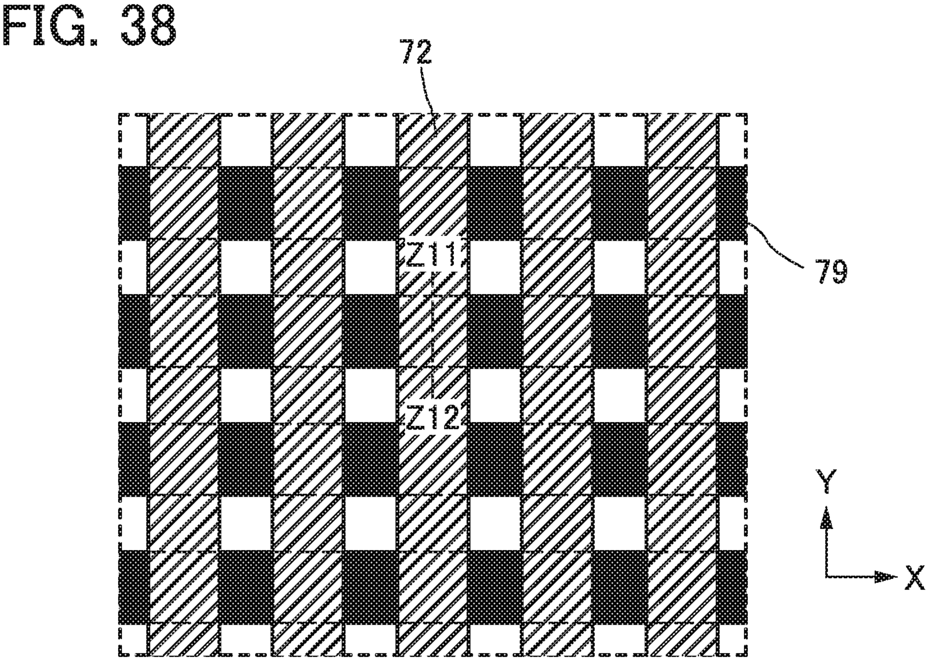
FIG. 38 is a schematic top view illustrating a structure example of a display device.

Here, the arrangement of the electrodes included in the touch sensor is described. FIG. 38 is a schematic top view of the pair of electrodes of the touch sensor included in the display device illustrated in FIG. 37. The dashed-dotted line Z11-Z12 in FIG. 38 corresponds to the display portion 11 in FIG. 37.

The conductive film 72 that is one electrode of the touch sensor extends in the Y direction. The conductive film 79 that is the other electrode of the touch sensor extends in the X direction and intersects the conductive film 72. Note that the conductive film 72 may extend in the X direction and the conductive film 79 may extend in the Y direction.

Figure 39:
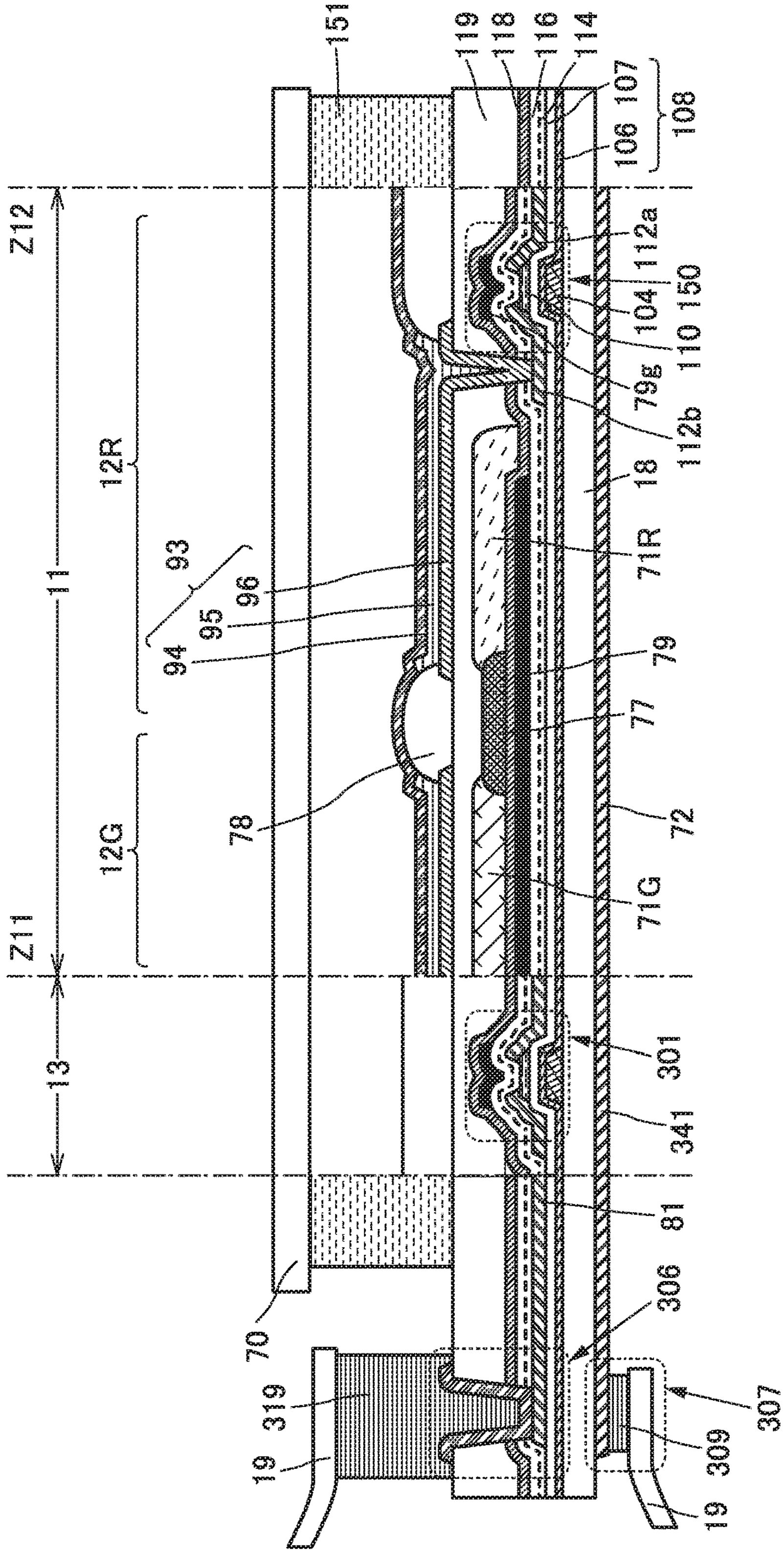
FIG. 39 is a schematic cross-sectional view illustrating a structure example of a display device.

Although the EL layer 95 is shared by a plurality of pixels in the EL element 93 in FIG. 37, the EL layer 95 may be provided for each pixel (see FIG. 39). In this case, the EL layer 95 including a light-emitting layer emitting light whose color corresponds to color required to a pixel may be provided for each pixel. A structure without a coloring film (e.g., the coloring films 71R and 71G) may be employed.

«Cross-Sectional Structure Example 4»

Figure 40:
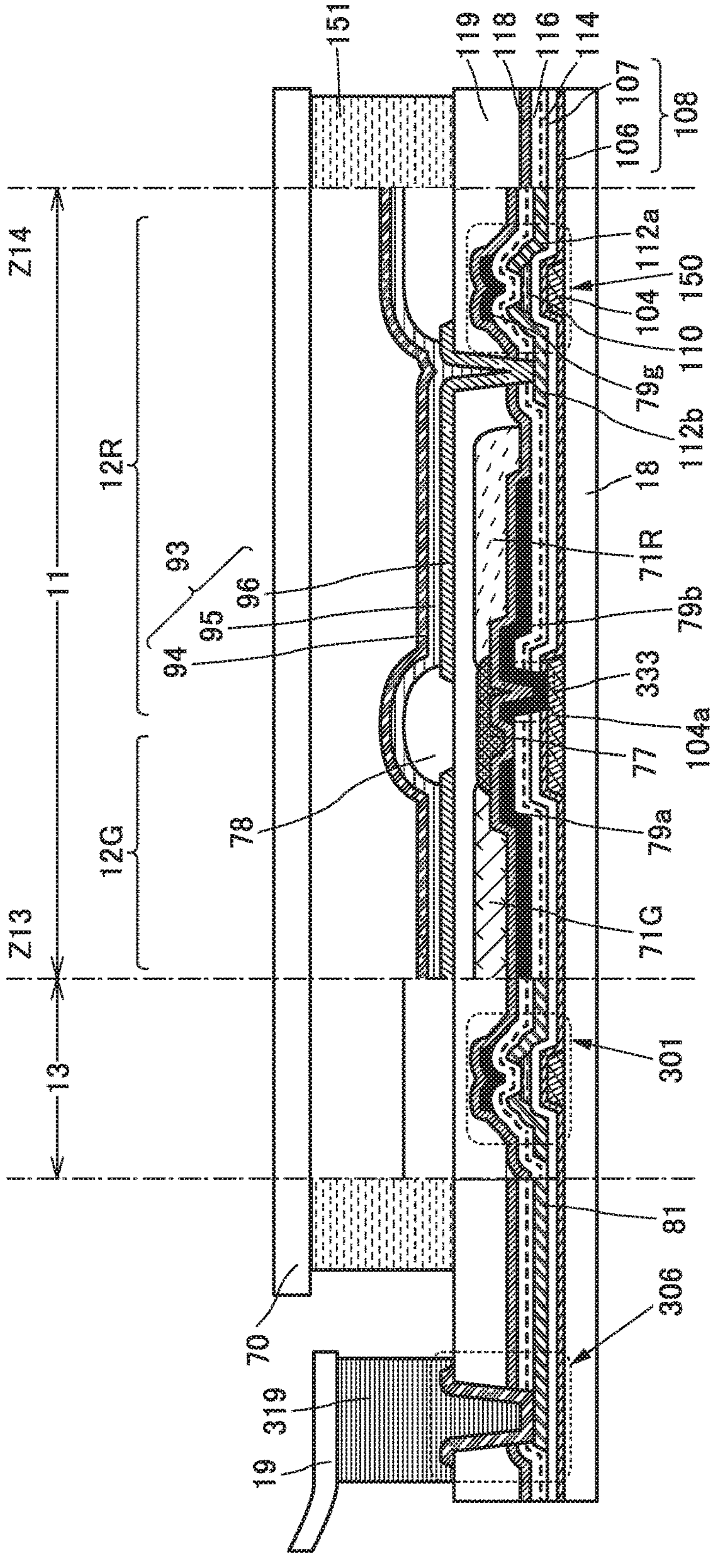
FIG. 40 is a schematic cross-sectional view illustrating a structure example of a display device.

FIG. 40 illustrates a cross-sectional structure example of a touch panel that partly differs from the structure of FIG. 37. Note that description of the portions already described is omitted and different portions are described.

FIG. 40 has a structure in which the conductive films 72 and 341 and the FPC 19 are not provided on the display surface side of the substrate 18. The conductive film 79 serves as the pair of electrodes of the touch sensor. Specifically, the conductive film 79*a* that extends in one direction and the conductive film 79*b* that is electrically connected to the conductive film 104*a* extending in the direction orthogonal to the conductive film 79*a* serve as the pair of electrodes of the touch sensor. With such a structure, the steps can be simpler than those of the structure illustrated in FIG. 37. Note that the conductive film 79*b* is electrically connected to the conductive film 104*a* via the opening 333 provided in the insulating films 108, 114, and 116. The conductive film 104*a* can be formed through the same step as the gate electrode 104. It is preferable that the conductive film 104*a* be provided in a region overlapping with the light-blocking film

77 because the pair of electrodes of the touch sensor is formed with the aperture ratio of the pixel maintained.

Figure 41:
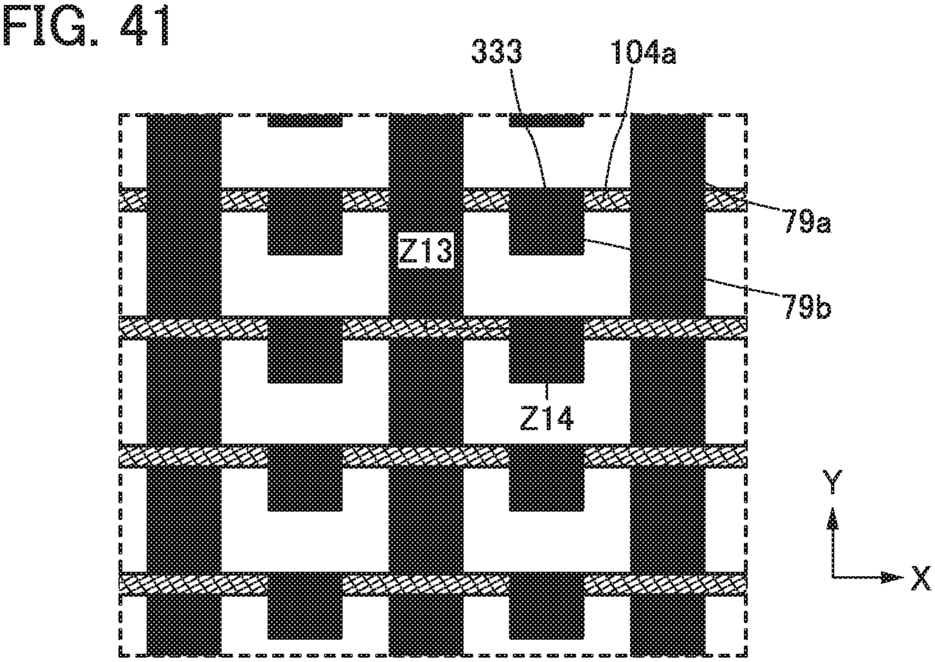
FIG. 41 is a schematic top view illustrating a structure example of a display device.

Here, the arrangement of the electrodes included in the touch sensor is described. FIG. 41 is a schematic top view of the pair of electrodes of the touch sensor included in the display device illustrated in FIG. 40. The dashed-dotted line Z13-Z14 in FIG. 41 corresponds to the display portion 11 in FIG. 40.

The conductive film 79*a* that is one electrode of the touch sensor extends in the Y direction. The conductive film 79*b* that is the other electrode of the touch sensor is electrically connected to the conductive film 104*a* via the opening 333. The conductive film 104*a* extends in the X direction and intersects the conductive film 79*a*.

(Embodiment 7)

In this embodiment, examples of an electronic device that can be formed using the display device of one embodiment of the present invention are described.

FIGS. 43A to 43H and FIGS. 44A and 44B illustrate electronic devices. These electronic devices can each include a housing 5000, a display portion 5001, a speaker 5003, an LED lamp 5004, operation keys 5005 (including a power switch or an operation switch), a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), a microphone 5008, and the like.

Figure 43A:
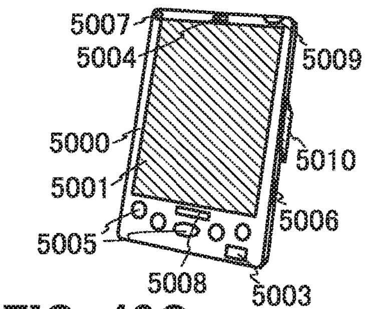
FIGS. 43A to 43H are perspective views each illustrating an example of an electronic device.

FIG. 43A illustrates a mobile computer, which can include a switch 5009, an infrared port 5010, and the like in addition to the above components.

Figure 43B:
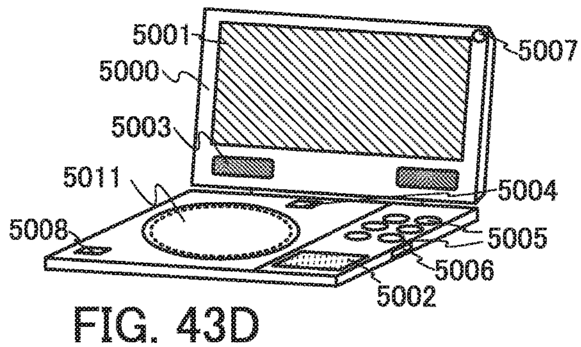

FIG. 43B illustrates a portable image reproducing device provided with a recording medium (e.g., a DVD reproducing device), which can include a second display portion 5002, a recording medium reading portion 5011, and the like in addition to the above components.

Figure 43C:
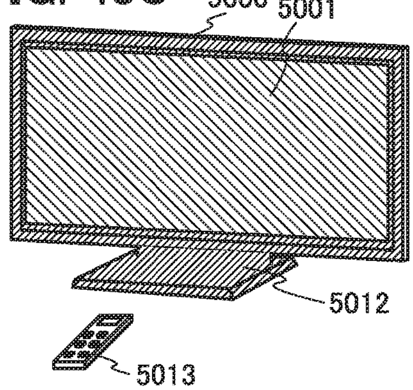

FIG. 43C illustrates a television device, which can include a stand 5012 and the like in addition to the above components. The television device can be operated by an operation switch of the housing 5000 or a separate remote controller 5013. With operation keys of the remote controller 5013, channels and volume can be controlled, and images displayed on the display portion 5001 can be controlled. The remote controller 5013 may be provided with a display portion for displaying data output from the remote controller 5013.

Figure 43D:
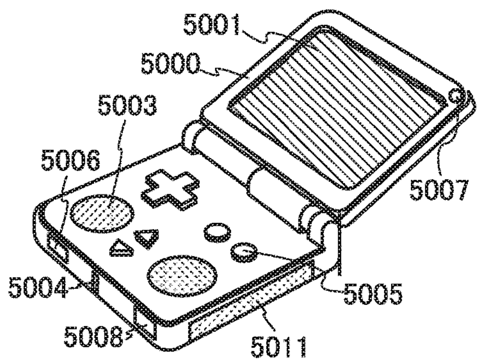

FIG. 43D illustrates a portable game machine, which can include the recording medium reading portion 5011 and the like in addition to the above components.

Figure 43E:
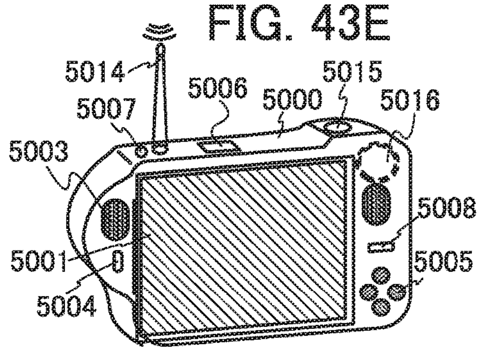

FIG. 43E illustrates a digital camera that has a television reception function and can include an antenna 5014, a shutter button 5015, an image receiving portion 5016, and the like in addition to the above components.

Figure 43F:
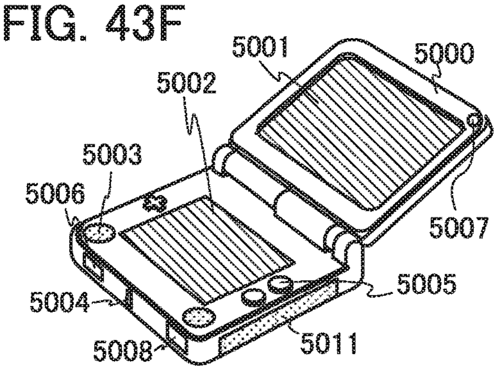

FIG. 43F illustrates a portable game machine, which can include the second display portion 5002, the recording medium reading portion 5011, and the like in addition to the above components.

Figure 43G:
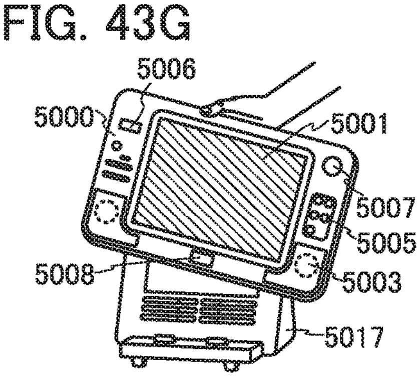

FIG. 43G illustrates a portable television receiver, which can include a charger 5017 capable of transmitting and receiving signals, and the like in addition to the above components.

Figure 43H:
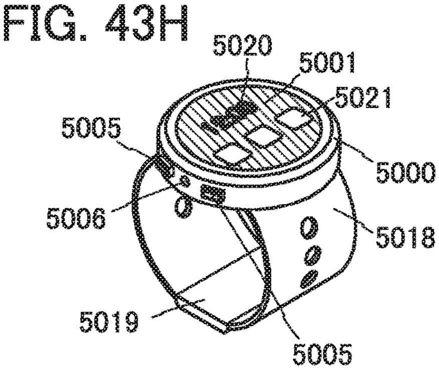

FIG. 43H illustrates a wrist-watch-type information terminal, which can include a band 5018, a clasp 5019, and the like in addition to the above components. The display portion 5001 mounted in the housing 5000 also serving as a bezel includes a non-rectangular display region. The display portion 5001 can display an icon 5020 indicating time, another icon 5021, and the like.

Figure 44A:
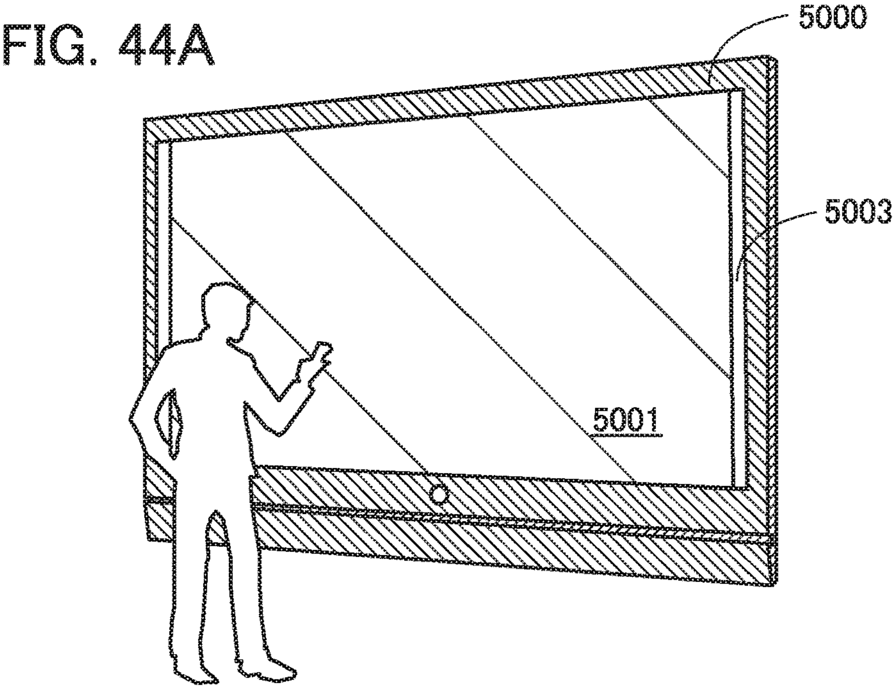
FIGS. 44A and 44B are perspective views each illustrating an example of an electronic device.

FIG. 44A illustrates a digital signage.

Figure 44B:
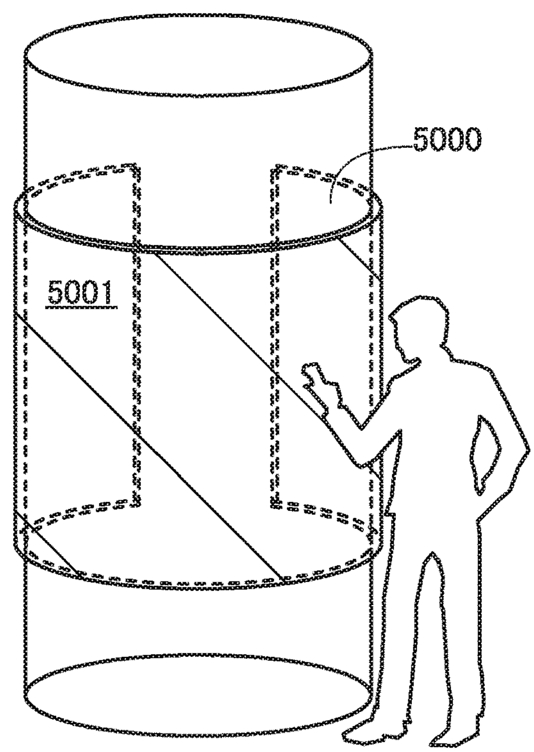

FIG. 44B illustrates a digital signage mounted on a cylindrical pillar.

The electronic devices illustrated in FIGS. 43A to 43H and FIGS. 44A and 44B can have a variety of functions, for example, a function of displaying a variety of information (e.g., a still image, a moving image, and a text image) on a display portion, a display device function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading a program or data stored in a recording medium and displaying the program or data on a display portion. Furthermore, the electronic device including a plurality of display portions can have a function of displaying image information mainly on one display portion while displaying text information mainly on another display portion, a function of displaying a three-dimensional image by displaying images where parallax is utilized on a plurality of display portions, or the like. Furthermore, the electronic device including an image receiving portion can have a function of photographing a still image, a function of photographing a moving image, a function of automatically or manually correcting a photographed image, a function of storing a photographed image in a recording medium (an external recording medium or a recording medium incorporated in the camera), a function of displaying a photographed image on a display portion, or the like. Note that the functions of the electronic devices illustrated in FIGS. 43A to 43H and FIGS. 44A and 44B are not limited thereto, and the electronic devices can have a variety of functions.

The electronic devices in this embodiment each include a display portion for displaying some kind of information. The display device of one embodiment of the present invention can be used for the display portion.

(Embodiment 8)

In this embodiment, transistors which can be used for the display device of one embodiment of the present invention and which have structures different from those of the transistor described in Embodiment 3 are described with reference to FIGS. 45A to 45C, FIGS. 46A to 46D, FIGS. 47A and 47B, FIGS. 48A to 48D, FIGS. 49A and 49B, FIGS. 50A to 50C, FIGS. 51A to 51C, and FIGS. 52A to 52C.

<Example 1 of Transistor Structure>

Figure 45A:
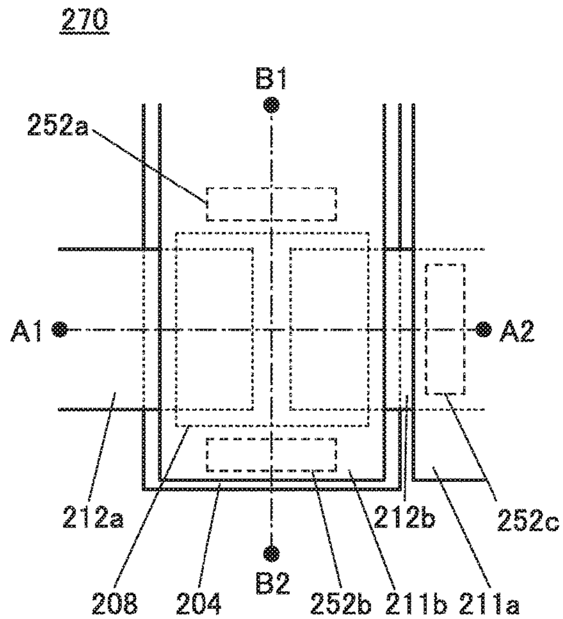
FIGS. 45A to 45C are a top view and cross-sectional views illustrating a structure example of a transistor.
Figure 45B:
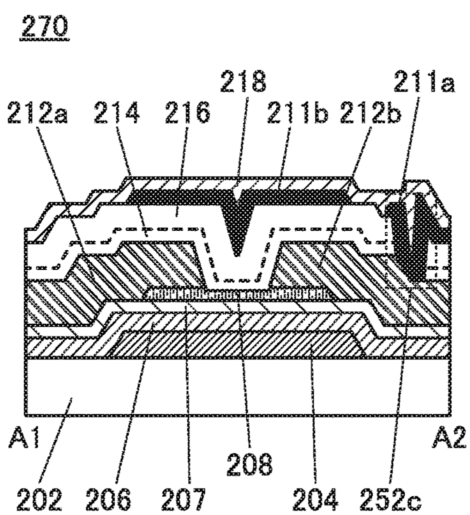
Figure 45C:
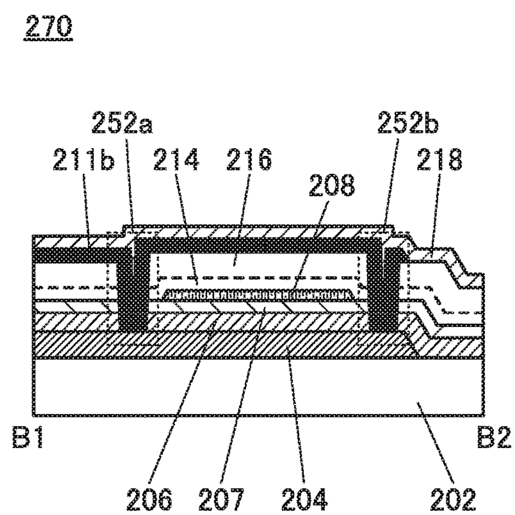

FIG. 45A is a top view of a transistor 270. FIG. 45B is a cross-sectional view taken along the dashed-dotted line A1-A2 in FIG. 45A, and FIG. 45C is a cross-sectional view taken along the dashed-dotted line B1-B2 in FIG. 45A. Note that the direction of the dashed dotted line A1-A2 may be called the channel length direction, and the direction of the dashed dotted line B1-B2 may be called the channel width direction.

The transistor 270 includes a conductive film 204 functioning as a first gate electrode over a substrate 202, an insulating film 206 over the substrate 202 and the conductive film 204, an insulating film 207 over the insulating film 206, the oxide semiconductor film 208 over the insulating film 207, a conductive film 212*a* functioning as a source electrode electrically connected to the oxide semiconductor film 208, a conductive film 212*b* functioning as a drain electrode electrically connected to the oxide semiconductor film 208, insulating films 214 and 216 over the oxide semiconductor film 208 and the conductive films 212*a* and 212*b*, and a conductive film 211*b* over the insulating film 216. In addition, an insulating film 218 is provided over the conductive film 211*b*.

In the transistor 270, the insulating films 214 and 216 function as a second gate insulating film of the transistor 270. A conductive film 211*a* is connected to the conductive film 212*b* through an opening 252*c* provided in the insulating films 214 and 216. The conductive film 211*a* functions as, for example, a pixel electrode used for a display device. The conductive film 211*b* in the transistor 270 functions as a second gate electrode (also referred to as a back gate electrode).

As illustrated in FIG. 45C, the conductive film 211*b* is connected to the conductive film 204 functioning as a first gate electrode through openings 252*a* and 252*b* provided in the insulating films 206, 207, 214, and 216. Accordingly, the conductive film 204 and the conductive film 211*b* are supplied with the same potential.

Note that although the structure in which the openings 252*a* and 252*b* are provided so that the conductive film 211*b* and the conductive film 204 are connected to each other is described in this embodiment, one embodiment of the present invention is not limited thereto. For example, a structure in which only one of the openings 252*a* and 252*b* is provided so that the conductive film 211*b* and the conductive film 204 are connected to each other, or a structure in which the openings 252*a* and 252*b* are not provided and the conductive film 211*b* and the conductive film 204 are not connected to each other may be employed. Note that in the case where the conductive film 211*b* and the conductive film 204 are not connected to each other, it is possible to apply different potentials to the conductive film 211*b* and the conductive film 204.

As illustrated in FIG. 45B, the oxide semiconductor film 208 is positioned to face each of the conductive film 204 functioning as a first gate electrode and the conductive film 211*b* functioning as a second gate electrode, and is sandwiched between the two conductive films functioning as gate electrodes. The length in the channel length direction and the length in the channel width direction of the conductive film 211*b* functioning as a second gate electrode are longer than that in the channel length direction and that in the channel width direction of the oxide semiconductor film 208, respectively. The whole oxide semiconductor film 208 is covered with the conductive film 211*b* with the insulating films 214 and 216 positioned therebetween. Since the conductive film 211*b* functioning as a second gate electrode is connected to the conductive film 204 functioning as a first gate electrode through the openings 252*a* and 252*b* provided in the insulating films 206 and 207 and the insulating films 214 and 216, a side surface of the oxide semiconductor film 208 in the channel width direction faces the conductive film 211*b* functioning as a second gate electrode with the insulating films 214 and 216 positioned therebetween.

In other words, in the channel width direction of the transistor 270, the conductive film 204 functioning as a first gate electrode and the conductive film 211*b* functioning as a second gate electrode are connected to each other through the openings provided in the insulating films 206, 207, 214, and 216; and the conductive film 204 and the conductive film 211*b* surround the oxide semiconductor film 208 with the insulating films 206, 207, 214, and 216 positioned therebetween.

Such a structure enables the oxide semiconductor film 208 included in the transistor 270 to be electrically surrounded by electric fields of the conductive film 204 functioning as a first gate electrode and the conductive film 211*b* functioning as a second gate electrode. A device structure of a transistor, like that of the transistor 270, in which electric fields of a first gate electrode and a second gate electrode electrically surround an oxide semiconductor film where a channel region is formed, can be referred to as a surrounded channel (s-channel) structure.

Since the transistor 270 has the s-channel structure, an electric field for inducing a channel can be effectively applied to the oxide semiconductor film 208 by the conductive film 204 functioning as a first gate electrode; therefore, the current drive capability of the transistor 270 can be improved and high on-state current characteristics can be obtained. Since the on-state current can be increased, it is possible to reduce the size of the transistor 270. In addition, since the transistor 270 is surrounded by the conductive film 204 functioning as a first gate electrode and the conductive film 211*b* functioning as a second gate electrode, the mechanical strength of the transistor 270 can be increased.

<Example 2 of Transistor Structure>

Structure examples different from that of the transistor 270 in FIGS. 45A to 45C are described with reference to FIGS. 46A to 46D.

Figure 46A:
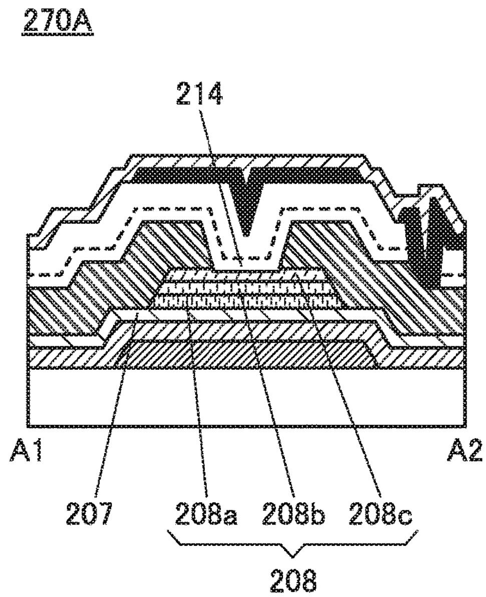
FIGS. 46A to 46D are cross-sectional views illustrating structure examples of a transistor.
Figure 46B:
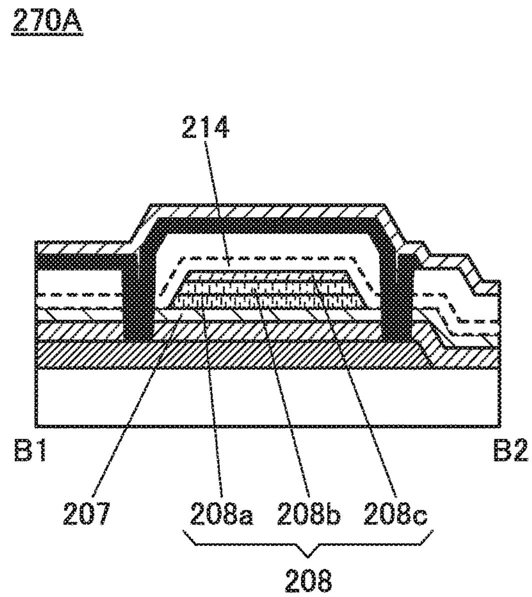
Figure 46C:
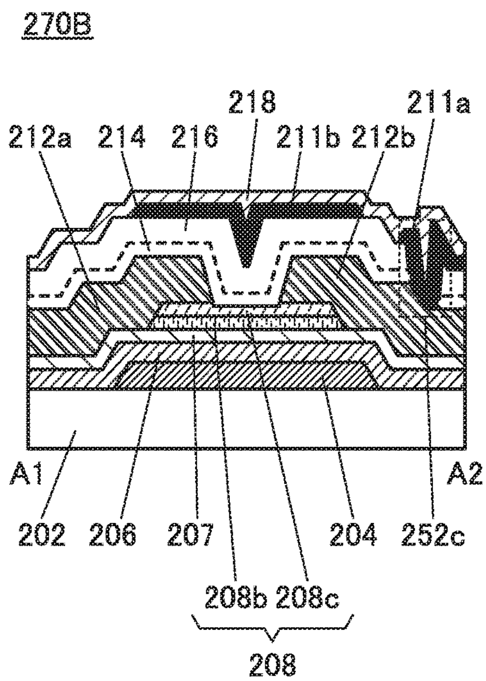
Figure 46D:
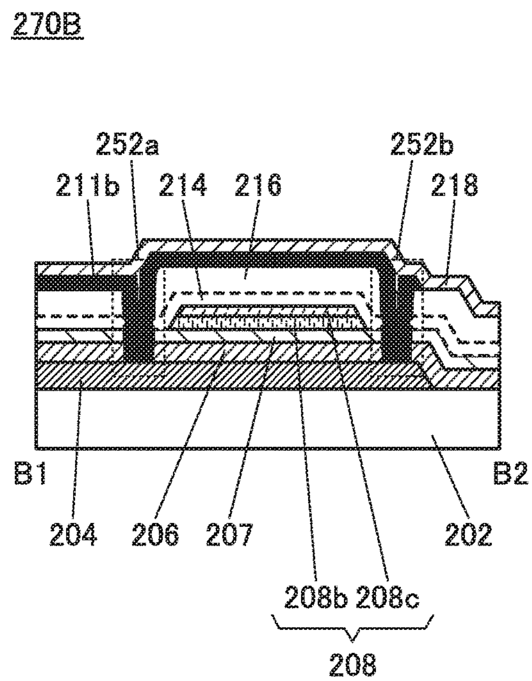

FIGS. 46A and 46B illustrate a cross-sectional view illustrating a modification example of the transistor 270 in FIGS. 45B and 45C. FIGS. 46C and 46D illustrate a cross-sectional view illustrating another modification example of the transistor 270 in FIGS. 45B and 45C.

A transistor 270A in FIGS. 46A and 46B is different from the transistor 270 in FIGS. 45B and 45C in that the oxide semiconductor film 208 has a three-layer structure. Specifically, the oxide semiconductor film 208 of the transistor 270A includes an oxide semiconductor film 208*a*, an oxide semiconductor film 208*b*, and an oxide semiconductor film 208*c*.

A transistor 270B in FIGS. 46C and 46D is different from the transistor 270 in FIGS. 45B and 45C in that the oxide semiconductor film 208 has a two-layer structure. Specifically, the oxide semiconductor film 208 of the transistor 270B includes the oxide semiconductor film 208*b* and the oxide semiconductor film 208*c*.

The structure of the transistor 150 described in Embodiment 3 can be referred to for the structures of the transistors 270, 270A, and 270B in this embodiment. Thus, the material and the manufacturing method of the substrate 18 can be referred to for those of the substrate 202. The material and the manufacturing method of the gate electrode 104 can be referred to for those of the conductive film 204. The materials and the manufacturing methods of the insulating films 106 and 107 can be referred to for those of the insulating films 206 and 207, respectively. The material and the manufacturing method of the oxide semiconductor film 110 can be referred to for those of the oxide semiconductor film 208. The material and the manufacturing method of the conductive film 79 can be referred to for those of the conductive film 211*a* and those of the conductive film 211*b*. The material and the manufacturing method of the source electrode 112*a* and the drain electrode 112*b* can be referred to for those of the conductive film 212*a* and the conductive film 212*b*. The materials and the manufacturing methods of the insulating films 114, 116, and 118 can be referred to for those of the insulating films 214, 216, and 218, respectively.

Here, a band structure including the oxide semiconductor film 208 and insulating films in contact with the oxide semiconductor film 208 is described with reference to FIGS. 47A and 47B.

Figure 47A:
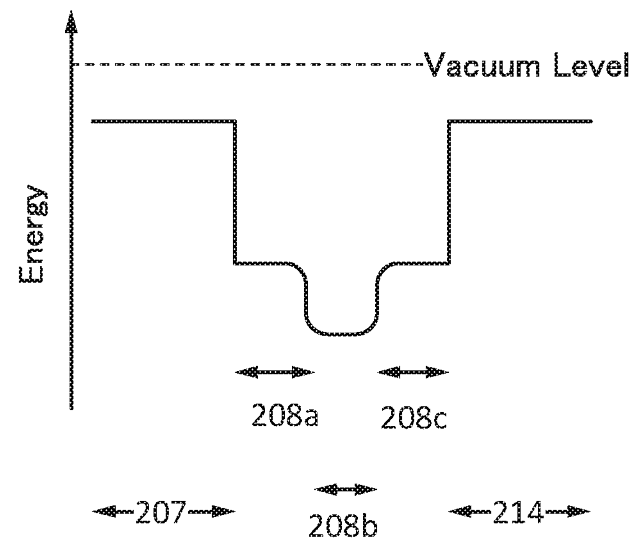
FIGS. 47A and 47B each illustrate an energy band of a transistor.

FIG. 47A shows an example of a band structure in the thickness direction of a layered structure including the insulating film 207, the oxide semiconductor films 208*a*, 208*b*, and 208*c*, and the insulating film 214. FIG. 47B shows an example of a band structure in the thickness direction of a layered structure including the insulating film 207, the oxide semiconductor films 208*b* and 208*c*, and the insulating film 214. For easy understanding, the energy level of the conduction band minimum (Ec) of each of the insulating film 207, the oxide semiconductor films 208*a*, 208*b*, and 208*c*, and the insulating film 214 is shown in the band structures.

In the band structure of FIG. 47A, a silicon oxide film is used as each of the insulating film 207 and the insulating film 214, an oxide semiconductor film formed using a metal oxide target having an atomic ratio of metal elements, In:Ga:Zn=1:1:1.2, is used as the oxide semiconductor film 208*a*, an oxide semiconductor film formed using a metal oxide target having an atomic ratio of metal elements, In:Ga:Zn=4:2:4.1, is used as the oxide semiconductor film 208*b*, and an oxide semiconductor film formed using a metal oxide target having an atomic ratio of metal elements, In:Ga:Zn=1:1:1.2, is used as the oxide semiconductor film 208*c*.

Figure 47B:
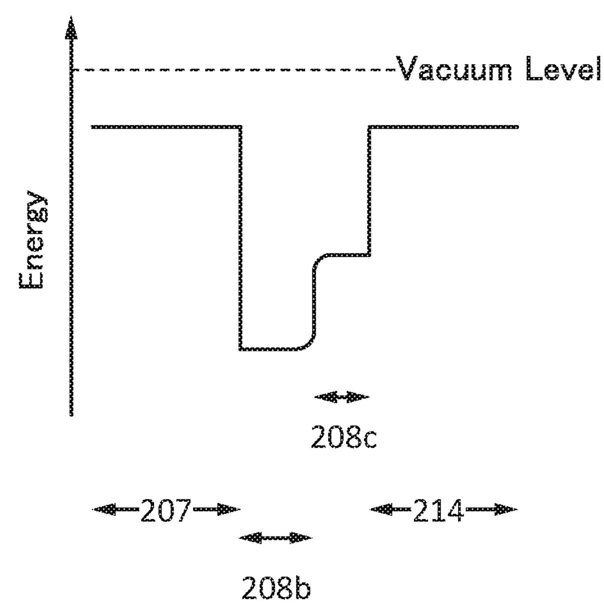

In the band structure of FIG. 47B, a silicon oxide film is used as each of the insulating film 207 and the insulating film 214, an oxide semiconductor film formed using a metal oxide target having an atomic ratio of metal elements, In:Ga:Zn=4:2:4.1, is used as the oxide semiconductor film 208*b*, and an oxide semiconductor film formed using a metal oxide target having an atomic ratio of metal elements, In:Ga:Zn=1:1:1.2, is used as the oxide semiconductor film 208*c*.

As illustrated in FIGS. 47A and 47B, the energy level of the conduction band minimum gradually changes between the oxide semiconductor film 208*a* and the oxide semiconductor film 208*b* and between the oxide semiconductor film 208*b* and the oxide semiconductor film 208*c*. In other words, the energy level of the conduction band minimum is continuously changed or continuously connected. To obtain such a band structure, there exists no impurity, which forms a defect state such as a trap center or a recombination center, at the interface between the oxide semiconductor film 208*a* and the oxide semiconductor film 208*b* or at the interface between the oxide semiconductor film 208*b* and the oxide semiconductor film 208*c*.

To form a continuous junction between the oxide semiconductor film 208*a* and the oxide semiconductor film 208*b* and between the oxide semiconductor film 208*b* and the oxide semiconductor film 208*c*, it is necessary to form the films successively without exposure to the air by using a multi-chamber deposition apparatus (sputtering apparatus) provided with a load lock chamber.

With the band structures of FIG. 47A and FIG. 47B, the oxide semiconductor film 208*b* serves as a well, and a channel region is formed in the oxide semiconductor film 208*b* in the transistor with the layered structure.

By providing the oxide semiconductor film 208*a* and the oxide semiconductor film 208*c*, the oxide semiconductor film 208*b* can be distanced away from trap states.

In addition, the trap states might be more distant from the vacuum level than the energy level of the conduction band minimum (Ec) of the oxide semiconductor film 208*b* functioning as a channel region, so that electrons are likely to be accumulated in the trap states. When the electrons are accumulated in the trap states, the electrons become negative fixed electric charge, so that the threshold voltage of the transistor is shifted in the positive direction. Therefore, it is preferable that the trap states be closer to the vacuum level than the energy level of the conduction band minimum (Ec) of the oxide semiconductor film 208*b*. Such a structure inhibits accumulation of electrons in the trap states. As a result, the on-state current and the field-effect mobility of the transistor can be increased.

The energy level of the conduction band minimum of each of the oxide semiconductor films 208*a* and 208*c* is closer to the vacuum level than that of the oxide semiconductor film 208*b*. Typically, a difference in energy level between the conduction band minimum of the oxide semiconductor film 208*b* and the conduction band minimum of each of the oxide semiconductor films 208*a* and 208*c* is 0.15 eV or more or 0.5 eV or more and 2 eV or less or 1 eV or less. That is, the difference between the electron affinity of each of the oxide semiconductor films 208*a* and 208*c* and the electron affinity of the oxide semiconductor film 208*b* is 0.15 eV or more or 0.5 eV or more and 2 eV or less or 1 eV or less.

In such a structure, the oxide semiconductor film 208*b* serves as a main path of a current. In other words, the oxide semiconductor film 208*b* serves as a channel region, and the oxide semiconductor films 208*a* and 208*c* serve as oxide insulating films. In addition, since the oxide semiconductor films 208*a* and 208*c* each include one or more metal elements included in the oxide semiconductor film 208*b* in which a channel region is formed, interface scattering is less likely to occur at the interface between the oxide semiconductor film 208*a* and the oxide semiconductor film 208*b* or at the interface between the oxide semiconductor film 208*b* and the oxide semiconductor film 208*c*. Thus, the transistor can have high field-effect mobility because the movement of carriers is not hindered at the interface.

To prevent each of the oxide semiconductor films 208*a* and 208*c* from functioning as part of a channel region, a material having sufficiently low conductivity is used for the oxide semiconductor films 208*a* and 208*c*. Thus, the oxide semiconductor films 208*a* and 208*c* can be referred to as oxide insulating films for such properties and/or functions. Alternatively, a material that has a smaller electron affinity (a difference in energy level between the vacuum level and the conduction band minimum) than the oxide semiconductor film 208*b* and has a difference in energy level in the conduction band minimum from the oxide semiconductor film 208*b* (band offset) is used for the oxide semiconductor films 208*a* and 208*c*. Furthermore, to inhibit generation of a difference in threshold voltage due to the value of the drain voltage, it is preferable to form the oxide semiconductor films 208*a* and 208*c* using a material whose energy level of the conduction band minimum is closer to the vacuum level than that of the oxide semiconductor film 208*b*. For example, a difference between the energy level of the conduction band minimum of the oxide semiconductor film 208*b* and the energy level of the conduction band minimum of each of the oxide semiconductor films 208*a* and 208*c* is preferably greater than or equal to 0.2 eV, more preferably greater than or equal to 0.5 eV.

It is preferable that the oxide semiconductor films 208*a* and 208*c* not have a spinel crystal structure. This is because if the oxide semiconductor films 208*a* and 208*c* have a spinel crystal structure, constituent elements of the conductive films 212*a* and 212*b* might be diffused into the oxide semiconductor film 208*b* at the interface between the spinel crystal structure and another region. Note that each of the oxide semiconductor films 208*a* and 208*c* is preferably a CAAC-OS film, in which case a higher blocking property against constituent elements of the conductive films 212*a* and 212*b*, for example, copper elements, can be obtained.

The thickness of each of the oxide semiconductor films 208*a* and 208*c* is greater than or equal to a thickness that is capable of inhibiting diffusion of the constituent elements of the conductive films 212*a* and 212*b* to the oxide semiconductor film 208*b*, and less than a thickness that inhibits supply of oxygen from the insulating film 214 to the oxide semiconductor film 208*b*. For example, when the thickness of each of the oxide semiconductor films 208*a* and 208*c* is greater than or equal to 10 nm, diffusion of the constituent elements of the conductive films 212*a* and 212*b* to the oxide semiconductor film 208*b* can be inhibited. When the thickness of each of the oxide semiconductor films 208*a* and 208*c* is less than or equal to 100 nm, oxygen can be effectively supplied from the insulating film 214 to the oxide semiconductor film 208*b*.

Although the example where an oxide semiconductor film formed using a metal oxide target having an atomic ratio of metal elements, In:Ga:Zn=1:1:1.2, is used as each of the oxide semiconductor films 208*a* and 208*c* is described in this embodiment, one embodiment of the present invention is not limited thereto. For example, an oxide semiconductor film formed using a metal oxide target having an atomic ratio of In:Ga:Zn=1:1:1, In:Ga:Zn=1:3:2, In:Ga:Zn=1:3:4, or In:Ga:Zn=1:3:6, may be used as each of the oxide semiconductor films 208*a* and 208*c*.

When the oxide semiconductor films 208*a* and 208*c* are formed using a metal oxide target having an atomic ratio of In:Ga:Zn=1:1:1, the oxide semiconductor films 208*a* and 208*c* have an atomic ratio of In:Ga:Zn=1:$\beta1$ ($0<\beta1\leq2$):$\beta2$ ($0<\beta2\leq3$) in some cases. When the oxide semiconductor films 208*a* and 208*c* are formed using a metal oxide target having an atomic ratio of In:Ga:Zn=1:3:4, the oxide semiconductor films 208*a* and 208*c* have an atomic ratio of In:Ga:Zn=1:$\beta3$ ($1\leq\beta3\leq5$):$\beta4$ ($2\leq\beta4\leq6$) in some cases. When the oxide semiconductor films 208*a* and 208*c* are formed using a metal oxide target having an atomic ratio of In:Ga:Zn=1:3:6, the oxide semiconductor films 208*a* and 208*c* have an atomic ratio of In:Ga:Zn=1:$\beta5$ ($1\leq\beta5\leq5$):$\beta6$ ($4\leq\beta6\leq8$) in some cases.

Figure 48A:
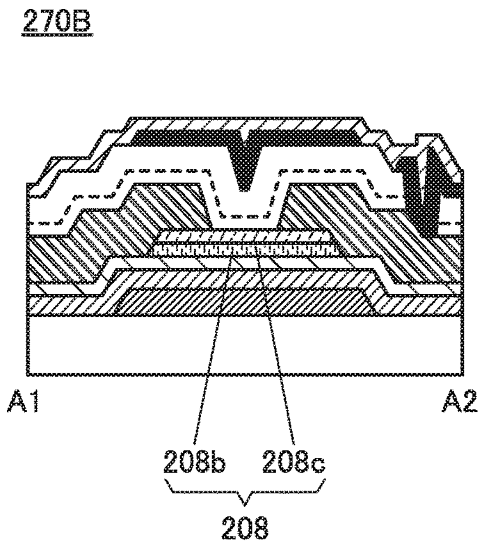
FIGS. 48A to 48D are cross-sectional views illustrating structure examples of a transistor.
Figure 48B:
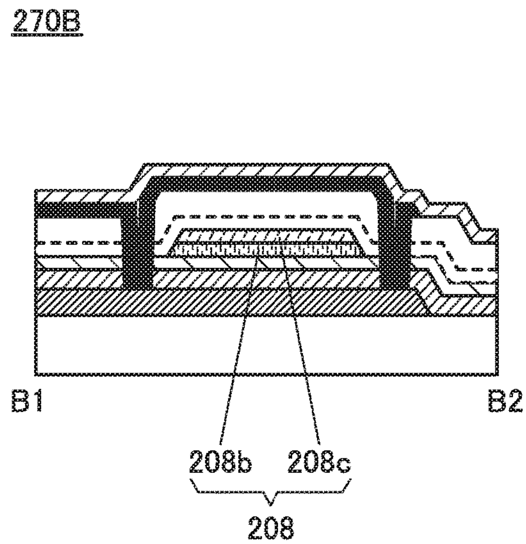

The drawings illustrate an example where the oxide semiconductor film 208 in the transistor 270 and the oxide semiconductor film 208*c* in the transistors 270A and 270B have a small thickness in a region that does not overlap with the conductive films 212*a* and 212*b*, that is, an example where part of the oxide semiconductor film has a depressed portion. However, one embodiment of the present invention is not limited thereto, and the oxide semiconductor film does not necessarily have a depressed region in a region that does not overlap with the conductive films 212*a* and 212*b*. FIGS. 48A and 48B illustrate an example in this case. FIGS. 48A and 48B are cross-sectional views illustrating an example of the transistor. FIGS. 48A and 48B illustrate a structure where the oxide semiconductor film 208 in the transistor 270B does not have a depressed portion.

Figure 48C:
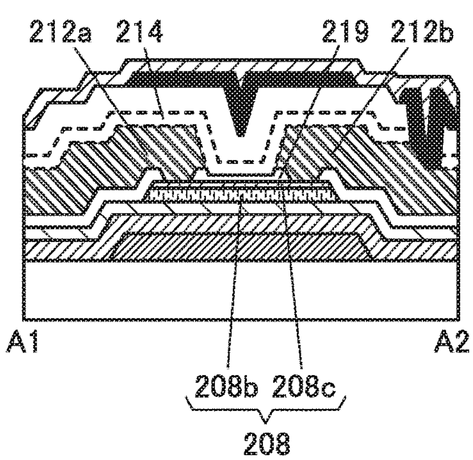
Figure 48D:
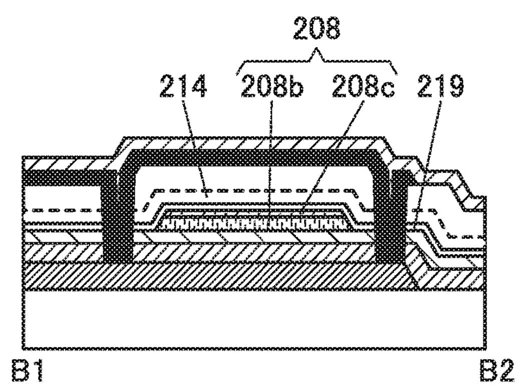

As illustrated in FIGS. 48C and 48D, the oxide semiconductor film 208*c* may be formed thinner than the oxide semiconductor film 208*b* in advance, and an insulating film 219 may further be formed over the oxide semiconductor film 208*c* and the insulating film 207. In that case, an opening for connecting the oxide semiconductor film 208*c* and the conductive films 212*a* and 212*b* is formed in the insulating film 219. The insulating film 219 can be formed with the same material and the same forming method as the insulating film 214.

<Example 3 of Transistor Structure>

Figure 49A:
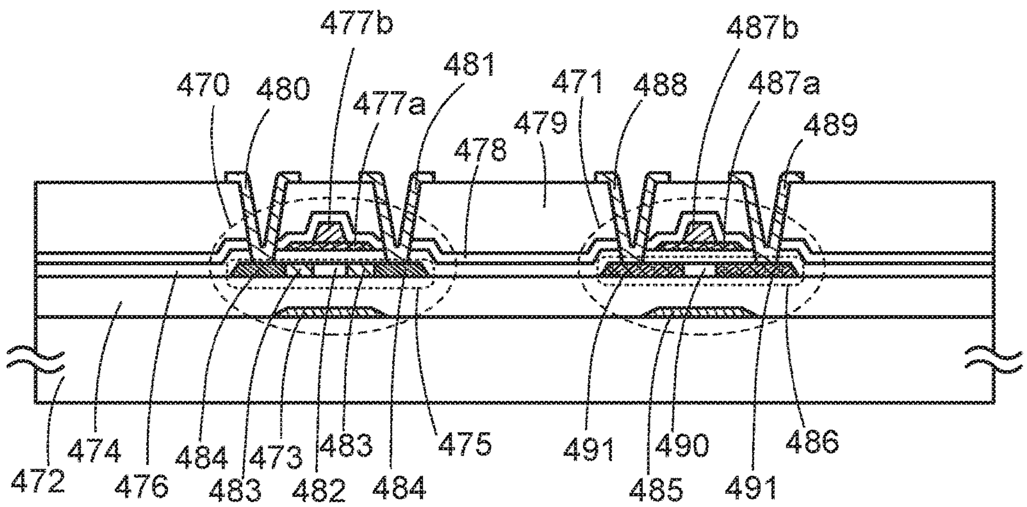
FIGS. 49A and 49B are cross-sectional views illustrating structure examples of a transistor.
Figure 49B:
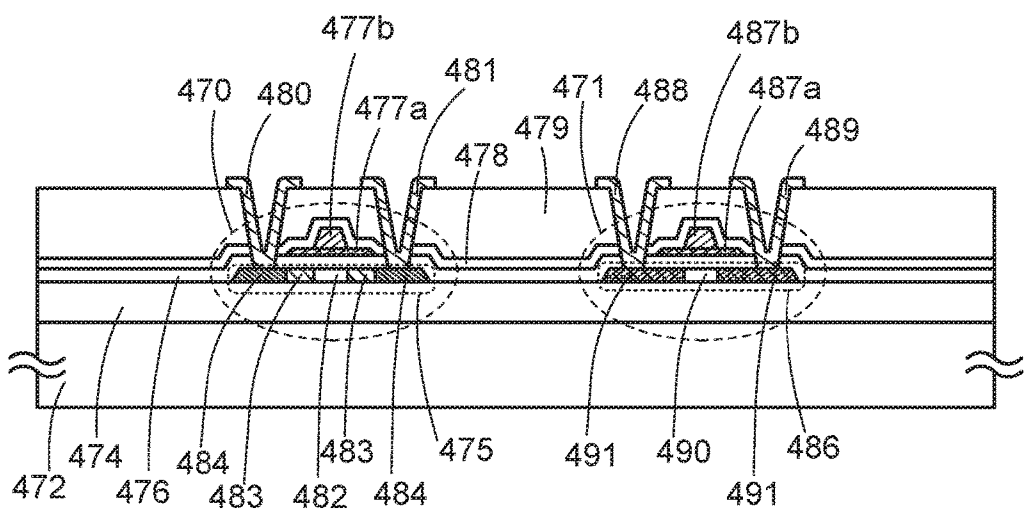

FIGS. 49A and 49B are each a cross-sectional view of transistors each including a thin silicon film. FIGS. 49A and 49B illustrate an n-channel transistor 470 and a p-channel transistor 471.

The transistor 470 includes, over a substrate 472 having an insulating surface, a conductive film 473 functioning as a gate, an insulating film 474 over the conductive film 473, a semiconductor film 475 overlapping with the conductive film 473 with the insulating film 474 provided therebetween, an insulating film 476 over the semiconductor film 475, a conductive film 477*a* and a conductive film 477*b* overlapping with the semiconductor film 475 with the insulating film 476 provided therebetween and functioning as a gate, an insulating film 478 over the conductive films 477*a* and 477*b*, an insulating film 479 over the insulating film 478, and a conductive film 480 and a conductive film 481 electrically connected to the semiconductor film 475 through openings in the insulating films 476, 478, and 479 and functioning as a source and a drain.

The width in the channel length direction of the conductive film 477*b* is shorter than that of the conductive film 477*a*. The conductive films 477*a* and 477*b* are stacked in this order from the insulating film 476 side. The semiconductor film 475 includes a channel formation region 482 overlapping with the conductive film 477*b*, a pair of lightly doped drain (LDD) regions 483 between which the channel formation region 482 is sandwiched, and a pair of impurity regions 484 between which the channel formation region 482 and the LDD regions 483 are sandwiched. The pair of impurity regions 484 functions as a source region and a drain region. An impurity element imparting n-type conductivity to the semiconductor film 475, such as boron (B), aluminum (Al), or gallium (Ga), is added to the LDD regions 483 and the impurity regions 484.

The transistor 471 includes, over the substrate 472 having an insulating surface, a conductive film 485 functioning as a gate, the insulating film 474 over the conductive film 485, a semiconductor film 486 overlapping with the conductive film 485 with the insulating film 474 provided therebetween, the insulating film 476 over the semiconductor film 486, a conductive film 487*a* and a conductive film 487*b* overlapping with the semiconductor film 486 with the insulating film 476 provided therebetween and functioning as a gate, the insulating film 478 over the conductive films 487*a* and 487*b*, the insulating film 479 over the insulating film 478, and a conductive film 488 and a conductive film 489 electrically connected to the semiconductor film 486 through openings in the insulating films 476, 478, and 479 and functioning as a source and a drain.

The width in the channel length direction of the conductive film 487*b* is shorter than that of the conductive film 487*a*. The conductive films 487*a* and 487*b* are stacked in this order from the insulating film 476 side. The semiconductor film 475 includes a channel formation region 490 overlapping with the conductive film 487*b*, and a pair of impurity regions 491 between which the channel formation region 490 is sandwiched. The pair of impurity regions 491 functions as a source region and a drain region. An impurity element imparting p-type conductivity to the semiconductor film 486, such as phosphorus (P) or arsenic (As), is added to the impurity regions 491.

Note that the semiconductor film 475 or 486 may be crystallized by various techniques. Examples of the various techniques of crystallization include a laser crystallization method using a laser beam and a crystallization method using a catalyst element. Alternatively, a crystallization method using a catalyst element and a laser crystallization method may be combined. In the case of using a thermally stable substrate such as quartz for the substrate 472, any of the following crystallization methods can be used in combination: a thermal crystallization method with an electrically-heated oven, a lamp annealing crystallization method with infrared light, a crystallization method with a catalyst element, and high temperature annealing at about 950° C.

Although FIG. 49A illustrates a structure in which the conductive films 477*a* and 477*b* function as a gate and the conductive film 473 functions as a backgate, other structures may be employed. For example, the conductive film 473 functioning as a backgate may be omitted as illustrated in FIG. 49B. Although FIG. 49A illustrates a structure in which the conductive films 487*a* and 487*b* function as a gate and the conductive film 473 functions as a backgate, other structures may be employed. For example, the conductive film 485 functioning as a backgate may be omitted as illustrated in FIG. 49B. Note that the structure illustrated in FIG. 49B can be used for an OS transistor.

Figure 50A:
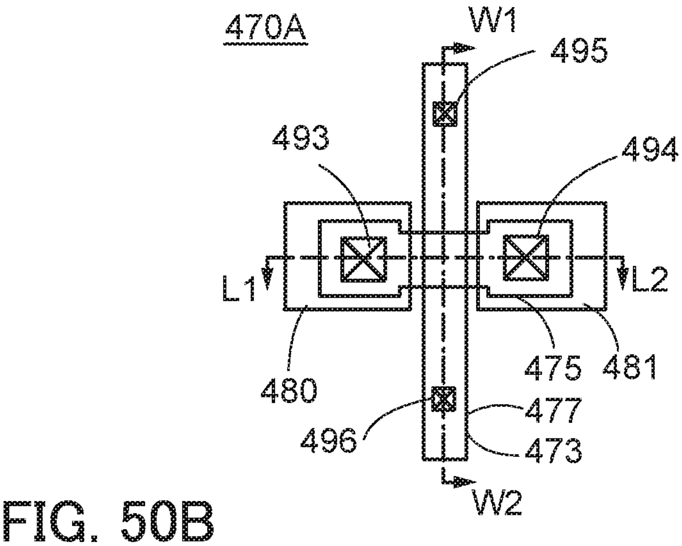
FIGS. 50A to 50C are a top view and cross-sectional views illustrating a structure example of a transistor.
Figure 50B:
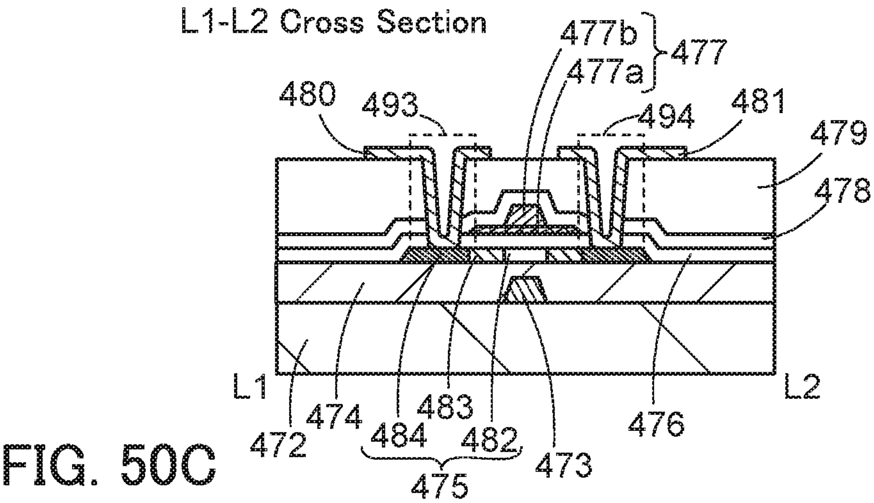
Figure 50C:
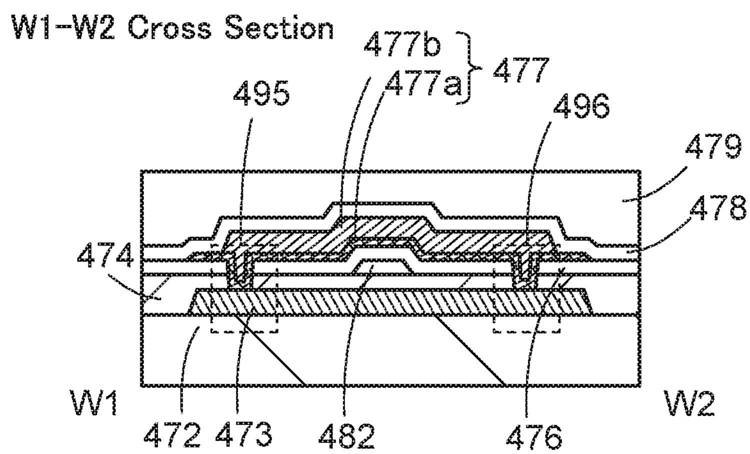

FIG. 50A is a top view of a transistor 470A which corresponds to the n-channel transistor 470 illustrated in FIG. 49A. FIG. 50B is a cross-sectional view taken along the line L1-L2 in the channel length direction of the transistor 470A. FIG. 50C is a cross-sectional view taken along the line W1-W2 in the channel width direction of the transistor 470A.

FIG. 50A illustrates a conductive film 477, the conductive film 473, the semiconductor film 475, the conductive film 480, the conductive film 481, an opening 493, an opening 494, an opening 495, and an opening 496. The conductive film 477 functions as a gate. The conductive film 473 functions as a backgate. Details of the components denoted by the same reference numerals as those in FIG. 49A are omitted in the description of FIG. 50A. The openings 493 and 494 are openings for connecting the semiconductor film 475 and the conductive films 480 and 481. The openings 495 and 496 are openings for electrically connecting the conductive films 477 and 473.

As illustrated in FIG. 50B, the transistor 470A includes, over the substrate 472, the conductive film 473, the insulating film 474, the semiconductor film 475 overlapping with the conductive film 473 with the insulating film 474 provided therebetween, the insulating film 476 over the semiconductor film 475, the conductive films 477*a* and 477*b* overlapping with the semiconductor film 475 with the insulating film 476 provided therebetween and functioning as a gate, the insulating film 478 over the conductive films 477*a* and 477*b*, the insulating film 479 over the insulating film 478, and the conductive films 480 and 481 electrically connected to the semiconductor film 475 through the openings 493 and 494 in the insulating films 476, 478, and 479 and functioning as a source and a drain. The semiconductor film 475 includes the channel formation region 482, the pair of LDD regions 483, and the pair of impurity regions 484. The pair of impurity regions 484 functions as a source region and a drain region. Details of the components denoted by the same reference numerals as those in FIG. 49A are omitted in the description of FIG. 50B.

FIG. 50C illustrates, over the substrate 472, the conductive film 473, the insulating film 474, the channel formation region 482, the insulating film 476, the conductive films 477*a* and 477*b* electrically connected to the conductive film 473 through the openings 495 and 496, the insulating film 478 over the conductive films 477*a* and 477*b*, and the insulating film 479 over the insulating film 478. The semiconductor film 475 includes the channel formation region 482, the pair of LDD regions 483, and the pair of impurity regions 484. Details of the components denoted by the same reference numerals as those in FIG. 49A are omitted in the description of FIG. 50C.

The structure illustrated in the top view and the cross-sectional views of FIGS. 50A to 50C is an s-channel structure in which the conductive film 477 serving as a gate and the conductive film 473 electrically connected to the conductive film 477 and serving as a back gate electrically surround the channel formation region 482 of the semiconductor film 475 in the channel width direction. In the s-channel structure, the conductive films wrap around the top surface, the bottom surface, and the side surfaces of the channel formation region. Such a structure can increase the on-state current and reduce the size in the channel width direction. Besides, such a structure in which the channel formation region is surrounded by the conductive films can easily block light and thus can suppress photoexcitation caused by undesired light irradiation in the channel formation region.

In addition, the structure illustrated in the top view and the cross-sectional views of FIGS. 50A to 50C can avoid an accidental electrical connection at the ends of the semiconductor film 475 in the W1-W2 direction caused by an undesired increase in conductivity. The influence of non-uniform distribution of the impurity element added to the semiconductor film 475 can also be reduced.

Although the structure illustrated in the top view and the cross-sectional views of FIGS. 50A to 50C includes a gate and a backgate electrically connected to each other, different voltages may also be applied to them, which is particularly effective in a circuit in which all transistors are n-channel transistors. That is, the threshold voltage of a transistor can be controlled by applying a voltage to a backgate; thus, a logic circuit, such as an inverter circuit, can be formed using ED-MOS transistors whose threshold voltages are different from each other. The area occupied by a pixel driver circuit using such a logic circuit can be reduced, leading to a narrower frame of a display device. In addition, when the voltage of the backgate is set so that a transistor is turned off, the off-state current of the transistor can be further reduced. Therefore, even when the display device has a high refresh rate, written voltage can be maintained, and accordingly, the number of writings can be reduced, leading to low power consumption of the display device.

Figure 51A:
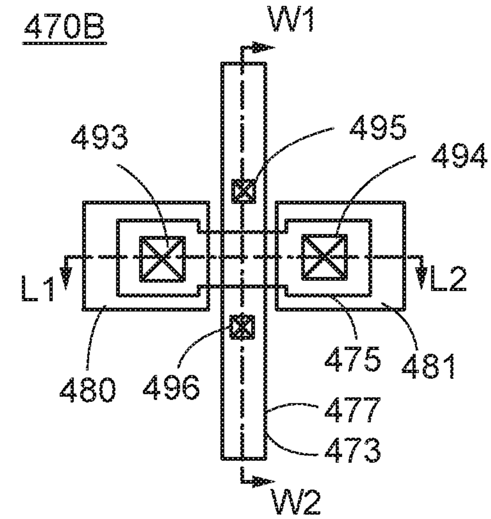
FIGS. 51A to 51C are a top view and cross-sectional views illustrating a structure example of a transistor.
Figure 51B:
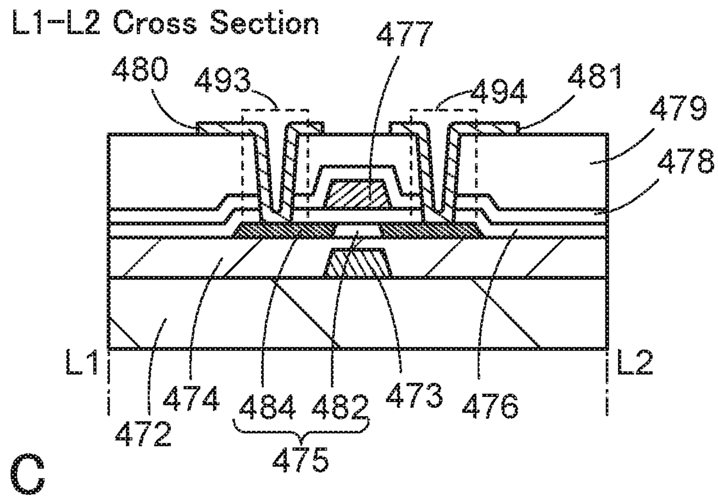
Figure 51C:
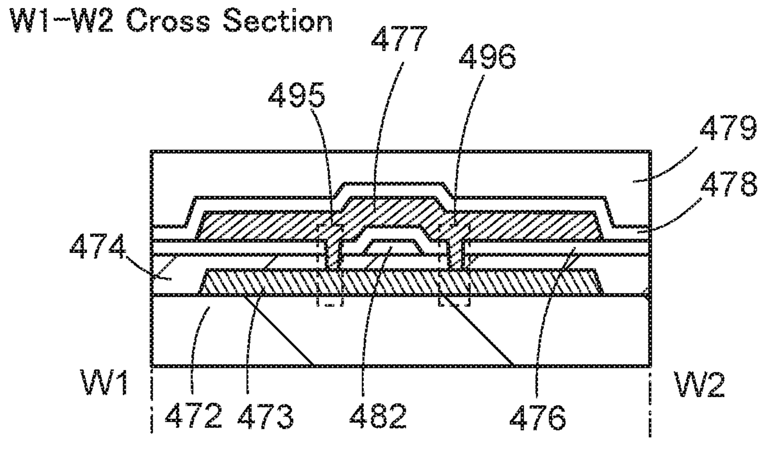

Note that the top view and the cross-sectional views of FIGS. 50A to 50C illustrate just one example, and other structures can be employed. FIGS. 51A to 51C are a top view and cross-sectional views different from those of FIGS. 50A to 50C.

Different points of the structure illustrated in FIGS. 51A to 51C from the structure illustrated in FIGS. 50A to 50C are as follows: the conductive film 477 functioning as a gate is a single layer, and the openings 495 and 496 are closer to the channel formation region 482. Such a structure facilitates application of an electric field to the channel formation region from the top, bottom, and side surfaces thereof. Effects similar to those of the structure in FIGS. 50A to 50C can also be obtained from the structure illustrated in FIGS. 51A to 51C.

Figure 52A:
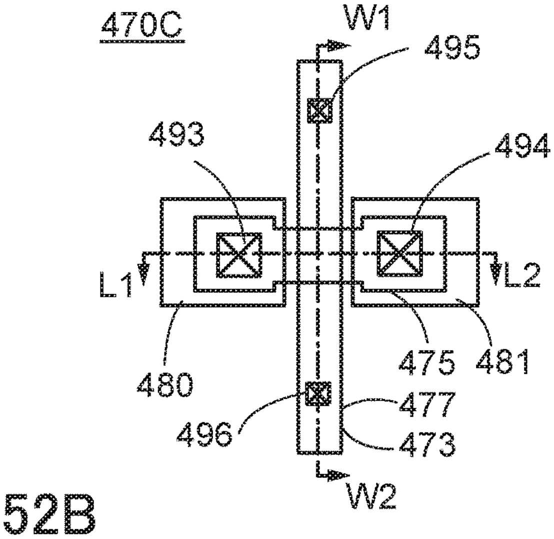
FIGS. 52A to 52C are a top view and cross-sectional views illustrating a structure example of a transistor.
Figure 52B:
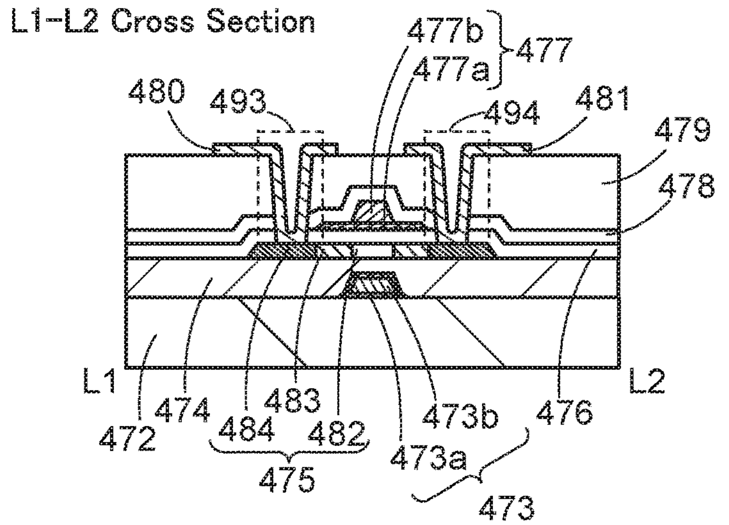
Figure 52C:
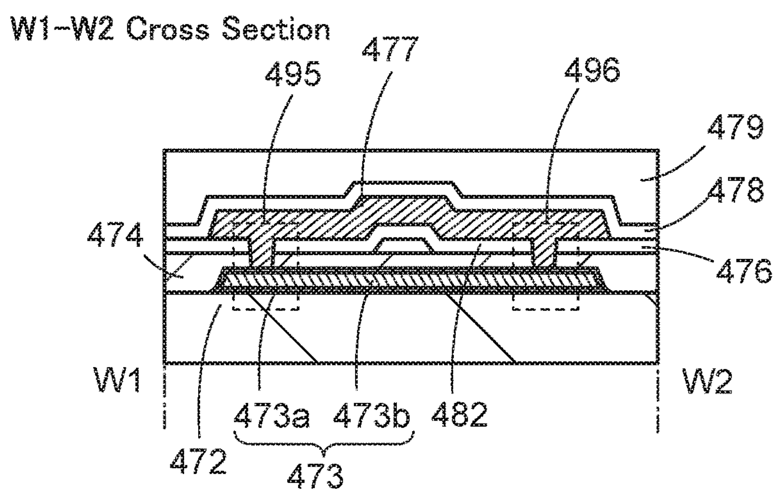

FIGS. 52A to 52C illustrate a top view and cross-sectional views of a structure different from the structures illustrated in FIGS. 50A to 50C and FIGS. 51A to 51C.

A different point of the structure illustrated in FIGS. 52A to 52C from the structures illustrated in FIGS. 50A to 50C and FIGS. 51A to 51C is as follows: the conductive film 473 functioning as a backgate includes a conductive film 473*a* and a conductive film 473*b* which is surrounded by the conductive film 473*a*. Effects similar to those of the structure in FIGS. 50A to 50C can also be obtained from the structure illustrated in FIGS. 52A to 52C.

In addition, even when the conductive film 473*b* contains a movable element (e.g., copper (Cu)), the structure illustrated in FIGS. 52A to 52C can prevent the movable element from entering the semiconductor film and causing degradation of the semiconductor film.

As a material for the conductive film 473*a*, which functions as a barrier film and is provided over the formation surface of the wiring, any of tungsten (W), molybdenum (Mo), chromium (Cr), titanium (Ti), and tantalum (Ta), which are high melting point materials, an alloy thereof (e.g., W—Mo, Mo—Cr, or Ta—Mo) or a nitride thereof (e.g., tungsten nitride, titanium nitride, tantalum nitride, or titanium silicide nitride), or the like can be used. A sputtering method, a CVD method, or the like can be adopted as the formation method. As a material for the conductive film 473*b*, copper (Cu) is preferable; however, there is no particular limitation as long as it is a low resistance material. For example, silver (Ag), aluminum (Al), gold (Au), or an alloy thereof can be used. As the formation method of the conductive film 473*b*, a sputtering method is preferable; however, a CVD method can be adopted as long as conditions that do not damage a resist mask are selected.

Each of the transistors illustrated in FIGS. 50A to 50C, FIGS. 51A to 51C, and FIGS. 52A to 52C has an s-channel structure. In the case of using an s-channel transistor including silicon in a channel formation region, the on-state current is high, and variation in threshold voltage among the transistors is small. In such an s-channel transistor, a DIBL effect is suppressed, and the transistor is less affected by a short-channel effect. In addition, such an s-channel transistor is less affected by impact ions and thus has a high drain withstand voltage. Therefore, such an s-channel transistor exhibits favorable $I_d$-$V_d$ saturation characteristics, and moreover, favorable switching characteristics and a small subthreshold swing in $I_d$-$V_g$ characteristics ($V_g$ is gate voltage).

In this specification and the like, the expressions "one of a source and a drain" (or a first electrode or a first terminal) and "the other of the source and the drain" (or a second electrode or a second terminal) are used to describe the connection relation of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

Unless otherwise specified, an on-state current in this specification refers to a drain current of a transistor in the on state. Unless otherwise specified, the on state of an n-channel transistor means that the voltage difference between its gate and source ($V_{GS}$) is higher than or equal to the threshold voltage ($V_{th}$) of the transistor, and the on state of a p-channel transistor means that $V_{GS}$ is lower than or equal to $V_{th}$. For example, the on-state current of an n-channel transistor sometimes refers to a drain current that flows when $V_{GS}$ is higher than or equal to $V_{th}$. The on-state current of a transistor depends on voltage between its drain and source ($V_{DS}$) in some cases.

Unless otherwise specified, the off-state current in this specification refers to a drain current of a transistor in the off state. Unless otherwise specified, the off state of an n-channel transistor means that $V_{GS}$ is lower than $V_{th}$, and the off state of a p-channel transistor means that $V_{GS}$ is higher than $V_{th}$. For example, the off-state current of an n-channel transistor sometimes refers to a drain current that flows when $V_{GS}$ is lower than $V_{th}$. The off-state current of a transistor depends on $V_{GS}$ in some cases. Thus, "the off-state current of a transistor is lower than $10^{-21}$ A" may mean there is $V_{GS}$ at which the off-state current of the transistor is lower than $10^{-21}$ A.

The off-state current of a transistor depends on $V_{DS}$ in some cases. Unless otherwise specified, the off-state current in this specification may be an off-state current at $V_{DS}$ with an absolute value of 0.1 V, 0.8 V, 1 V, 1.2 V, 1.8 V, 2.5 V, 3 V, 3.3 V, 10 V, 12 V, 16 V, or 20 V. Alternatively, the off-state current may be an off-state current at $V_{DS}$ required for a semiconductor device or the like including the transistor or at $V_{DS}$ used in the semiconductor device or the like including the transistor.

Note that in this specification and the like, terms for describing arrangement, such as "over" and "under," are used for convenience for describing the positional relation between components with reference to drawings. The positional relation between components is changed as appropriate in accordance with a direction in which each component is described. Thus, terms for describing arrangement are not limited to those used in this specification and can be changed to other terms as appropriate depending on the situation.

Furthermore, in a block diagram in this specification and the like, components are functionally classified and shown by blocks that are independent of each other. However, in an actual circuit and the like, such components are sometimes hard to classify functionally, and there is a case in which one circuit is concerned with a plurality of functions or a case in which a plurality of circuits are concerned with one function. Therefore, the segmentation of a block in the block diagrams is not limited by any of the components described in the specification, and can be differently determined as appropriate depending on situations.

In this specification and the like, "voltage" and "potential" can be replaced with each other. The term "voltage" refers to a potential difference from a reference potential. When the reference potential is a ground potential, for example, "voltage" can be replaced with "potential." The ground potential does not necessarily mean 0 V. Potentials are relative values, and the potential applied to a wiring or the like is changed depending on the reference potential, in some cases.

In this specification and the like, the terms "film," "layer," and the like can be interchanged with each other depending on the case or circumstances. For example, the term "conductive layer" can be changed into the term "conductive film" in some cases. Also, the term "insulating film" can be changed into the term "insulating layer" in some cases.

For example, in this specification and the like, an explicit description "X and Y are connected" means that X and Y are electrically connected, X and Y are functionally connected, and X and Y are directly connected. Accordingly, without being limited to a predetermined connection relation, for example, a connection relation shown in drawings or text, another connection relation is included in the drawings or the text.

Here, X and Y each denote an object (e.g., a device, an element, a circuit, a wiring, an electrode, a terminal, a conductive film, or a layer).

For example, in the case where X and Y are directly connected, X and Y are connected without an element that enables electrical connection between X and Y (e.g., a switch, a transistor, a capacitor, an inductor, a resistor, a diode, a display element, a light-emitting element, or a load) interposed between X and Y.

For example, in the case where X and Y are electrically connected, one or more elements that enable an electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, the switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, and a buffer circuit; a signal generation circuit; a memory circuit; or a control circuit) can be connected between X and Y. For example, even when another circuit is interposed between X and Y, X and Y are functionally connected if a signal output from X is transmitted to Y. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or circuit provided therebetween), X and Y are functionally connected (i.e., the case where X and Y are functionally connected with another circuit provided therebetween), and X and Y are directly connected (i.e., the case where X and Y are connected without another element or circuit provided therebetween). That is, in this specification and the like, the explicit expression "X and Y are electrically connected" is the same as the explicit simple expression "X and Y are connected."

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order," "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order," and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order." When the order of connection in a circuit structure is defined by an expression similar to the above examples, a source (or a first terminal or the like) and a drain (or a second terminal or the like) of a transistor can be distinguished from each other to specify the technical scope.

Other examples of the expressions include "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path." It is also possible to use the expression "a source (or a first terminal or the like) of a transistor is electrically connected to X through at least Z1 on a first connection path, the first connection path does not include a second connection path, the second connection path includes a connection path through the transistor, a drain (or a second terminal or the like) of the transistor is electrically connected to Y through at least Z2 on a third connection path, and the third connection path does not include the second connection path." Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor." When the connection path in a circuit structure is defined by an expression similar to the above examples, a source (or a first terminal or the like) and a drain (or a second terminal or the like) of a transistor can be distinguished from each other to specify the technical scope.

Note that one embodiment of the present invention is not limited to these expressions which are just examples. Here, each of X, Y, Z1, and Z2 denotes an object (e.g., a device, an element, a circuit, a wiring, an electrode, a terminal, a conductive film, a layer, or the like).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

This application is based on Japanese Patent Application serial no. 2015-109815 filed with Japan Patent Office on May 29, 2015, Japanese Patent Application serial no. 2015-127932 filed with Japan Patent Office on Jun. 25, 2015, and Japanese Patent Application serial no. 2015-135163 filed with Japan Patent Office on Jul. 6, 2015, the entire contents of which are hereby incorporated by reference.

What is claimed is:

1. A display device comprising:

a display portion comprising a first signal line and a second signal line;

a touch sensor comprising a first wiring and a second wiring;

a first IC comprising a first signal line driver circuit, a touch sensor driver circuit, a first terminal, and a second terminal; and a second IC comprising a second signal line driver circuit, a touch sensor detection circuit, a third terminal and a fourth terminal, wherein the first signal line driver circuit is configured to output a first video signal to the display portion through the first terminal and the first signal line, wherein the second signal line driver circuit is configured to output a second video signal to the display portion through the third terminal and the second signal line, wherein the touch sensor is configured to sense an input owing to a change in capacitance between the first wiring and the second wiring, wherein the touch sensor driver circuit is electrically connected to the first wiring through the second terminal, and wherein the touch sensor detection circuit is electrically connected to the second wiring through the fourth terminal.

2. The display device according to claim 1 further comprising:

a substrate; and a liquid crystal, wherein the first IC is positioned over the substrate, wherein the second IC is positioned over the substrate, wherein the first wiring comprises a region overlapping with the second wiring with the liquid crystal positioned therebetween, wherein the first IC comprises a first surface facing the substrate, wherein the second IC comprises a second surface facing the substrate, wherein the first surface comprises a first side and a second side opposite to the first side, wherein the second surface comprises a third side and a fourth side opposite to the third side, wherein the first terminal is positioned on the first side, wherein the second terminal is positioned on the first side, wherein the third terminal is positioned on the third side, and wherein the fourth terminal is positioned on the fourth side.

3. The display device according to claim 1 further comprising:

a substrate; and a liquid crystal, wherein the first IC is positioned over the substrate, wherein the second IC is positioned over the substrate, wherein the liquid crystal comprises a region overlapping with the substrate with the first wiring positioned therebetween, wherein the liquid crystal comprises a region overlapping with the substrate with the second wiring positioned therebetween, wherein the first IC comprises a first surface facing the substrate, wherein the second IC comprises a second surface facing the substrate, wherein the first surface comprises a first side, wherein the second surface comprises a second side, wherein the first terminal is positioned on the first side, wherein the second terminal is positioned on the first side, wherein the third terminal is positioned on the second side, and wherein the fourth terminal is positioned on the second side.

4. The display device according to claim 1 further comprising:

a substrate; and a liquid crystal, wherein the first IC is positioned over the substrate, wherein the second IC is positioned over the substrate, wherein the first wiring comprises a region overlapping with the substrate with the liquid crystal positioned therebetween, wherein the second wiring comprises a region overlapping with the substrate with the liquid crystal positioned therebetween, wherein the first IC comprises a first surface facing the substrate, wherein the second IC comprises a second surface facing the substrate, wherein the first surface comprises a first side and a second side opposite to the first side, wherein the second surface comprises a third side and a fourth side opposite to the third side, wherein the first terminal is positioned on the first side, wherein the second terminal is positioned on the second side, wherein the third terminal is positioned on the third side, and wherein the fourth terminal is positioned on the fourth side.

5. The display device according to claim 1 further comprising:

a substrate; and an EL layer, wherein the first IC is positioned over the substrate, wherein the second IC is positioned over the substrate, wherein the first wiring comprises a region overlapping with the substrate with the EL layer positioned therebetween, wherein the second wiring comprises a region overlapping with the substrate with the EL layer positioned therebetween, wherein the first IC comprises a first surface facing the substrate, wherein the second IC comprises a second surface facing the substrate, wherein the first surface comprises a first side and a second side opposite to the first side, wherein the second surface comprises a third side and a fourth side opposite to the third side, wherein the first terminal is positioned on the first side, wherein the second terminal is positioned on the second side, wherein the third terminal is positioned on the third side, and wherein the fourth terminal is positioned on the fourth side.

6. The display device according to claim 1 further comprising:

a substrate; and an EL layer, wherein the first IC is positioned over the substrate, wherein the second IC is positioned over the substrate, wherein the first wiring comprises a region overlapping with the EL layer with the substrate positioned therebetween, wherein the substrate comprises a region overlapping with the EL layer with the second wiring positioned therebetween, wherein the first IC comprises a first surface facing the substrate, wherein the second IC comprises a second surface facing the substrate, wherein the first surface comprises a first side and a second side opposite to the first side, wherein the second surface comprises a third side and a fourth side opposite to the third side, wherein the first terminal is positioned on the first side, wherein the second terminal is positioned on the first side, wherein the third terminal is positioned on the third side, and wherein the fourth terminal is positioned on the fourth side.

7. The display device according to claim 1 further comprising:

a substrate; and an EL layer, wherein the first IC is positioned over the substrate, wherein the second IC is positioned over the substrate, wherein the substrate comprises a region overlapping with the EL layer with the first wiring positioned therebetween, wherein the substrate comprises a region overlapping with the EL layer with the second wiring positioned therebetween, wherein the first IC comprises a first surface facing the substrate, wherein the second IC comprises a second surface facing the substrate, wherein the first surface comprises a first side, wherein the second surface comprises a second side, wherein the first terminal is positioned on the first side, wherein the second terminal is positioned on the first side, wherein the third terminal is positioned on the second side, and wherein the fourth terminal is positioned on the second side.

8. The display device according to claim 1 further comprising:

a substrate; and an EL layer, wherein the first IC is positioned over the substrate, wherein the second IC is positioned over the substrate, wherein the first wiring comprises a region overlapping with the EL layer with the substrate positioned therebetween, wherein the second wiring comprises a region overlapping with the EL layer with the substrate positioned therebetween, wherein the first IC comprises a first surface facing the substrate, wherein the second IC comprises a second surface facing the substrate, wherein the first surface comprises a first side and a second side opposite to the first side, wherein the second surface comprises a third side and a fourth side opposite to the third side, wherein the first terminal is positioned on the first side, wherein the second terminal is positioned on the second side, wherein the third terminal is positioned on the third side, and wherein the fourth terminal is positioned on the fourth side.

9. An electronic device comprising:

the display device according to claim 1, and at least one of a microphone, a speaker, and an operation key.

* * * * *